US009847795B2

(12) United States Patent
Ko et al.

(10) Patent No.: US 9,847,795 B2
(45) Date of Patent: *Dec. 19, 2017

(54) APPARATUS FOR TRANSMITTING AND RECEIVING A SIGNAL AND METHOD OF TRANSMITTING AND RECEIVING A SIGNAL

(71) Applicant: LG Electronics Inc., Seoul (KR)

(72) Inventors: Woo Suk Ko, Seoul (KR); Sang Chul Moon, Seoul (KR)

(73) Assignee: LG ELECTRONICS INC., Seoul (KR)

(*) Notice: Subject to any disclaimer, the term of this patent is extended or adjusted under 35 U.S.C. 154(b) by 65 days.

This patent is subject to a terminal disclaimer.

(21) Appl. No.: 15/046,111

(22) Filed: Feb. 17, 2016

(65) Prior Publication Data
US 2016/0164541 A1 Jun. 9, 2016

Related U.S. Application Data

(63) Continuation of application No. 14/695,743, filed on Apr. 24, 2015, now Pat. No. 9,300,327, which is a (Continued)

(30) Foreign Application Priority Data

Dec. 15, 2008 (KR) ........................ 10-2008-0127316

(51) Int. Cl.
H03M 13/27 (2006.01)
H04L 1/00 (2006.01)
(Continued)

(52) U.S. Cl.
CPC ... *H03M 13/2792* (2013.01); *H03M 13/1102* (2013.01); *H03M 13/13* (2013.01);
(Continued)

(58) Field of Classification Search
CPC ... H04L 1/0041; H04L 1/0057; H04L 1/0065; H04L 1/0071; H04L 1/0072;
(Continued)

(56) References Cited

U.S. PATENT DOCUMENTS 6,883,012 B1 4/2005 Ryan
7,120,427 B1 10/2006 Adams et al.
(Continued)

FOREIGN PATENT DOCUMENTS

CN 1619997 5/2005
EP 1513258 3/2005
(Continued)

OTHER PUBLICATIONS

Digital Video Broadcasting (DVB), "DVB-T2," DVB website, url:http://www.dvb.org/technology/dvbt2/2010, 3 pages.
(Continued)

*Primary Examiner* — Nadeem Iqbal
(74) *Attorney, Agent, or Firm* — Dentons US LLP

(57) ABSTRACT

A method is provided for receiving a signal. The method includes receiving a signal transmitted in a radio frequency (RF) band including at least one RF channel, demodulating the received signal, parsing a preamble of a signal frame including layer-1 information from the demodulated signal, deinterleaving bits of the layer-1 information, decoding the deinterleaved bits using an error correction decoding scheme including a shortening scheme and a puncturing scheme and obtaining physical layer pipes (PLPs) from the signal frame using the error-correction-decoded layer-1 information.

16 Claims, 61 Drawing Sheets

Related U.S. Application Data continuation of application No. 14/167,914, filed on Jan. 29, 2014, now Pat. No. 9,043,687, which is a continuation of application No. 13/733,085, filed on Jan. 2, 2013, now Pat. No. 8,694,875, which is a continuation of application No. 12/809,938, filed as application No. PCT/KR2008/007545 on Dec. 19, 2008, now Pat. No. 8,370,729.

(60) Provisional application No. 61/023,436, filed on Jan. 25, 2008.

(51) Int. Cl.
  *H04L 5/00* (2006.01)
  *H04L 27/26* (2006.01)
  *H03M 13/13* (2006.01)
  *H03M 13/11* (2006.01)
  *H04B 7/0413* (2017.01)

(52) U.S. Cl.
  CPC ......... *H04B 7/0413* (2013.01); *H04L 1/0041* (2013.01); *H04L 1/0057* (2013.01); *H04L 1/0065* (2013.01); *H04L 1/0071* (2013.01); *H04L 1/0072* (2013.01); *H04L 5/005* (2013.01); *H04L 5/0044* (2013.01); *H04L 5/0048* (2013.01); *H04L 5/0053* (2013.01); *H04L 27/2613* (2013.01)

(58) Field of Classification Search
  CPC . H04L 1/0068; H03M 13/2792; H03M 13/13; H03M 13/6362
  See application file for complete search history.

(56) References Cited

U.S. PATENT DOCUMENTS

| | | | |
|---|---|---|---|
| 7,426,249 B2 | 9/2008 | Keaney et al. | |
| 7,668,224 B2* | 2/2010 | Hocevar | H04L 1/0041 375/130 |
| 7,668,248 B2* | 2/2010 | Hocevar | H03M 13/1185 375/260 |
| 7,747,934 B2 | 6/2010 | Livshitz | |
| 8,370,729 B2* | 2/2013 | Ko | H04L 1/0041 714/790 |
| 8,503,551 B2 | 8/2013 | Ko et al. | |
| 8,505,551 B2* | 8/2013 | Moretti | A47K 7/026 132/200 |
| 9,043,687 B2 | 5/2015 | Ko | |
| 2002/0099994 A1 | 7/2002 | Nobelen | |
| 2005/0233716 A1 | 10/2005 | Laroia et al. | |
| 2006/0176968 A1 | 8/2006 | Keaney et al. | |
| 2007/0004372 A1 | 1/2007 | Adams et al. | |
| 2007/0041458 A1* | 2/2007 | Hocevar | H04L 1/0041 375/260 |
| 2007/0143655 A1 | 6/2007 | Niu et al. | |
| 2007/0248174 A1 | 10/2007 | Ghosh | |
| 2008/0204286 A1 | 8/2008 | Kose | |
| 2009/0102687 A1 | 4/2009 | Furman et al. | |
| 2009/0103649 A1 | 4/2009 | Vare et al. | |
| 2011/0131464 A1* | 6/2011 | Ko | H04L 1/0041 714/752 |
| 2013/0232394 A1 | 9/2013 | Ko et al. | |

FOREIGN PATENT DOCUMENTS

| | | |
|---|---|---|
| EP | 1037443 | 10/2005 |
| EP | 1783942 | 5/2007 |
| EP | 2071791 | 6/2009 |
| RU | 2006-110517 | 10/2007 |
| WO | 2006-131797 | 12/2006 |
| WO | 2007/083947 | 7/2007 |
| WO | 2008/002080 | 1/2008 |
| WO | 2009053816 A2 | 4/2009 |

OTHER PUBLICATIONS

M.K. Song et al., "Design of a Variable Shortened and Punctured RS Decoder," Journal of Korea Information and Communications Society, vol. 31, No. 8C, pp. 763-70, Aug. 2006.
European Telecommunication Standards Institute (ETSI), "Digital Video Broadcasting (DVB); Second Generation Framing Structure, Channel Coding and Modulation Systems for Broadcasting, Interactive Services, News Gathering and Other Broadband Satellite Applications," ETSI EN 302 307, v1.1.2, Jun. 2006, 74 pages.
Digital Video Broadcasting (DVB), "Frame Structure Channel Coding and Modulation for a Second Generation Digital Terrestrial Television Broadcasting System (DVB-T2)," DVB Document A122, Jun. 2010, 179 pages.
Nokia et al., "DVB-T2 concept," Jun. 2006, 74 pages.
Digital Video Broadcasting (DVB), "Framing structure, channel coding and modulation for digital terrestrial television," Final draft ETSI EN 300 744 V1.5.1, Jun. 2004, 64 pages.
Digital Video Broadcasting (DVB), "Frame structure channel coding and modulation for a second generation digital terrestrial television broadcasting system (DVB-T2)," DVB Document A122r1, Jan. 2008, 165 pages.
Nokia, et al., "L1 signaling parameter definition and signaling transmission in T2," Nov. 2007, 22 pages.
Russian Federation Federal Service for Intellectual Property, Patents and Trademarks Application No. 2010135527/07, Notice of Allowance dated Aug. 23, 2013, 10 pages.
The State Intellectual Property Office of the People's Republic of China Application No. 200880125541.X, Office Action dated Feb. 4, 2013, 6 pages.
Zhi-Xing Yang et al., "A coding and Modulation Scheme for HDTV Services in DMB-T", IEEE Transactions on Broadcasting, vol. 50, No. 1, Mar. 2004.

* cited by examiner

FIG. 1

|  | RF 1 | RF 2 | RF 3 | RF 4 |
|---|---|---|---|---|
|  | 17 | 12 | 7 | Service 2 |
|  | 16 | 11 | 6 | Service 2 |
|  | 15 | 10 | 5 | Service 1 |
|  | 14 | 9 | 4 | Service 1 |
|  | 13 | 8 | Service 3 | Service 1 |
|  | 12 | 7 | Service 2 | 17 |
|  | 11 | 6 | Service 2 | 16 |
|  | 10 | 5 | Service 1 | 15 |
|  | 9 | 4 | Service 1 | 14 |
|  | 8 | Service 3 | Service 1 | 13 |
|  | 7 | Service 2 | 17 | 12 |
|  | 6 | Service 2 | 16 | 11 |
|  | 5 | Service 1 | 15 | 10 |
|  | 4 | Service 1 | 14 | 9 |
| Time (not in scale) | Service 3 | Service 1 | 13 | 8 |
|  | Service 2 | 17 | 12 | 7 |
|  | Service 2 | 16 | 11 | 6 |
|  | Service 1 | 15 | 10 | 5 |
|  | Service 1 | 14 | 9 | 4 |
|  | Service 1 | 13 | 8 | Service 3 |
|  | P2 | P2 | P2 | P2 |
|  | P1 | P1 | P1 | P1 |

FIG. 8

| bit/cell (exp.) | HOQ ratio | HOQ bits | LOQ bits | HOQ symbols | LOQ symbols | Total symbols | bit/cell |
|---|---|---|---|---|---|---|---|
| 256-QAM | 1 | 64800 | 0 | 8100 | 0 | 8100 | 8 |
| Hyb 128-QAM | 3/5 | 38880 | 25920 | 4860 | 4320 | 9180 | 7.0588 |
| 64-QAM | 1 | 64800 | 0 | 10800 | 0 | 10800 | 6 |
| Hyb 32-QAM | 3/5 | 38880 | 25920 | 6480 | 6480 | 12960 | 5 |
| 16-QAM | 1 | 64800 | 0 | 16200 | 0 | 16200 | 4 |
| Hyb 8-QAM | 2/3 | 43200 | 21600 | 10800 | 10800 | 21600 | 3 |
| QPSK | 1 | 64800 | 0 | 32400 | 0 | 32400 | 2 |

FIG. 9

| bit/cell (exp.) | HOQ ratio | HOQ bits | LOQ bits | HOQ symbols | LOQ symbols | Total symbols | bit/cell |
|---|---|---|---|---|---|---|---|
| 256-QAM | 1 | 16200 | 0 | 2025 | 0 | 2025 | 8 |
| Hyb 128-QAM | 3/5 | 9720 | 6480 | 1215 | 1080 | 2295 | 7.0588 |
| 64-QAM | 1 | 16200 | 0 | 2700 | 0 | 2700 | 6 |
| Hyb 32-QAM | 3/5 | 9720 | 6480 | 1620 | 1620 | 3240 | 5 |
| 16-QAM | 1 | 16200 | 0 | 4050 | 0 | 4050 | 4 |
| Hyb 8-QAM | 2/3 | 10800 | 5400 | 2700 | 2700 | 5400 | 3 |
| QPSK | 1 | 16200 | 0 | 8100 | 0 | 8100 | 2 |

FIG. 10

| bit/cell (exp.) | HOQ ratio | HOQ bits | LOQ bits | HOQ symbols | LOQ symbols | Total symbols | bit/cell |
|---|---|---|---|---|---|---|---|
| 256-QAM | 8/9 | 57600 | 7200 | 7200 | 1200 | 8400 | 7.714285714 |
| Hyb 128-QAM | 4/9 | 28800 | 36000 | 3600 | 6000 | 9600 | 6.75 |
| 64-QAM | 1 | 64800 | 0 | 10800 | 0 | 10800 | 6 |
| Hyb 32-QAM | 5/9 | 36000 | 28800 | 6000 | 7200 | 13200 | 4.909090909 |
| 16-QAM | 1/9 | 7200 | 57600 | 1200 | 14400 | 15600 | 4.153846154 |
| Hyb 8-QAM | 2/3 | 43200 | 21600 | 10800 | 10800 | 21600 | 3 |
| QPSK | 1 | 64800 | 0 | 32400 | 0 | 32400 | 2 |
| | | | | | GCD | 1200 | |

FIG. 11

| bit/cell (exp.) | HOQ ratio | HOQ bits | LOQ bits | HOQ symbols | LOQ symbols | Total symbols | bit/cell |
|---|---|---|---|---|---|---|---|
| 256-QAM | 4/5 | 51840 | 12960 | 6480 | 2160 | 8640 | 7.5 |
| Hyb 128-QAM | 8/15 | 34560 | 30240 | 4320 | 5040 | 9360 | 6.923076923 |
| 64-QAM | 1 | 64800 | 0 | 10800 | 0 | 10800 | 6 |
| Hyb 32-QAM | 3/5 | 38880 | 25920 | 6480 | 6480 | 12960 | 5 |
| 16-QAM | 1/15 | 4320 | 60480 | 720 | 15120 | 15840 | 4.090909091 |
| Hyb 8-QAM | 2/3 | 43200 | 21600 | 10800 | 10800 | 21600 | 3 |
| QPSK | 1 | 64800 | 0 | 32400 | 0 | 32400 | 2 |
| | | | | | GCD | 720 | |

FIG. 12

| bit/cell (exp.) | HOQ ratio | HOQ bits | LOQ bits | HOQ symbols | LOQ symbols | Total symbols | bit/cell |
|---|---|---|---|---|---|---|---|
| 256-QAM | 44/45 | 63360 | 1440 | 7920 | 240 | 8160 | 7.941176471 |
| Hyb 128-QAM | 28/45 | 40320 | 24480 | 5040 | 4080 | 9120 | 7.105263158 |
| 64-QAM | 1 | 64800 | 0 | 10800 | 0 | 10800 | 6 |
| Hyb 32-QAM | 3/5 | 38880 | 25920 | 6480 | 6480 | 12960 | 5 |
| 16-QAM | 1/15 | 4320 | 60480 | 720 | 15120 | 15840 | 4.090909091 |
| Hyb 8-QAM | 2/3 | 43200 | 21600 | 10800 | 10800 | 21600 | 3 |
| QPSK | 1 | 64800 | 0 | 32400 | 0 | 32400 | 2 |
| | | | | | GCD | 240 | |

FIG. 13

| bit/cell (exp.) | HOQ ratio | HOQ bits | LOQ bits | HOQ symbols | LOQ symbols | Total symbols | bit/cell |
|---|---|---|---|---|---|---|---|
| 256-QAM | 8/9 | 14400 | 1800 | 1800 | 300 | 2100 | 7.714285714 |
| Hyb 128-QAM | 4/9 | 7200 | 9000 | 900 | 1500 | 2400 | 6.75 |
| 64-QAM | 1 | 16200 | 0 | 2700 | 0 | 2700 | 6 |
| Hyb 32-QAM | 5/9 | 9000 | 7200 | 1500 | 1800 | 3300 | 4.909090909 |
| 16-QAM | 1/9 | 1800 | 14400 | 300 | 3600 | 3900 | 4.153846154 |
| Hyb 8-QAM | 2/3 | 10800 | 5400 | 2700 | 2700 | 5400 | 3 |
| QPSK | 1 | 16200 | 0 | 8100 | 0 | 8100 | 2 |
| | | | | | GCD | 300 | |

FIG. 14

| bit/cell (exp.) | HOQ ratio | HOQ bits | LOQ bits | HOQ symbols | LOQ symbols | Total symbols | bit/cell |
|---|---|---|---|---|---|---|---|
| 256-QAM | 4/5 | 12960 | 3240 | 1620 | 540 | 2160 | 7.5 |
| Hyb 128-QAM | 8/15 | 8640 | 7560 | 1080 | 1260 | 2340 | 6.923076923 |
| 64-QAM | 1 | 16200 | 0 | 2700 | 0 | 2700 | 6 |
| Hyb 32-QAM | 3/5 | 9720 | 6480 | 1620 | 1620 | 3240 | 5 |
| 16-QAM | 1/15 | 1080 | 15120 | 180 | 3780 | 3960 | 4.090909091 |
| Hyb 8-QAM | 2/3 | 10800 | 5400 | 2700 | 2700 | 5400 | 3 |
| QPSK | 1 | 16200 | 0 | 8100 | 0 | 8100 | 2 |
| | | | | | GCD | 180 | |

FIG. 15

| bit/cell (exp.) | HOQ ratio | HOQ bits | LOQ bits | HOQ symbols | LOQ symbols | Total symbols | bit/cell |
|---|---|---|---|---|---|---|---|
| 256-QAM | 44/45 | 15840 | 360 | 1980 | 60 | 2040 | 7.941176471 |
| Hyb 128-QAM | 28/45 | 10080 | 6120 | 1260 | 1020 | 2280 | 7.105263158 |
| 64-QAM | 1 | 16200 | 0 | 2700 | 0 | 2700 | 6 |
| Hyb 32-QAM | 3/5 | 9720 | 6480 | 1620 | 1620 | 3240 | 5 |
| 16-QAM | 1/15 | 1080 | 15120 | 180 | 3780 | 3960 | 4.090909091 |
| Hyb 8-QAM | 2/3 | 10800 | 5400 | 2700 | 2700 | 5400 | 3 |
| QPSK | 1 | 16200 | 0 | 8100 | 0 | 8100 | 2 |
| | | | | | GCD | 60 | |

FIG. 20
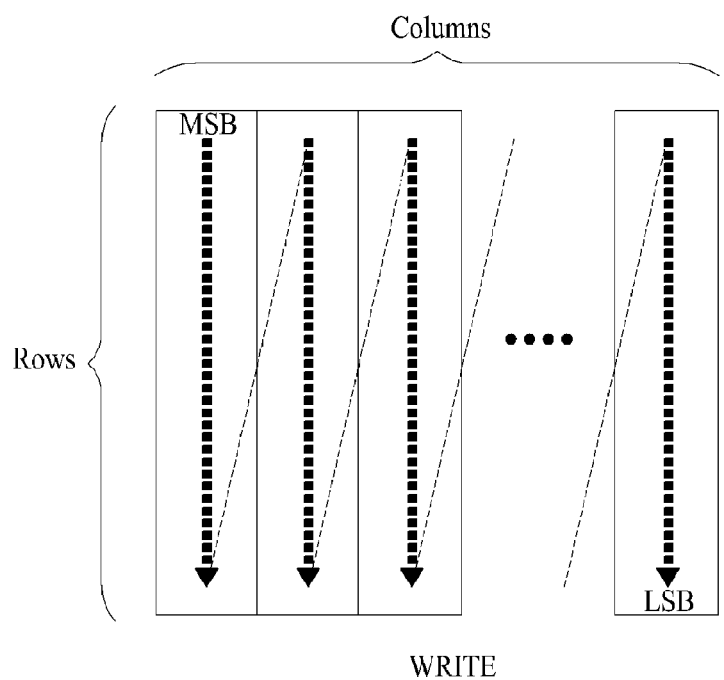
WRITE
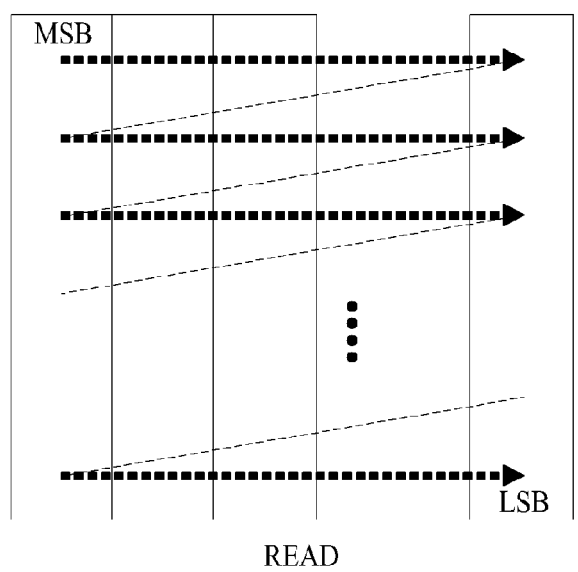
READ

FIG. 21
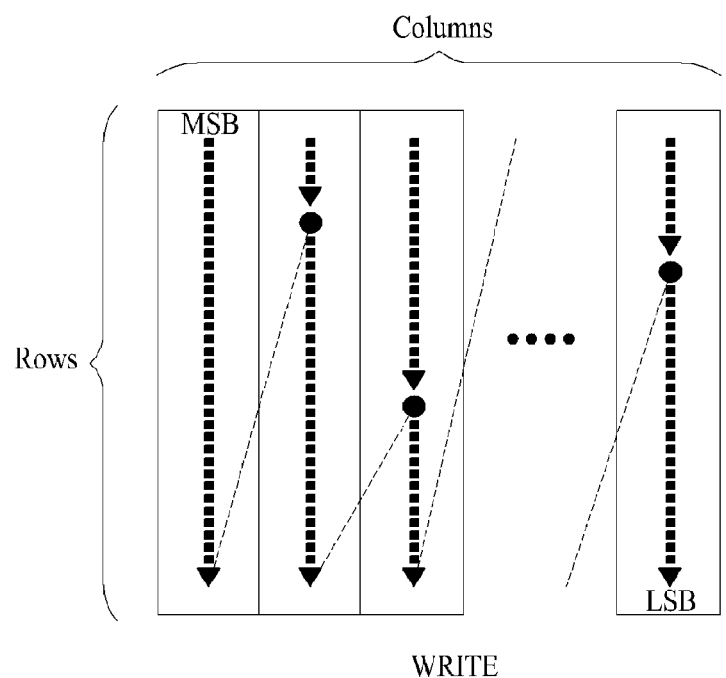
WRITE
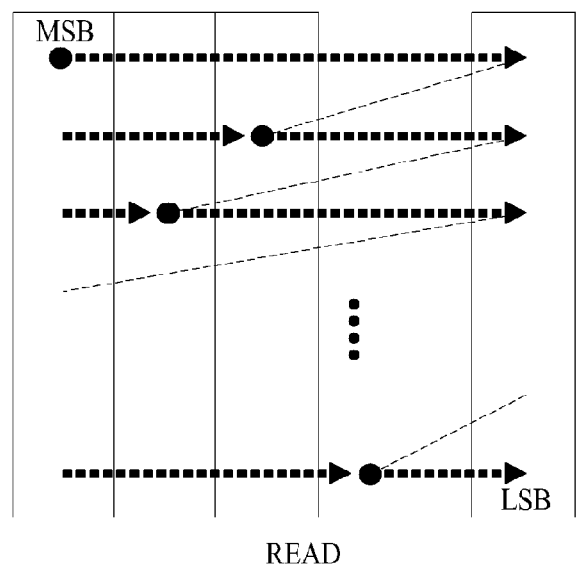
READ

FIG. 22

| QAM | nCol | Col 1 | Col 2 | Col 3 | Col 4 | Col 5 | Col 6 | Col 7 | Col 8 |
|---|---|---|---|---|---|---|---|---|---|
| QPSK | 2 | 0 | 2 | - | - | - | - | - | - |
| 16QAM | 4 | 0 | 2 | 4 | 7 | - | - | - | - |
| 64QAM | 6 | 0 | 2 | 5 | 9 | 10 | 13 | - | - |
| 256QAM | 8 | 0 | 0 | 2 | 4 | 4 | 5 | 7 | 7 |

FIG. 23

| QAM type | HOQ Rows | HOQ Columns | LOQ Rows | LOQ Columns |
|---|---|---|---|---|
| 256-QAM | 8100 | 8 | | |
| Hyb 128-QAM | 4860 | 8 | 4320 | 6 |
| 64-QAM | 10800 | 6 | | |
| Hyb 32-QAM | 6480 | 6 | 6480 | 4 |
| 16-QAM | 16200 | 4 | | |
| Hyb 8-QAM | 10800 | 4 | 10800 | 2 |
| 4-QAM | 32400 | 2 | | |

FIG. 24

| QAM type | HOQ Rows | HOQ Columns | LOQ Rows | LOQ Columns |
|---|---|---|---|---|
| 256-QAM | 2025 | 8 | | |
| Hyb 128-QAM | 1215 | 8 | 1080 | 6 |
| 64-QAM | 2700 | 6 | | |
| Hyb 32-QAM | 1620 | 6 | 1620 | 4 |
| 16-QAM | 4050 | 4 | | |
| Hyb 8-QAM | 2700 | 4 | 2700 | 2 |
| 4-QAM | 8100 | 2 | | |

FIG. 28

FIG. 29
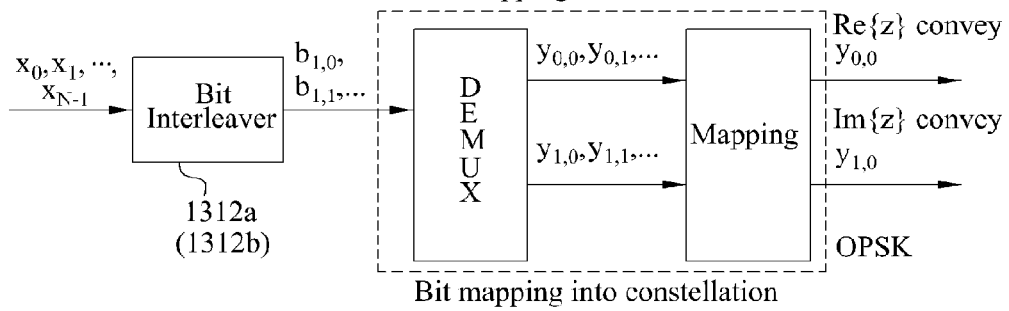
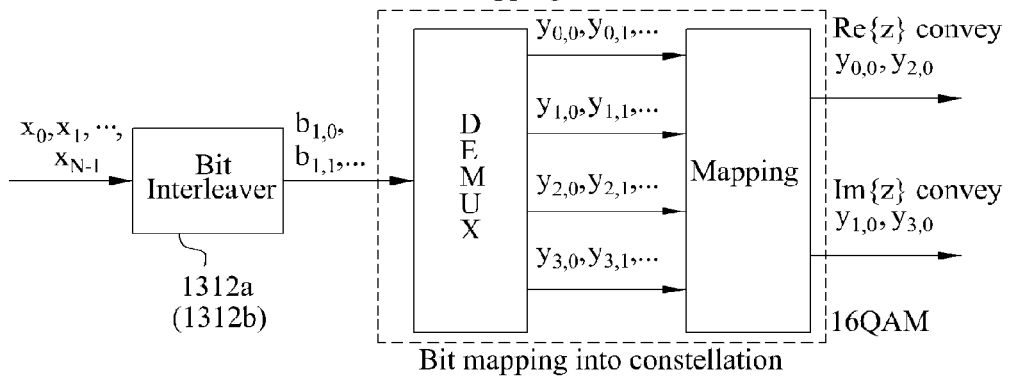
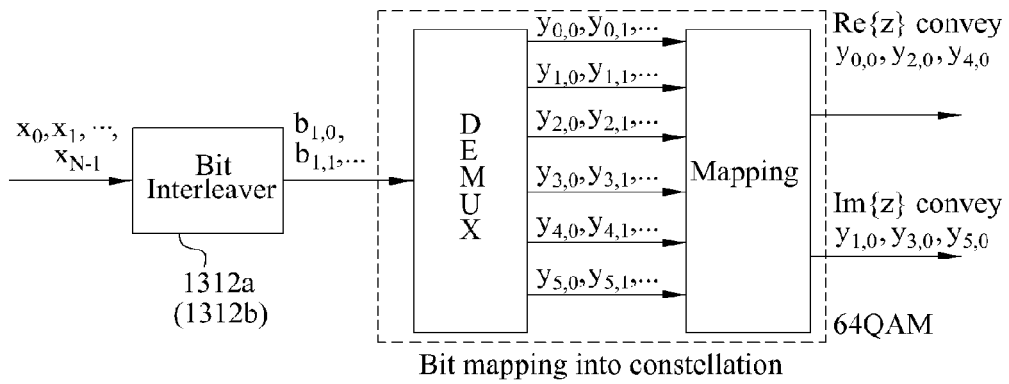
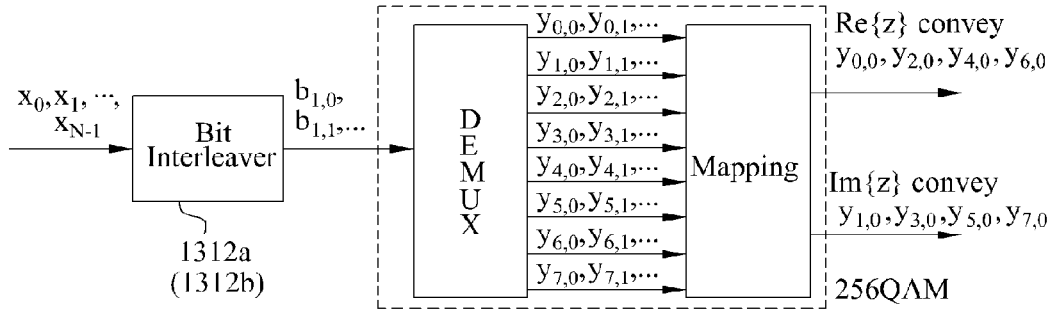

FIG. 30

| QPSK |
|---|
| b 0 maps to y0,0 |
| b 1 maps to y1,0 |

| 16-QAM |
|---|
| b 0 maps to y2,0 |
| b 1 maps to y3,0 |
| b 2 maps to y0,0 |
| b 3 maps to y1,0 |

| 64-QAM |
|---|
| b 0 maps to y4,0 |
| b 1 maps to y5,0 |
| b 2 maps to y2,0 |
| b 3 maps to y3,0 |
| b 4 maps to y0,0 |
| b 5 maps to y1,0 |

| 256-QAM |
|---|
| b 0 maps to y6,0 |
| b 1 maps to y7,0 |
| b 2 maps to y4,0 |
| b 3 maps to y5,0 |
| b 4 maps to y2,0 |
| b 5 maps to y3,0 |
| b 6 maps to y0,0 |
| b 7 maps to y1,0 |

FIG. 31

| Type | 1st type | 2nd type | 3rd type | 4th type | 5th type | 6th type |
|---|---|---|---|---|---|---|
| QPSK | $b_{1,0}$ maps to $y_{0,0}$<br>$b_{1,1}$ maps to $y_{1,0}$ | $b_{1,0}$ maps to $y_{0,0}$<br>$b_{1,1}$ maps to $y_{1,0}$ | $b_{1,0}$ maps to $y_{0,0}$<br>$b_{1,1}$ maps to $y_{1,0}$ | $b_{1,0}$ maps to $y_{0,0}$<br>$b_{1,1}$ maps to $y_{1,0}$ | $b_{1,0}$ maps to $y_{0,0}$<br>$b_{1,1}$ maps to $y_{1,0}$ | $b_{1,0}$ maps to $y_{0,0}$<br>$b_{1,1}$ maps to $y_{1,0}$ |
| 16-QAM | $b_{1,0}$ maps to $y_{0,0}$<br>$b_{1,1}$ maps to $y_{2,0}$<br>$b_{1,2}$ maps to $y_{1,0}$<br>$b_{1,3}$ maps to $y_{3,0}$ | $b_{1,0}$ maps to $y_{2,0}$<br>$b_{1,1}$ maps to $y_{0,0}$<br>$b_{1,2}$ maps to $y_{3,0}$<br>$b_{1,3}$ maps to $y_{1,0}$ | $b_{1,0}$ maps to $y_{0,0}$<br>$b_{1,1}$ maps to $y_{2,0}$<br>$b_{1,2}$ maps to $y_{3,0}$<br>$b_{1,3}$ maps to $y_{1,0}$ | $b_{1,0}$ maps to $y_{2,0}$<br>$b_{1,1}$ maps to $y_{0,0}$<br>$b_{1,2}$ maps to $y_{1,0}$<br>$b_{1,3}$ maps to $y_{3,0}$ | $b_{1,0}$ maps to $y_{2,0}$<br>$b_{1,1}$ maps to $y_{3,0}$<br>$b_{1,2}$ maps to $y_{0,0}$<br>$b_{1,3}$ maps to $y_{1,0}$ | $b_{1,0}$ maps to $y_{0,0}$<br>$b_{1,1}$ maps to $y_{1,0}$<br>$b_{1,2}$ maps to $y_{2,0}$<br>$b_{1,3}$ maps to $y_{3,0}$ |
| 64-QAM | $b_{1,0}$ maps to $y_{0,0}$<br>$b_{1,1}$ maps to $y_{2,0}$<br>$b_{1,2}$ maps to $y_{4,0}$<br>$b_{1,3}$ maps to $y_{1,0}$<br>$b_{1,4}$ maps to $y_{3,0}$<br>$b_{1,5}$ maps to $y_{5,0}$ | $b_{1,0}$ maps to $y_{4,0}$<br>$b_{1,1}$ maps to $y_{2,0}$<br>$b_{1,2}$ maps to $y_{0,0}$<br>$b_{1,3}$ maps to $y_{5,0}$<br>$b_{1,4}$ maps to $y_{3,0}$<br>$b_{1,5}$ maps to $y_{1,0}$ | $b_{1,0}$ maps to $y_{0,0}$<br>$b_{1,1}$ maps to $y_{2,0}$<br>$b_{1,2}$ maps to $y_{4,0}$<br>$b_{1,3}$ maps to $y_{5,0}$<br>$b_{1,4}$ maps to $y_{3,0}$<br>$b_{1,5}$ maps to $y_{1,0}$ | $b_{1,0}$ maps to $y_{4,0}$<br>$b_{1,1}$ maps to $y_{2,0}$<br>$b_{1,2}$ maps to $y_{0,0}$<br>$b_{1,3}$ maps to $y_{1,0}$<br>$b_{1,4}$ maps to $y_{3,0}$<br>$b_{1,5}$ maps to $y_{5,0}$ | $b_{1,0}$ maps to $y_{4,0}$<br>$b_{1,1}$ maps to $y_5$<br>$b_{1,2}$ maps to $y_2$<br>$b_{1,3}$ maps to $y_{3,0}$<br>$b_{1,4}$ maps to $y_{0,0}$<br>$b_{1,5}$ maps to $y_{1,0}$ | $b_{1,0}$ maps to $y_{0,0}$<br>$b_{1,1}$ maps to $y_{1,0}$<br>$b_{1,2}$ maps to $y_{2,0}$<br>$b_{1,3}$ maps to $y_{3,0}$<br>$b_{1,4}$ maps to $y_{4,0}$<br>$b_{1,5}$ maps to $y_{5,0}$ |
| 256-QAM | $b_{1,0}$ maps to $y_{0,0}$<br>$b_{1,1}$ maps to $y_{2,0}$<br>$b_{1,2}$ maps to $y_{4,0}$<br>$b_{1,3}$ maps to $y_{6,0}$<br>$b_{1,4}$ maps to $y_{1,0}$<br>$b_{1,5}$ maps to $y_{3,0}$<br>$b_{1,6}$ maps to $y_{5,0}$<br>$b_{1,7}$ maps to $y_{7,0}$ | $b_{1,0}$ maps to $y_{0,0}$<br>$b_{1,1}$ maps to $y_{4,0}$<br>$b_{1,2}$ maps to $y_{2,0}$<br>$b_{1,3}$ maps to $y_{0,0}$<br>$b_{1,4}$ maps to $y_{7,0}$<br>$b_{1,5}$ maps to $y_{5,0}$<br>$b_{1,6}$ maps to $y_{3,0}$<br>$b_{1,7}$ maps to $y_{1,0}$ | $b_{1,0}$ maps to $y_{0,0}$<br>$b_{1,1}$ maps to $y_{2,0}$<br>$b_{1,2}$ maps to $y_{4,0}$<br>$b_{1,3}$ maps to $y_{6,0}$<br>$b_{1,4}$ maps to $y_{7,0}$<br>$b_{1,5}$ maps to $y_{5,0}$<br>$b_{1,6}$ maps to $y_{3,0}$<br>$b_{1,7}$ maps to $y_{1,0}$ | $b_{1,0}$ maps to $y_{6,0}$<br>$b_{1,1}$ maps to $y_{4,0}$<br>$b_{1,2}$ maps to $y_{2,0}$<br>$b_{1,3}$ maps to $y_{0,0}$<br>$b_{1,4}$ maps to $y_{1,0}$<br>$b_{1,5}$ maps to $y_{3,0}$<br>$b_{1,6}$ maps to $y_{5,0}$<br>$b_{1,7}$ maps to $y_{7,0}$ | $b_{1,0}$ maps to $y_{6,0}$<br>$b_{1,1}$ maps to $y_{7,0}$<br>$b_{1,2}$ maps to $y_{4,0}$<br>$b_{1,3}$ maps to $y_{5,0}$<br>$b_{1,4}$ maps to $y_{2,0}$<br>$b_{1,5}$ maps to $y_{3,0}$<br>$b_{1,6}$ maps to $y_{0,0}$<br>$b_{1,7}$ maps to $y_{1,0}$ | $b_{1,0}$ maps to $y_{0,0}$<br>$b_{1,1}$ maps to $y_{1,0}$<br>$b_{1,2}$ maps to $y_{2,0}$<br>$b_{1,3}$ maps to $y_{3,0}$<br>$b_{1,4}$ maps to $y_{4,0}$<br>$b_{1,5}$ maps to $y_{5,0}$<br>$b_{1,6}$ maps to $y_{6,0}$<br>$b_{1,7}$ maps to $y_{7,0}$ |

FIG. 33

| qam | cr | DEMUX selection |
|---|---|---|
| 4-qam | 1/4 | all |
| | 1/3 | all |
| | 2/5 | all |
| | 1/2 | all |
| | 3/5 | all |
| | 2/3 | all |
| | 3/4 | all |
| | 4/5 | all |
| | 5/6 | all |
| | 8/9 | all |
| | 9/10 | all |
| 16-qam | 1/4 | No-Int, No-Demux |
| | 1/3 | No-Int, No-Demux |
| | 2/5 | No-Int, No-Demux |
| | 1/2 | No-Int, No-Demux |
| | 3/5 | 9, 10 or 12 |
| | 2/3 | 6 |
| | 3/4 | 6 |
| | 4/5 | 6 |
| | 5/6 | 6 |
| | 8/9 | 6 |
| | 9/10 | 6 |
| 64-qam | 1/4 | No-Int, No-Demux |
| | 1/3 | No-Int, No-Demux |
| | 2/5 | No-Int, No-Demux |
| | 1/2 | No-Int, No-Demux |
| | 3/5 | 9, or 10 |
| | 2/3 | 6 |
| | 3/4 | 6 |
| | 4/5 | 6 |
| | 5/6 | 6 |
| | 8/9 | 6 |
| | 9/10 | 6 |
| 256-qam | 1/4 | No-Int, No-Demux |
| | 1/3 | No-Int, No-Demux |
| | 2/5 | No-Int, No-Demux |
| | 1/2 | No-Int, No-Demux |
| | 3/5 | 9 |
| | 2/3 | 6 |
| | 3/4 | 6 |
| | 4/5 | 6 |
| | 5/6 | 6 |
| | 8/9 | 6 |
| | 9/10 | 6 |

FIG. 34

QPSK : $i = 0, 1, 2, \ldots, \dfrac{N}{2} - 1,$ $$(y_{0,i}, y_{0,i}) = (x_i, x_{N/2+i}),$$

16-QAM : $i = 0, 1, 2, \ldots, \dfrac{N}{4} - 1,$ $$(y_{0,i}, y_{0,i}, y_{2,i}, y_{3,i}) = \left\{ x_{\frac{2N}{4}+i}, x_{\frac{3N}{4}+i}, x_i, x_{\frac{N}{4}+i} \right\}$$

64-QAM : $i = 0, 1, 2, \ldots, \dfrac{N}{6} - 1,$ $$(y_{0,i}, y_{0,i}, y_{2,i}, y_{3,i}, y_{4,i}, y_{5,i}) = \left\{ x_{\frac{4N}{6}+i}, x_{\frac{5N}{6}+i}, x_{\frac{2N}{6}+i}, x_{\frac{3N}{6}+i}, x_i, x_{\frac{N}{6}+i} \right\}$$

256-QAM : $i = 0, 1, 2, \ldots, \dfrac{N}{8} - 1,$ $$(y_{0,i}, y_{0,i}, y_{2,i}, y_{3,i}, y_{4,i}, y_{5,i}, y_{6,i}, y_{7,i}) = \left\{ x_{\frac{6N}{8}+i}, x_{\frac{7N}{8}+i}, x_{\frac{4N}{8}+i}, x_{\frac{5N}{8}+i}, x_{\frac{2N}{8}+i}, x_{\frac{3N}{8}+i}, x_i, x_{\frac{N}{8}+i} \right\}$$

APPARATUS FOR TRANSMITTING AND RECEIVING A SIGNAL AND METHOD OF TRANSMITTING AND RECEIVING A SIGNAL

This application is a Continuation of U.S. application Ser. No. 14/695,743 filed Apr. 24, 2015, which is a Continuation of U.S. application Ser. No. 14/167,914 filed Jan. 29, 2014 (now issued as U.S. Pat. No. 9,043,687), which is a Continuation of U.S. application Ser. No. 13/733,085 filed Jan. 2, 2013 (now issued as U.S. Pat. No. 8,694,875), which is a Continuation of U.S. application Ser. No. 12/809,938 filed Aug. 20, 2010 (now issued as U.S. Pat. No. 8,370,729), which is a 35 U.S.C. §371 National Stage entry of International Application No. PCT/KR2008/007545 filed Dec. 19, 2008, and claims priority to U.S. Provisional Application No. 61/023,436 filed Jan. 25, 2008 and Korean Patent Application No. 10-2008-0127316 filed Dec. 15, 2008, all of which are hereby incorporated by reference in their entireties as if fully set forth herein.

TECHNICAL FIELD

The present invention relates to a method for transmitting and receiving a signal and an apparatus for transmitting and receiving a signal, and more particularly, to a method for transmitting and receiving a signal and an apparatus for transmitting and receiving a signal, which are capable of improving data transmission efficiency.

BACKGROUND ART

As a digital broadcasting technology has been developed, users have received a high definition (HD) moving image. With continuous development of a compression algorithm and high performance of hardware, a better environment will be provided to the users in the future. A digital television (DTV) system can receive a digital broadcasting signal and provide a variety of supplementary services to users as well as a video signal and an audio signal.

With the development of the digital broadcasting technology, a requirement for a service such as a video signal and an audio signal is increased and the size of data desired by a user or the number of broadcasting channels is gradually increased.

DISCLOSURE OF INVENTION

Technical Problem

Accordingly, the present invention is directed to a method for transmitting and receiving a signal and an apparatus for transmitting and receiving a signal that substantially obviate one or more problems due to limitations and disadvantages of the related art.

An object of the present invention is to provide a method for transmitting and receiving a signal and an apparatus for transmitting and receiving a signal, which are capable of improving data transmission efficiency.

Another object of the present invention is to provide a method for transmitting and receiving a signal and an apparatus for transmitting and receiving a signal, which are capable of improving error correction capability of bits configuring a service.

Technical Solution

To achieve the objects, the present invention provides methods of transmitting and receiving a signal and an apparatus for transmitting and receiving a signal.

In one aspect of the present invention, the method of transmitting a signal includes generating layer-1 information destined to be inserted into a signal frame, encoding the layer-1 information an error correction encoding scheme, said error correction encoding scheme including a shortening scheme and a puncturing scheme, interleaving bits of the error-correction-encoded layer-1 information, arranging the interleaved bits of the layer-1 information in a preamble of the signal frame, and arranging a physical layer pipe (PLP) in the signal frame, and modulating the signal frame and transmitting the modulated signal frame via at least one radio frequency (RF) channel.

In another aspect of the present invention, the method of receiving a signal, includes receiving a signal transmitted in a radio frequency (RF) band including at least one RF channel, demodulating the received signal, parsing a preamble of a signal frame including layer-1 information, from the demodulated signal, deinterleaving bits of the layer-1 information, decoding the deinterleaved bits using an error correction decoding scheme including a shortening scheme and a puncturing scheme and obtaining physical layer pipes (PLPs) from the signal frame using the error-correction-decoded layer-1 information.

In another aspect of the present invention, the apparatus for transmitting a signal, includes an information generator configured to generate layer-1 information destined to be inserted into a signal frame, an information coder configured to perform error correction encoding of the layer-1 information using an error correction encoding including a shortening scheme and a puncturing scheme and interleave bits of the error-correction-encoded layer-1 information, a frame builder configured to arrange the interleaved bits of the layer-1 information in a preamble of the signal frame, and allocate physical layer pipe (PLP) in the signal frame and a modulator configured to modulate the signal frame, and a transmit unit configured to transmit the modulated signal frame via at least one radio frequency (RF) channel.

In another aspect of the present invention, the apparatus for receiving a signal, includes a receiver configured to receive a signal transmitted in a radio frequency (RF) band including at least one RF channel, a demodulator configured to demodulate the received signal, an information decoder configured to deinterleave bits of layer-1 information parsed from a signal frame of the received signal and perform an error correction decoding of the deinterleaved bits according to error correction decoding scheme including a shortening scheme and a puncturing scheme, an information extractor configured to extract the error-correction-encoded layer-1 information, and a frame parser configured to parse the signal frame using the extracted layer-1 information and obtain physical layer pipes (PLPs), from the signal frame.

The error correction encoding scheme and the error correction decoding scheme include low density parity check (LDPC) error correction scheme.

The layer-1 information may be encoded and decoded using error-correction-encoding and decoding schemes including a short mode of the LDPC.

The layer-1 information may be at least one of a guard-interval length, a number of error-correction-encoding blocks in each signal frame, service modulation information and a cell identifier.

The information coder may includes a first coder configured to perform first error correction encoding with respect to the bits of the layer-1 information, a first interleaver configured to interleave the first error-correction-encoded bits, a second coder configured to perform second error correction encoding of the interleaved bits according to said shortening scheme and said puncturing scheme and a second interleaver configured to interleave the second error-correction-encoded bits.

The information decoder may includes a first deinterleaver configured to deinterleave the bits of the layer-1 information, a first decoder configured to perform error correction decoding with respect to the deinterleaved bits according to schemes inverse to the shortening scheme and the puncturing scheme, a second deinterleaver configured to deinterleave the error-correction-decoded bits and a second decoder configured to perform error correction decoding with respect to the deinterleaved bits.

Advantageous Effects

According to the apparatus for transmitting and receiving the signal and the method for transmitting and receiving the signal of the invention, if the data symbol configuring the PLP and the symbols configuring the preamble are modulated in the same FFT mode, the probability that the data symbol is detected by the preamble is low and the probability that the preamble is erroneously detected is reduced. If continuous wave (CW) interference is included like the analog TV signal, the probability that the preamble is erroneously detected by a noise DC component generated at the time of correlation is reduced.

According to the apparatus for transmitting and receiving the signal and the method for transmitting and receiving the signal of the invention, if the size of the FFT applied to the data symbol configuring the PLP is larger than that of the FFT applied to the preamble, the preamble detecting performance may be improved even in a delay spread channel having a length equal to or greater than that of the useful symbol portion A of the preamble. Since both the cyclic prefix (B) and the cyclic suffix (C) are used in the preamble, the fractional carrier frequency offset can be estimated.

Since the error correction encoding is performed with respect to the preamble of the signal frame by which a diversity gain cannot be obtained, it is possible to correct an error of the information included in the preamble. Accordingly, it is possible to improve reception performance of the information included in the accurate preamble

BRIEF DESCRIPTION OF THE DRAWINGS

FIG. 1 is a view showing a signal frame for transmitting a service;

FIG. 8 is a view showing a first example of a ratio of symbols when mappers 131a and 131b perform hybrid symbol mapping;

FIG. 9 is a view showing a second example of a ratio of symbols when the mappers 131a and 131b perform hybrid symbol mapping;

FIG. 10 is a view showing the number of symbols and bit number per cell word according to a symbol mapping scheme in an LDPC normal mode;

FIG. 11 is a view showing another example of the number of symbols according to a symbol mapping scheme in an LDPC normal mode;

FIG. 12 is a view showing another example of the number of symbols according to a symbol mapping scheme in an LDPC normal mode;

FIG. 13 is a view showing the number of symbols according to a symbol mapping scheme in an LDPC short mode;

FIG. 14 is a view showing an example of the number of symbols according to a symbol mapping scheme in an LDPC short mode;

FIG. 15 is a view showing another example of the number of symbols according to a symbol mapping scheme in an LDPC short mode;

FIG. 20 is a view showing the concept of interleaving of bits by bit interleavers 1312a and 1312b;

FIG. 21 illustrates another example of the bit interleavers which perform interleaving;

FIG. 22 illustrates offset used in bit interleaving in accordance with a symbol mapping method;

FIG. 23 is a view showing a first example of the number of rows and columns of memories of the bit interleavers 1312a and 1312b according to the types of symbol mappers 1315a and 1315b;

FIG. 24 is a view showing a second example of the number of rows and columns of the memories of the bit interleavers 1312a and 1312b according to the types of the symbol mappers 1315a and 1315b;

FIG. 28 is a view showing another embodiment of bit interleaving;

FIG. 29 is a view showing the concept of demultiplexing of input bits of demuxs 1313a and 1313b;

FIG. 30 is a view showing an embodiment of demultiplexing an input stream by the demux;

FIG. 31 is a view showing an example of a demultiplexing type according to a symbol mapping method;

FIG. 33 is a view showing a demultiplexing type which is determined according to a code rate of an error correction coding and a symbol mapping method;

FIG. 34 is a view showing an example of expressing the demultiplexing method by an equation;

BEST MODE FOR CARRYING OUT THE INVENTION

Figure 2:
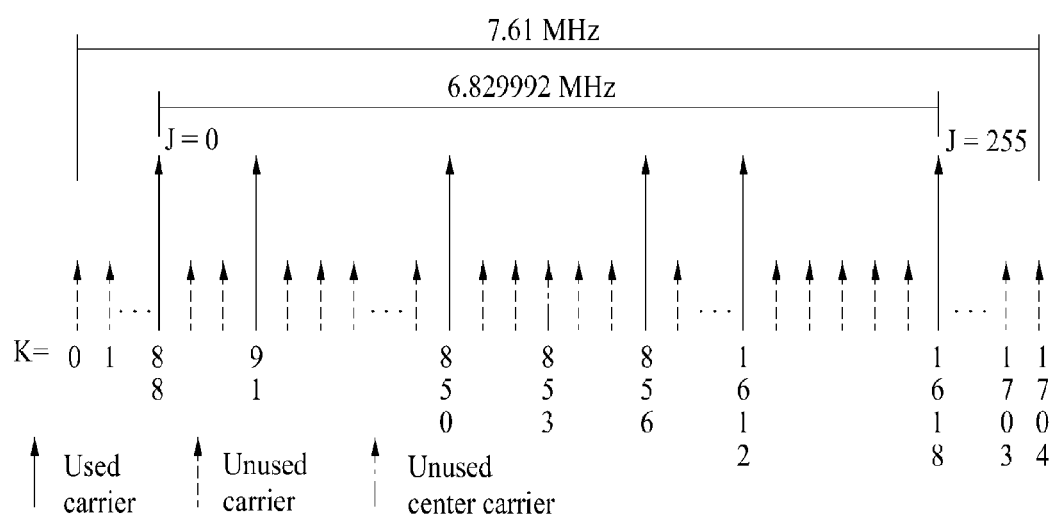
FIG. 2 is a view showing the structure of a first pilot signal P1 of the signal frame.

Reference will now be made in detail to the preferred embodiments of the present invention, examples of which are illustrated in the accompanying drawings. Wherever possible, the same reference numbers will be used throughout the drawings to refer to the same or like parts.

In the following description, the term "service" is indicative of either broadcast contents which can be transmitted/received by the signal transmission/reception apparatus, or content provision.

Prior to the description of an apparatus for transmitting and receiving a signal according to an embodiment of the present invention, a signal frame which is transmitted and received by the apparatus for transmitting and receiving the signal according to an embodiment of the present invention will be described.

FIG. 1 shows a signal frame for transmitting a service according to an embodiment of the present invention.

The signal frame shown in FIG. 1 shows an exemplary signal frame for transmitting a broadcast service including audio/video (A/V) streams. In this case, a single service is multiplexed in time- and frequency-channels, and the multiplexed service is transmitted. The above-mentioned signal transmission scheme is called a time-frequency slicing (TFS) scheme. Compared with the case in which a single service is transmitted to only one radio frequency (RF) band, the signal transmission apparatus according to an embodiment of the present invention transmits the signal service via at least one RF band (possibly several RF bands), such that it can acquire a statistical multiplexing gain capable of transmitting many more services. The signal transmission/reception apparatus transmits/receives a single service over several RF channels, such that it can acquire a frequency diversity gain.

First to third services (Services 1~3) are transmitted to four RF bands (RF1~RF4). However, this number of RF bands and this number of services have been disclosed for only illustrative purposes, such that other numbers may also be used as necessary. Two reference signals (i.e., a first pilot signal (P1) and a second pilot signal (P2)) are located at the beginning part of the signal frame. For example, in the case of the RF1 band, the first pilot signal (P1) and the second pilot signal (P2) are located at the beginning part of the signal frame. The RF1 band includes three slots associated with the Service 1, two slots associated with the Service 2, and a single slot associated with the Service 3. Slots associated with other services may also be located in other slots (Slots 4~17) located after the single slot associated with the Service 3.

The RF2 band includes a first pilot signal (P1), a second pilot signal (P2), and other slots 13~17. In addition, the RF2 band includes three slots associated with the Service 1, two slots associated with the Service 2, and a single slot associated with the Service 3.

The Services 1~3 are multiplexed, and are then transmitted to the RF3 and RF4 bands according to the time-frequency slicing (TFS) scheme. The modulation scheme for signal transmission may be based on an orthogonal frequency division multiplexing (OFDM) scheme.

In the signal frame, individual services are shifted to the RF bands (in the case that there are a plurality of the RF bands in the signal frame) and a time axis.

If signal frames equal to the above signal frame are successively arranged in time, a super-frame can be composed of several signal frames. A future extension frame may also be located among the several signal frames. If the future extension frame is located among the several signal frames, the super-frame may be terminated at the future extension frame.

FIG. 2 shows a first pilot signal (P1) contained in the signal frame of FIG. 1 according to an embodiment of the present invention.

The first pilot signal P1 and the second pilot signal P2 are located at the beginning part of the signal frame. The first pilot signal P1 is modulated by a 2K FFT mode, and may be transmitted simultaneously while including a ¼ guard interval. In FIG. 2, a band of 7.61 Mhz of the first pilot signal P1 includes a band of 6.82992 Mhz. The first pilot signal uses 256 carriers from among 1705 active carriers. A single active carrier is used for every 6 carriers on average. Data-carrier intervals may be irregularly arranged in the order of 3, 6, and 9. In FIG. 2, a solid line indicates the location of a used carrier, a thin dotted line indicates the location of an unused carrier, and a chain line indicates a center location of the unused carrier. In the first pilot signal, the used carrier can be symbol-mapped by a binary phase shift keying (BPSK), and a pseudo-random bit sequence (PRBS) can be modulated. The size of a FFT used for the second pilot signal can be indicated by several PRBSs.

The signal reception apparatus detects a structure of a pilot signal, and recognizes a time-frequency slicing (TFS) using the detected structure. The signal reception apparatus acquires the FFT size of the second pilot signal, compensates for a coarse frequency offset of a reception signal, and acquires time synchronization.

In the first pilot signal, a signal transmission type and a transmission parameter may be set.

The second pilot signal P2 may be transmitted with a FFT size and a guard interval equal to those of the data symbol. In the second pilot signal, a single carrier is used as a pilot carrier at intervals of three carriers. The signal reception apparatus compensates for a fine frequency synchronization offset using the second pilot signal, and performs fine time synchronization. The second pilot signal transmits information of a first layer (L1) from among Open Systems Interconnection (OSI) layers. For example, the second pilot signal may include a physical parameter and frame construction information. The second pilot signal transmits a parameter value by which a receiver can access a Physical Layer Pipe (PLP) service stream.

L1 (Layer 1) information contained in the second pilot signal P2 is as follows.

The Layer-1 (L1) information includes a length indicator indicating the length of data including the L1 information, such that it can easily use the signaling channels of Layers 1 and 2 (L1 and L2). The Layer-1 (L1) information includes a frequency indicator, a guard-interval length, a maximum number of FEC (Forward Error Correction) blocks for each frame in association with individual physical channels, and the number of actual FEC blocks to be contained in the FEC block buffer associated with a current/previous frame in each physical channel. In this case, the frequency indicator indicates frequency information corresponding to the RF channel.

The Layer-1 (L1) information may include a variety of information in association with individual slots. For example, the Layer-1 (L1) information includes the number of frames associated with a service, a start address of a slot having the accuracy of an OFDM carrier contained in an OFDM symbol, a length of the slot, slots corresponding to the OFDM carrier, the number of bits padded in the last OFDM carrier, service modulation information, service mode rate information, and Multi-Input-Multi-Output (MIMO) scheme information.

The Layer-1 (L1) information may include a cell ID, a flag for service like notification message service (e.g., an emergency message), the number of current frames, and the number of additional bits for future use. In this case, the cell ID indicates a broadcast area transmitted by a broadcast transmitter The second pilot signal P2 is adapted to perform channel estimation for decoding a symbol contained in the P2 signal. The second pilot signal P2 can be used as an initial value for channel estimation for the next data symbol. The second pilot signal P2 may also transmit Layer-2 (L2) information. For example, the second pilot signal is able to describe information associated with the transmission service in Layer-2 (L2) information. The signal transmission apparatus decodes the second pilot signal, such that it can acquire service information contained in the time-frequency slicing (TFS) frame and can effectively perform the channel scanning. Meanwhile, this Layer-2 (L2) information may be included in a specific PLP of the TFS frame. According to another instance, L2 information can be included in a specific PLP, and the service description information also can be transmitted in the specific PLP.

For example, the second pilot signal may include two OFDM symbols of the 8 k FFT mode. Generally, the second pilot signal may be any one of a single OFDM symbol of the 32K FFT mode, a single OFDM symbol of the 16 k FFT mode, two OFDM symbols of the 8 k FFT mode, four OFDM symbols of the 4 k FFT mode, and eight OFDM symbols of the 2 k FFT mode.

In other words, a single OFDM symbol having the size of a large FFT or several OFDM symbols, each of which has the size of a small FFT, may be contained in the second pilot signal P2, such that capacity capable of being transmitted to the pilot can be maintained.

If information to be transmitted to the second pilot signal exceeds capacity of the OFDM symbol of the second pilot signal, OFDM symbols after the second pilot signal can be further used. L1 (Layer1) and L2 (Layer2) information contained in the second pilot signal is error-correction-coded and is then interleaved, such that data recovery is carried out although an impulse noise occurs.

As described the above, L2 information can also be included in a specific PLP conveying the service description information.

Figure 3:
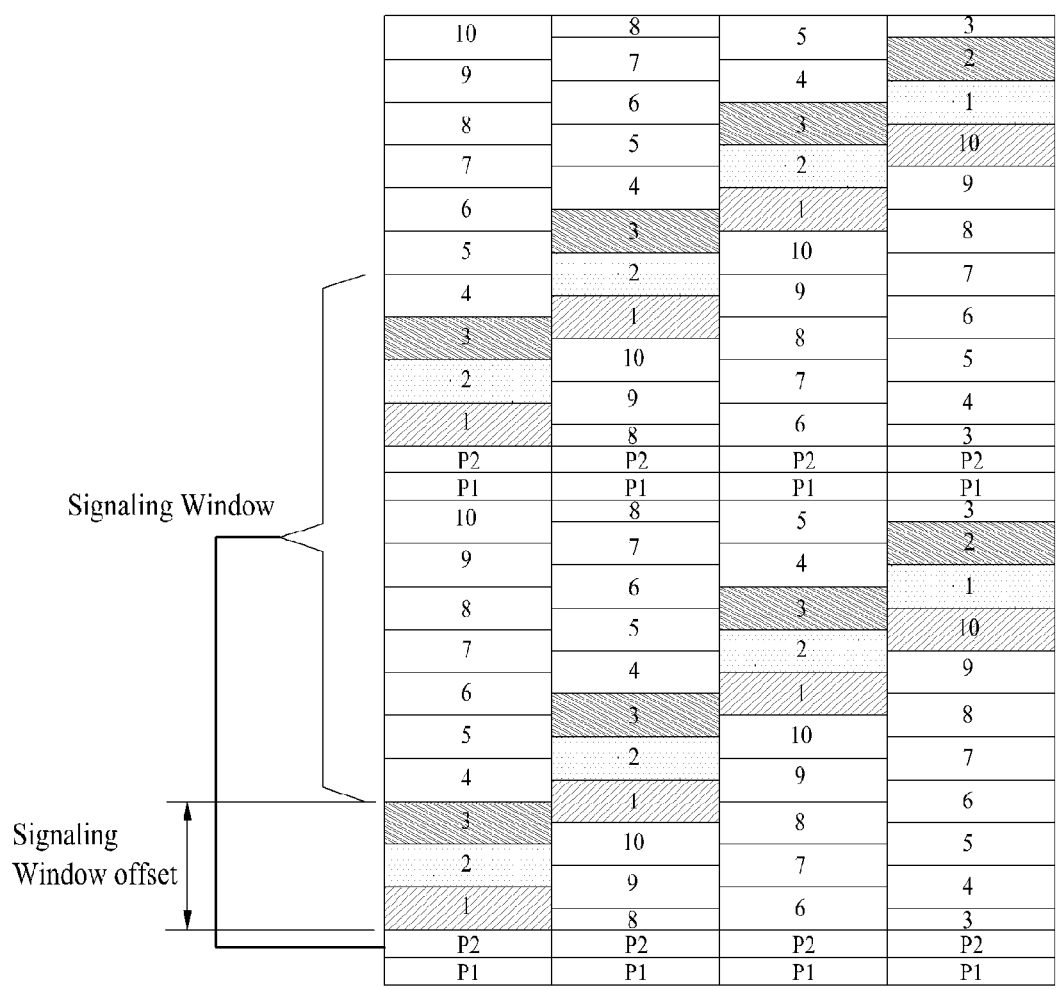
FIG. 3 is a view showing a signaling window.

FIG. 3 shows a signaling window according to the present invention. The time-frequency slicing (TFS) frame shows an offset concept of the signaling information. Layer-1 (L1) information contained in the second pilot signal includes frame construction information and physical layer information required by the signal reception apparatus decoding the data symbol. Therefore, if information of the following data symbols located after the second pilot signal, is contained in the second pilot signal, and the resultant second pilot signal is transmitted, the signal reception apparatus may be unable to immediately decode the above following data symbols due to a decoding time of the second pilot signal.

Therefore, as shown in FIG. 3, the L1 information contained in the second pilot signal (P2) includes information of a single time-frequency slicing (TFS) frame size, and includes information contained in the signaling window at a location spaced apart from the second pilot signal by the signaling window offset.

In the meantime, in order to perform channel estimation of a data symbol constructing the service, the data symbol may include a scatter pilot and a continual pilot.

The signal transmission/reception system capable of transmitting/receiving signal frames shown in FIGS. 1~3 will hereinafter be described. Individual services can be transmitted and received over several RF channels. A path for transmitting each of the services or a stream transmitted via this path is called a PLP. The PLP may be distributed among the timely-divided slots in several RF channels or a single RF band. This signal frame can convey the timely-divided PLP in at least one RF channel. In other word, a single PLP can be transferred through at least one RF channel with timely-divided regions. Hereinafter the signal transmission/reception systems transmitting/receiving a signal frame via at least one RF band will be disclosed.

Figure 4:
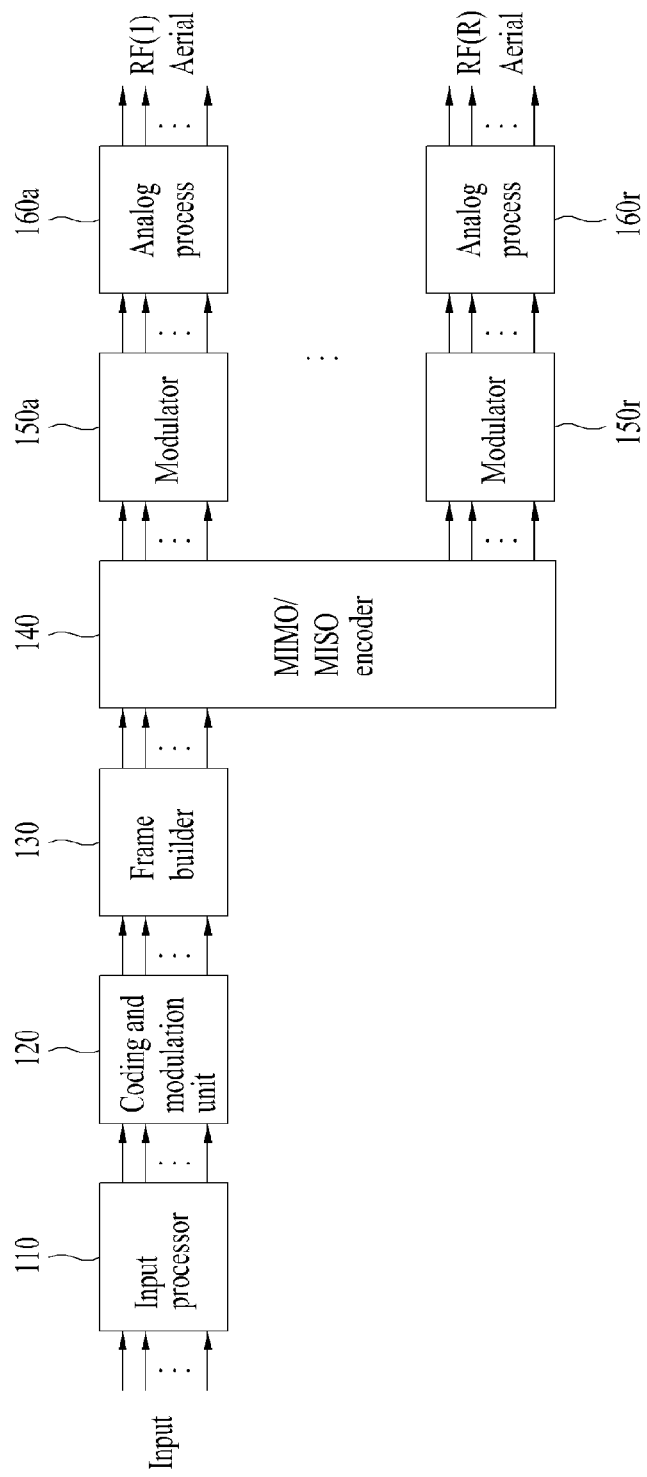
FIG. 4 is a schematic view showing an embodiment of an apparatus for transmitting a signal.

FIG. 4 is a block diagram illustrating an apparatus for transmitting a signal according to one embodiment of the present invention. Referring to FIG. 4, the signal transmission apparatus includes an input processor 110, a coding and modulation unit 120, a frame builder 130, a MIMO/MISO encoder 140, a plurality of modulators (150a, . . . , 150r) of the MIMO/MISO encoder 140, and a plurality of analog processors (160a, . . . , 160r).

The input processor 110 receives streams equipped with several services, generates P number of baseband frames (P is a natural number) which includes modulation- and coding-information corresponding to transmission paths of the individual services, and outputs the P number of baseband frames.

The coding and modulation unit 120 receives baseband frames from the input processor 110, performs the channel coding and interleaving on each of the baseband frames, and outputs the channel coding and interleaving result.

The frame builder 130 forms frames which transmit baseband frames contained in P number of PLPs to R number of RF channels (where R is a natural number), splits the formed frames, and outputs the split frames to paths corresponding to the R number of RF channels. Several services may be multiplexed in a single RF channel in time. The signal frames generated from the frame builder 140 may include a time-frequency slicing (TFS) structure in which the service is multiplexed in time- and frequency-domains.

The MIMO/MISO encoder 140 encodes signals to be transmitted to the R number of RF channels, and outputs the coded signals to paths corresponding to A number of antennas (where A is a natural number). The MIMO/MISO encoder 140 outputs the coded signal in which a single to be transmitted to a single RF channel is encoded to the A number of antennas, such that a signal is transmitted/received to/from a MIMO (Multi-Input-Multi-Output) or MISO (Multi-Input-Single-Output) structure.

The modulators (150a, . . . , 150r) modulate frequency-domain signals entered via the path corresponding to each RF channel into time-domain signals. The modulators (150a, . . . , 150r) modulate the input signals according to an orthogonal frequency division multiplexing (OFDM) scheme, and outputs the modulated signals.

The analog processors (160a, . . . , 160r) converts the input signals into RF signals, such that the RF signals can be outputted to the RF channels.

The signal transmission apparatus according to this embodiment may include a predetermined number of modulators (150a, . . . 150r) corresponding to the number of RF channels and a predetermined number of analog processors (160a, . . . , 160r) corresponding to the number of RF channels. However, in the case of using the MIMO scheme, the number of analog processors must be equal to the product of R (i.e., the number of RF channels) and A (i.e., the number of antennas).

Figure 5:
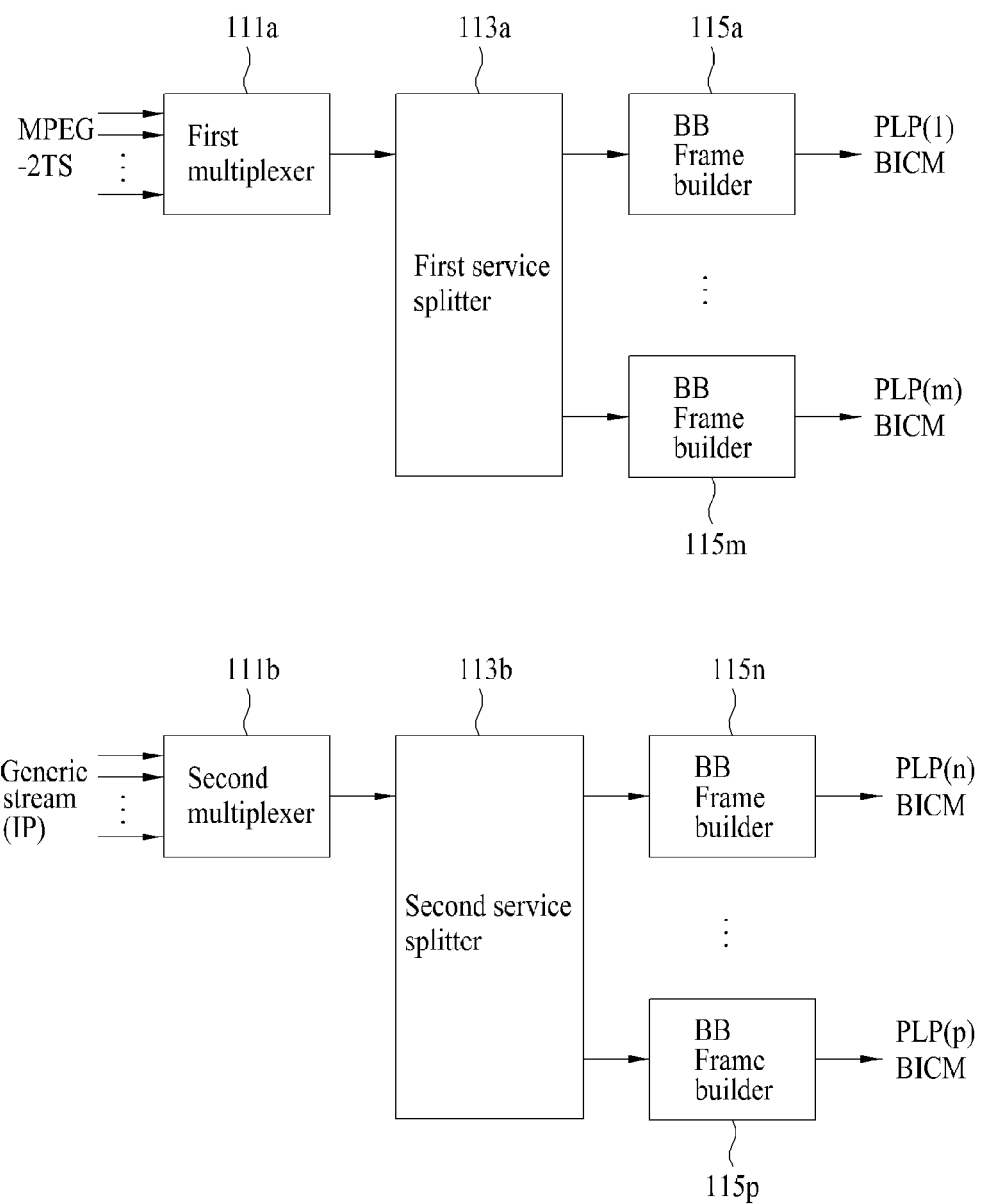
FIG. 5 is a view showing an example of an input processor 110.

FIG. 5 is a block diagram illustrating an input processor 110 according to an embodiment of the present invention. Referring to FIG. 5, the input processor 110 includes the first stream multiplexer 111a, the first service splitter 113a, and a plurality of first baseband (BB) frame builders (115a, . . . , 115m). The input processor 110 includes a second stream multiplexer 111b, a second service splitter 113b, and a plurality of second baseband (BB) frame builders (115n, . . . , 115p).

For example, the first stream multiplexer 111a receives several MPEG-2 transportstreams (TSs), multiplexes the received MPEG-2 TS streams, and outputs the multiplexed MPEG-2 TS streams. The first service splitter 113a receives the multiplexed streams, splits the input streams of individual services, and outputs the split streams. As described above, provided that the service transmitted via a physical-channel path is called a PLP, the first service splitter 113a splits the service to be transmitted to each PLP, and outputs the split service.

The first BB frame builders (115a, . . . 115m) build data contained in a service to be transmitted to each PLP in the form of a specific frame, and output the specific-frame-formatted data. The first BB frame builders (115a, . . . , 115m) build a frame including a header and payload equipped with service data. The header of each frame may include mode information based on the modulation and encoding of the service data, and a counter value based on a clock rate of the modulator to synchronize input streams.

The second stream multiplexer 111b receives several streams, multiplexes input streams, and outputs the multiplexed streams. For example, the second stream multiplexer 111b may multiplex Internet Protocol (IP) streams instead of the MPEG-2 TS streams. These streams may be encapsulated by a generic stream encapsulation (GSE) scheme. The streams multiplexed by the second stream multiplexer 111b may be any one of streams. Therefore, the above-mentioned streams different from the MPEG-2 TS streams are called generic streams (GS streams).

The second service splitter 113b receives the multiplexed generic streams, splits the received generic streams according to individual services (i.e., PLP types), and outputs the split GS streams.

The second BB frame builders (115n, . . . , 115p) build service data to be transmitted to individual PLPs in the form of a specific frame used as a signal processing unit, and output the resultant service data. The frame format built by the second BB frame builders (115n, . . . , 115p) may be equal to that of the first BB frame builders (115a, . . . , 115m) as necessary. If required, another embodiment may also be proposed. In another embodiment, the frame format built by the second BB frame builders (115n, . . . , 115p) may be different from that of the first BB frame builders (115a, . . . , 115m). The MPEG-2 TS header further includes a Packet Syncword which is not contained in the GS stream, resulting in the occurrence of different headers.

Figure 6:
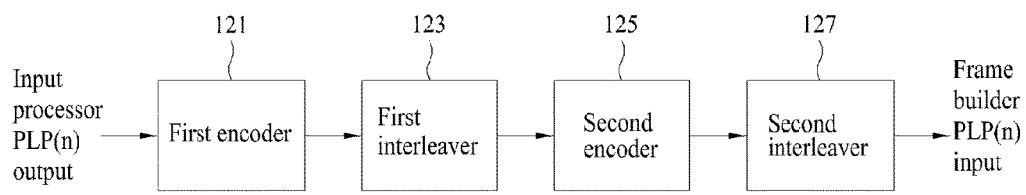
FIG. 6 is a view showing an embodiment of a coding and modulation unit.

FIG. 6 is a block diagram illustrating a coding and modulation unit according to an embodiment of the present invention. The coding and modulation unit includes a first interleaver 123, a second encoder 125, and a second interleaver 127.

The first encoder 121 acts as an outer coder of the input baseband frame, and is able to perform the error correction encoding. The first encoder 121 performs the error correction encoding of the input baseband frame using a Bose-Chaudhuri-Hoc-quenghem (BCH) scheme. The first interleaver 123 performs interleaving of the encoded data, such that it prevents a burst error from being generated in a transmission signal. The first interleaver 123 may not be contained in the above-mentioned embodiment.

The second encoder 125 acts as an inner coder of either the output data of the first encoder 121 or the output data of the first interleaver 123, and is able to perform the error correction encoding. A low density parity bit (LDPC) scheme may be used as an error correction encoding scheme. The second interleaver 127 mixes the error-correction-encoded data generated from the second encoder 125, and outputs the mixed data. The first interleaver 123 and the second interleaver 127 are able to perform interleaving of data in units of a bit.

The coding and modulation unit 120 relates to a single PLP stream. The PLP stream is error-correction-encoded and modulated by the coding and modulation unit 120, and is then transmitted to the frame builder 130.

Figure 7:
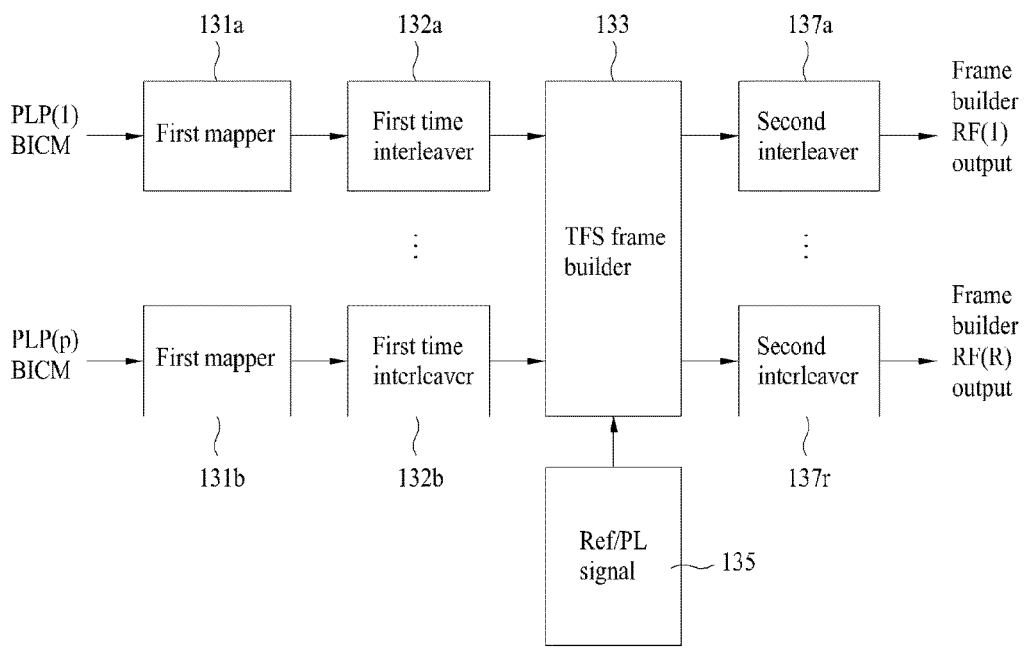
FIG. 7 is a view showing an embodiment of a frame builder.

FIG. 7 is a block diagram illustrating a frame builder according to an embodiment of the present invention. Referring to FIG. 7, the frame builder 130 receives streams of several paths from the coding and modulation unit 120, and arranges the received streams in a single signal frame. For example, the frame builder may include a first mapper 131a and a first time interleaver 132a in a first path, and may include a second mapper 131b and a second time interleaver 132b in a second path. The number of input paths is equal to the number of PLPs for service transmission or the number of streams transmitted via each PLP.

The first mapper 131a performs mapping of data contained in the input stream according to the first symbol mapping scheme. For example, the first mapper 131a may perform mapping of the input data using a QAM scheme (e.g., 16 QAM, 64 QAM, and 256 QAM).

If the first mapper 131a performs mapping of the symbol, the input data may be mapped to several kinds of symbols according to several symbol mapping schemes. For example, the first mapper 131a classifies the input data into a baseband-frame unit and a baseband-frame sub-unit. Individual classified data may be hybrid-symbol-mapped by at least two QAM schemes (e.g., 16 QAM and 64 QAM). Therefore, data contained in a single service may be mapped to symbols based on different symbol mapping schemes in individual intervals.

The first time interleaver 132a receives a symbol sequence mapped by the first mapper 131a, and is able to perform the interleaving in a time domain. The first mapper 131a maps data, which is contained in the error-corrected frame unit received from the coding and modulation unit 120, into symbols. The first time interleaver 132a receives the symbol sequence mapped by the first mapper 131a, and interleaves the received symbol sequence in units of the error-corrected frame.

In this way, the p-th mapper 131p or the p-th time interleaver 132p receives service data to be transmitted to the p-th PLP, maps the service data into symbols according to the p-th symbol mapping scheme. The mapped symbols can be interleaved in a time domain. It should be noted that this symbol mapping scheme and this interleaving scheme are equal to those of the first time interleaver 132a and the first mapper 131a.

The symbol mapping scheme of the first mapper 131a may be equal to or different from that of the p-th mapper 131p. The first mapper 131a and the p-th mapper 131p are able to map input data to individual symbols using the same or different hybrid symbol mapping schemes.

Data of the time interleavers located at individual paths (i.e., service data interleaved by the first time interleaver 132a and service data to be transmitted to R number of RF channels by the p-th time interleaver 132p) is interleaved, such that the physical channel allows the above data to be interleaved over several RF channels.

In association with streams received in as many paths as the number of PLPs, the TFS frame builder 133 builds the TFS signal frame such as the above-mentioned signal frame, such that the service is time-shifted according to RF channels. The TFS frame builder 133 splits service data received in any one of paths, and outputs the service data split into data of the R number of RF bands according to a signal scheduling scheme.

The TFS frame builder 133 receives the first pilot signal and the second pilot signal from the signaling information unit (denoted by Ref/PL signal) 135, arranges the first and second pilot signals in the signal frame, and inserts the signaling signal (L1 and L2) of the above-mentioned physical layer in the second pilot signal. In this case, the first and second pilot signals are used as the beginning signals of the signal frame contained in each RF channel from among the TFS signal frame received from the signaling information unit (Ref/PL signal) 135. As shown in FIG. 2, the first pilot signal may include a transmission type and basic transmission parameters, and the second pilot signal may include a physical parameter and frame construction information. Also, the second pilot signal includes a L1 (Layer 1) signaling signal and a L2 (Layer 2) signaling signal.

The R number of frequency interleavers (137a, . . . , 137r) interleave service data, to be transmitted to corresponding RF channels of the TFS signal frame, in a frequency domain. The frequency interleavers (137a, . . . , 137r) can interleave the service data at a level of data cells contained in an OFDM symbol.

Therefore, service data to be transmitted to each RF channel in the TFS signal frame is frequency-selective-fading-processed, such that it may not be lost in a specific frequency domain.

FIG. 8 is a view showing a first example of a ratio of symbols when the mappers 131a and 131b perform hybrid symbol mapping. This Figure shows the number of bits transmitted by one sub carrier (cell) if error correction coding is performed by the coding and modulation unit in a normal mode (the length of the error-correction-coded code is 64800 bits) of LDPC error correction coding mode.

For example, if the mappers 131a and 131b perform symbol mapping using 256QAM, 64800 bits are mapped to 8100 symbols. If the mappers 131a and 131b perform hybrid symbol mapping (Hyb 128-QAM) using 256QAM and 64QAM with a ratio of 3:2, the number of symbols mapped by 256QAM is 4860 and the number of symbols mapped by 64QAM is 4320. The number of transmitted bits per sub carrier (cell) is 7.0588.

If a symbol mapping method of 64QAM is used, input data may be mapped to 10800 symbols and six bits per cell may be transmitted. If data is mapped to the symbols by a hybrid symbol mapping method of 64QAM and 16QAM (64QAM:16QAM=3:2, Hyb32-QAM), five bits may be transmitted by one sub carrier (cell).

If data is mapped to symbols by the 16QAM method, the data is mapped to 16200 symbols, each of which is used to transmit four bits.

Similarly, if data is mapped to symbols by a hybrid symbol mapping method of 16QAM and QPSK (16QAM: QPSK=2:3, Hyb8-QAM), three bits may be transmitted by one sub carrier (cell).

If data is mapped to symbols by a QPSK method, the data may be mapped to 32400 symbols, each of which is used to transmit two bits.

FIG. 9 shows symbol mapping methods of error-corrected data by LDPC error correction coding method of a short mode (the length of the error-correction-coded code is 16200 bits), which are equal to the symbol mapping methods of FIG. 8, and the numbers of bits per sub carrier according to the symbol mapping methods.

The numbers of bits transmitted by the sub carrier is equal to those of the normal mode (64800 bits) according to the symbol mapping methods such as 256QAM, Hyb 128-QAM, 64-QAM, Hyb 32-QAM, 16QAM, Hyb8-QAM and QPSK, but the total numbers of symbols transmitted are different from those of the normal mode. For example, 16200 bits are transmitted by 2025 symbols in 256QAM, 16200 bits are transmitted by 1215 symbols according to 256QAM and 1080 symbols according to 64QAM (total 2295 symbols) in Hyb 128-QAM.

Accordingly, a data transmission rate per sub carrier (cell) for each PLP may be adjusted according to a hybrid symbol mapping method or a single symbol mapping method.

FIG. 10 is a view showing the number of symbols and bit number per cell word according to a symbol mapping method in an LDPC normal mode. If a TFS signal frame includes at least one RF channel, symbols configuring a specific PLP can be uniformly allocated to RF channels. The locations of the PLP symbols allocated to the RF channels can be more efficiently addressed. Accordingly, when the signal receiving apparatus selects the RF channels, the bits used for addressing the specific PLP can be reduced.

In this drawing, a symbol mapping method represented by 256-QAM indicates a method of mapping bits configuring a single error-correction-coded block to symbols with a ratio of 256QAM:64QAM=8:1. According to this symbol mapping method, the number of the bits in a single error-correction-coded block by the 256-QAM method is 57600, the number of the bits in a single error-correction-coded block by the 256-QAM method is 1200, the number of total symbols in the block is 8400, and the bit number per cell word is 7.714285714.

A symbol mapping method represented by Hyb 128-QAM indicates a method of mapping bits configuring a single error-correction-coded block to symbols with a ratio of 256QAM:64QAM=8:7. According to the Hyb 128-QAM symbol mapping method, the number of total symbols in a single error-correction-encoding block is 9600, and the bit number per cell word is 6.75.

According to a symbol mapping method represented by 64 QAM, the number of total symbols in a single error-correction-encoding block is 10800 and the bit number per cell word is 6.

A symbol mapping method represented by Hyb 32-QAM indicates a method of mapping bits configuring a single error-correction-coded block to symbols with a ratio of 64QAM:32QAM=5:4. According to the Hyb 3-QAM symbol mapping method, the number of total symbols in the error-correction-coded block is 13200, and the bit number per cell word is 4.9090909.

A symbol mapping method represented by 16 QAM indicates a method of mapping bits configuring a single error-correction-coded block to symbols with a ratio of 16QAM:QPSK=1:8. According to the 16 QAM symbol mapping method, the number of total symbols in one error-correction-coded block is 15600, and the bit number per cell word is 4.153846154.

A symbol mapping method represented by Hyb 8-QAM indicates a method of mapping bits configuring a single error-correction-coded block to symbols with a ratio of 16QAM:QPSK=2:1. According to the Hyb 8-QAM symbol mapping method, the number of total symbols in one error-correction-coded block is 21600, and the bit number per cell word is 3.

According to a symbol mapping method represented by QPSK, the number of total symbols in one error-correction-coded block is 32400 and the bit number per cell word is 2.

When the symbols configuring the PLP are allocated to the RF channels, the diversity gain of the frequency domain can be maximized when the numbers of the symbols allocated to the respective RF channels are equal. If a maximum of six RF channels is considered, the lowest common multiple of 1 to 6 is 60 and the greatest common divisor of the numbers of symbols mapped to one error correction coded block is 1200. Accordingly, if the integral multiple of 1200/60=20 symbols is allocated to each of the RF channels, the symbols can be uniformly allocated to all the RF channels. At this time, if 20 symbols are considered as one group and the group is addressed, the addressing overhead of log 2(20)4.32 bits can be reduced compared with the case the symbols are addressed one by one.

FIG. 11 is a view showing another example of the number of symbols according to a symbol mapping method in an LDPC normal mode. In the example of this drawing, a 256-QAM method using 256QAM and 64QAM symbols (256QAM:64QAM=4:1), a Hyb 128-QAM method using 256QAM and 64QAM symbol (256QAM:64QAM=8:7), a 64QAM method, a Hyb 32-QAM method using 64QAM and 8QAM symbols (64QAM:8QAM=3:2), a 16 QAM method using 16QAM and QPSK symbols (16QAM:QPSK=1:14), a Hyb 8-QAM method using 16QAM:QPSK=2:1 and a QPSK method were used as the symbol mapping method. The greatest common divisor (GCD) of the numbers of total symbols of an error correction coded block (normal mode) according to the symbol mapping methods is 720. Accordingly, if the integral multiple of 12(=720/60) symbols is allocated to each of the RF channels, the symbols can be uniformly allocated to all the RF channels. At this time, if 12 symbols are considered as one group and the group is addressed, the addressing overhead of log 2(12)3.58 bits can be reduced compared with the case the symbols are addressed one by one. The signal receiving apparatus can collect the allocated PLP symbols by the addressing scheme and obtain a PLP service stream.

FIG. 12 is a view showing another example of the number of symbols according to a symbol mapping method in an LDPC normal mode. In the example of this drawing, a 256-QAM scheme, a Hyb 128-QAM scheme, a 64QAM scheme, a Hyb 32-QAM scheme, a 16 QAM scheme, a Hyb 8-QAM scheme and a QPSK scheme were used as the symbol mapping method. The 256QAM symbol mapping method uses 256QAM and 64QAM symbols (256QAM:64QAM=44:1) and the Hyb 128-QAM symbol mapping method uses 256QAM and 64QAM symbols (256QAM:64QAM=28:17). The Hyb 32-QAM method uses 64QAM and 8QAM symbols (64QAM:8QAM=3:2), the 16QAM symbol mapping method uses 16QAM and QPSK symbols (16QAM:QPSK=1:14), and the Hyb 8-QAM symbol mapping method uses 16QAM and QPSK symbols (16QAM:QPSK=2:1). The GCD of the numbers of total symbols of an error correction coded block (normal mode) according to the symbol mapping methods is 240. Accordingly, if the integral multiple of 240/60=4 symbols is allocated to each of the RF channels, the symbols can be uniformly allocated to all the RF channels. At this time, if four symbols are considered as one group and the group is addressed, the addressing overhead of log 2(4)2 bits can be reduced compared with the case where the symbols are addressed one by one. Accordingly, even when the number of RF channels is any one of 1 to 6 in the signal frame, the PLP symbols can be uniformly allocated to the RF channels.

FIG. 13 is a view showing the number of symbols according to a symbol mapping method in an LDPC short mode. As described above, if symbol mapping is performed according to this example, the PLP symbols can be uniformly allocated to the RF channels and the overhead of the PLP symbol addressing can be reduced. The symbol mapping methods shown in this drawing are equal to those shown in FIG. 10. However, since the bit number of the LDPC short mode is different from that of the normal mode, the CCD of the numbers of total symbols of an error correction coded block (short mode) according to the symbol mapping methods is 300, unlike to FIG. 10. Accordingly, if the integral multiple of 300/60=5 symbols is allocated to each of the RF channels, the symbols can be uniformly allocated to all the RF channels. At this time, if five symbols are considered as one group and the group is addressed, the addressing overhead of log 2(5) bits can be reduced compared with the case where the symbols are addressed one by one. Accordingly, in this embodiment, the addressing bits are saved by log 2(5) bits when the divided PLP symbols are addressed.

FIG. 14 is a view showing an example of the number of symbols according to a symbol mapping method in an LDPC short mode. The symbol mapping methods of this drawing are equal to those shown in FIG. 11. In this example, the GCD of the numbers of total symbols of an error correction coded block (short mode) according to the symbol mapping methods is 180, which may be used for PLP symbol allocation of one RF channel and the addressing of the allocated symbols. In this embodiment, the addressing bits are saved by log 2(3) bits.

FIG. 15 is a view showing another example of the number of symbols according to a symbol mapping method in an LDPC short mode. The symbol mapping methods of this drawing are equal to those shown in FIG. 12. In this example, the GCD of the numbers of total symbols of an error correction coded block (short mode) according to the symbol mapping methods is 60. In this embodiment, the addressing bits are saved by log 2(1) bits (that is, the addressing bit is not saved).

Figure 16:
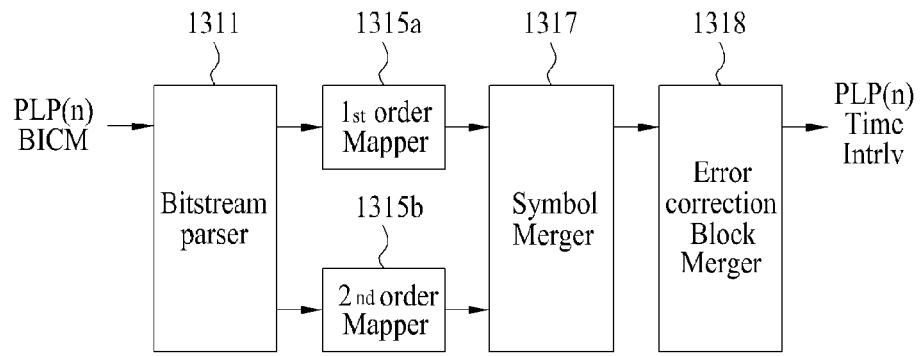
FIG. 16 is a view showing an embodiment of each of the symbol mappers 131a and 131b shown in FIG. 7.

FIG. 16 is a view showing an example of each of the symbol mappers 131a and 131b shown in FIG. 7. Each of the symbol mappers 131a and 131b includes a first order mapper 1315a, a second order mapper 131b, a symbol merger 1317 and an error correction block merger 1318.

The bit stream parser 1311 receives the PLP service stream from the coding and modulation unit and splits the received service stream.

The first order symbol mapper 1315a maps the bits of the service stream split by a higher order symbol mapping method to symbols. The second order symbol mapper 1315b maps the bits of the service stream split by a lower order symbol mapping method to symbols. For example, in the above example, the first order symbol mapper 1315a may map the bit stream to symbols according to 256QAM and the second order symbol mapper 1315b may map the bit stream to symbols according to 64QAM.

The symbol merger 1317 merges the symbols output from the symbol mappers 1315a and 1315b to one symbol stream and outputs the symbol stream. The symbol merger 1317 may output the symbol stream included in one PLP.

The error correction block merger 1318 may output one symbol stream merged by the symbol merger 1317 in the error-correction-coded code block unit. The error correction block merger 1318 may output a symbol block such that the error-correction-coded code blocks are uniformly allocated to at least one RF band of the TFS signal frame. The error correction block merger 1318 may output the symbol block such that the length of the symbol block of the error-correction-coded block of a normal mode is equal to that of the symbol block of the error-correction-coded block of a short mode. For example, four symbol blocks of the error-correction-coded block of the short mode may be merged to one symbol block.

The error correction block merger 1318 may split the symbol stream according to a common multiple of the number of RF bands such that signal frame builder uniformly arranges the symbols to the RF bands. If the maximum number of RF bands in the signal frame is 6, the error correction block merger 1318 outputs the symbol block such that the total number of symbols can be divided by 60 which is a common multiple of 1, 2, 3, 4, 5 and 6.

The symbols included in the output symbol block may be arranged to be uniformly allocated to the six RF bands. Accordingly, although an error correction mode according to a code rate and a symbol mapping method are combined, the symbols configuring the PLP are uniformly allocated to the RF bands.

Figure 17:
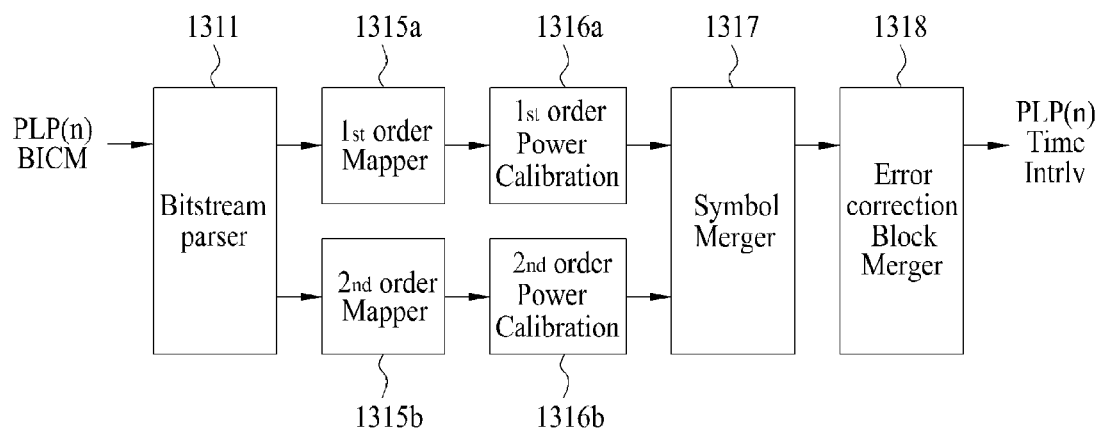
FIG. 17 is a view showing another embodiment of each of the symbol mappers 131a and 131b.

FIG. 17 is a view showing another embodiment of each of the symbol mappers 131a and 131b. The embodiment of this drawing is similar to the embodiment of FIG. 16 except that a first order power calibration unit 1316a and a second order power calibration unit 1316b are further included.

The first order power calibration unit 1316a calibrates the power of the symbols mapped by the first order symbol mapper 1315a according to the size of the constellation and outputs the calibrated symbols. The second order power calibration unit 1316b calibrates the power of the symbols mapped by the second order symbol mapper 1315b according to the size of the constellation and outputs the calibrated symbols. Accordingly, although the symbol mapping method is changed in one PLP or is changed among a plurality of PLPs, if the power of the symbol by the symbol mapping method is adjusted according to the size of the constellation, signal reception performance of a receiver can be improved.

The symbol merger 1317 merges the symbols calibrated by the power calibration units 1316a and 1316b and outputs one symbol stream.

Figure 18:
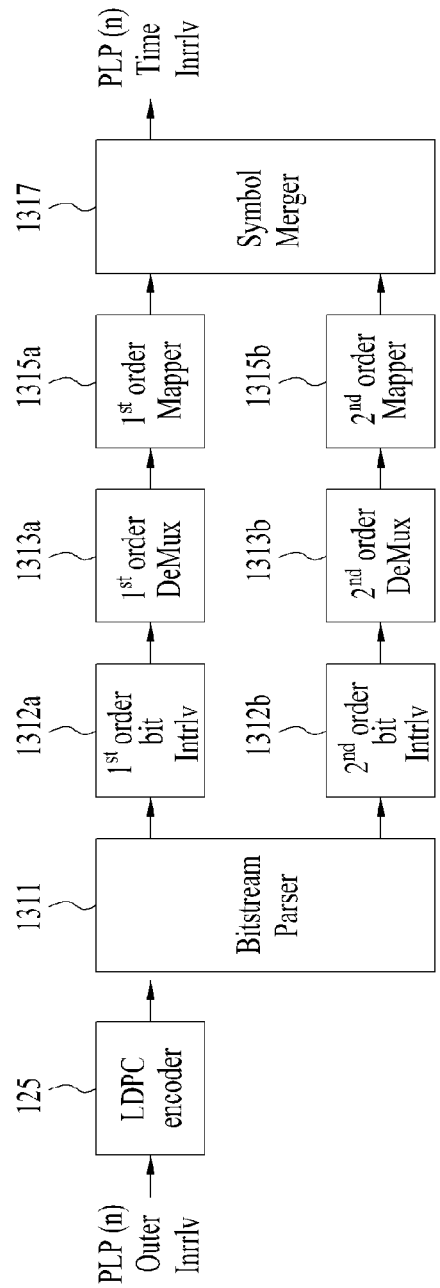
FIG. 18 is a view showing another embodiment of the symbol mapper.

FIG. 18 is a view showing another embodiment of the symbol mapper. In the embodiment of this Figure, the symbol mapper includes the second encoder 125 and the second interleaver 127 included in the coding and modulation unit. That is, if this embodiment is used, the coding and modulation unit may include only the first encoder 121, the first interleaver 123 and the second encoder 125.

The embodiment of the symbol mapper includes a bit stream parser 1311, a first order bit interleaver 1312a, a second order bit interleaver 1312b, a first order demux 1313a, a second order demux 1313b, a first order symbol mapper 1315a, a second order symbol mapper 1315b and a symbol merger 1317.

When the second encoder 125 performs LDPC error correction coding, the length of the error-correction-coded block (e.g., the length of 64800 bits and the length of 16200 bits) may vary according to an LDPC mode. If the bits included in the error-correction-coded block are mapped to the symbols, the error correction capabilities of the bits included in a cell word configuring the symbol may vary according to the locations of the bits. For example, the cell word which is the symbol may be determined according to the code rate of the error correction coding and the symbol mapping method (whether the symbol mapping method is the higher order symbol mapping method or the lower order symbol mapping method). If the error-correction-code is the LDPC, the error correction capabilities of the bits vary according to the locations of the bits in the error-correction-coded block. For example, the reliabilities of the bits coded according to the characteristics of the H-matrix used in the irregular LDPC error correction coding method may vary according to the locations of the bits. Accordingly, the order of the bits configuring the cell word mapped to the symbol is changed such that the error correction capabilities of the bits which are weak against the error correction in the error-correction-coded block are adjusted and the robustness against the error in the bit level can be adjusted.

First, the second encoder 125, for example, performs the error correction coding with respect to the stream included in one PLP by the LDPC error correction coding method.

The bit stream parser 1311 receives the service stream according to the PLP and splits the received service stream.

The first order bit interleaver 1312a interleaves the bits included in a first bit stream of the split service streams. Similarly, the second order bit interleaver 1312b interleaves the bits included in a second bit stream of the split service streams.

The first order bit interleaver 1312a and the second order bit interleaver 1312b may correspond to the second interleaver 127 used as an inner interleaver. The interleaving method of the first order bit interleaver 1312a and the second order bit interleaver 1312b will be described later.

The first order demux 1313a and the second order demux 1313b demultiplex the bits of the bit streams interleaved by the first order bit interleaver 1312a and the second order bit interleaver 1312b. The demuxs 1313a and 1313b divide the input bit stream into sub bit streams which will be mapped to a real axis and an imaginary axis of a constellation and output the sub bit streams. The symbol mappers 1315a and 1315b map the sub bit streams demultiplexed by the demuxs 1313a and 1313b to the corresponding symbols.

The bit interleavers 1312a and 1312b and the demuxs 1313a and 1313b may combine the characteristics of the LDPC codeword and the characteristics of the constellation reliability of the symbol mapping according to the constellation. The detailed embodiment of the first order demuxs 1313a and 1313b will be described later.

The first order symbol mapper 1315a performs first order symbol mapping, for example, higher order symbol mapping, and the second order symbol mapper 1315b performs second order symbol mapping, for example, lower order symbol mapping. The first order symbol mapper 1315a maps the sub bit streams output from the first order demux 1313 to the symbols and the second order symbol mapper 1315b maps the sub bit streams output from the second order demux 1313b to the symbols.

The symbol merger 1317 merges the symbols mapped by the first order symbol mapper 1315a and the second order symbol mapper 1315b to one symbol stream and outputs the symbol stream.

As described above, in the LDPC, the error correction capabilities of the bits may be changed according to the locations of the bits in the error-correction-coded block. Accordingly, if the bit interleaver and the demux are controlled according to the characteristics of the LDPC encoder 125 so as to change the order of the bits configuring the cell word, the error correction capability in the bit level can be maximized.

Figure 19:
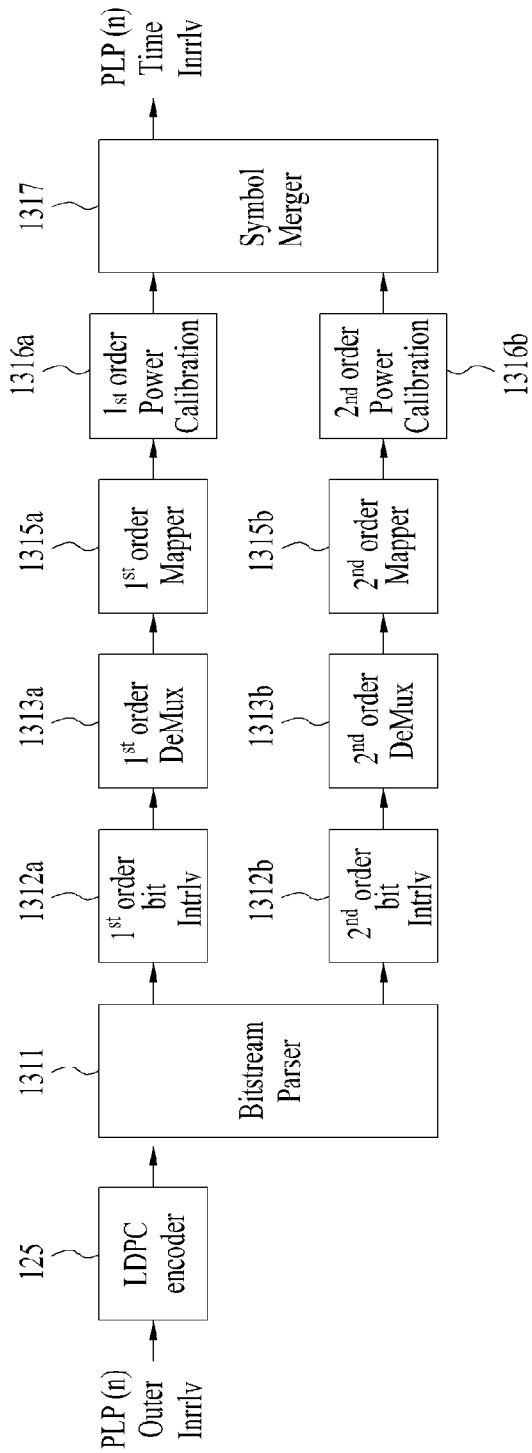
FIG. 19 is a view showing another embodiment of each of the symbol mappers 131a and 131b.

FIG. 19 is a view showing another embodiment of each of the symbol mappers 131a and 131b. The embodiment of this drawing is similar to the embodiment of FIG. 18 except that a first order power calibration unit 1316a and a second order power calibration unit 1316b are further included.

The first order power calibration unit 1316a calibrates the power of the symbols mapped by the first order symbol mapper 1315a according to the size of the constellation and outputs the calibrated symbols. The second order power calibration unit 1316b calibrates the power of the symbols mapped by the second order symbol mapper 1315b according to the size of the constellation and outputs the calibrated symbols. Accordingly, although the symbol mapping scheme is changed in one PLP or is changed among a plurality of PLPs, if the power of the symbol is adjusted according to the size of the constellation, signal reception performance can be improved.

The symbol merger 1317 merges the symbols calibrated by the power calibration units 1316a and 1316b and outputs one symbol stream.

FIG. 20 is a view showing the concept of interleaving of bits by the bit interleavers 1312a and 1312b of FIGS. 18 and 19.

For example, input bits are stored in and read from a matrix-formed memory having a predetermined number of rows and columns. When the input bits are stored, first, the bits are stored in a first column in row direction, and, if the first column is filled up, the bits are stored in another column in row direction. When the stored bits are read, the bits are read in column direction and, if all the bits stored in a first row are read, the bits in another row are read in column direction. In other word, when the bits are stored, the bits are stored row-wise such that the columns are filled up serially. And when the stored bits are read, the stored bits are read column-wise from the first row to last row serially. In this Figure, MSB means a most significant bit and LSB means a least significant bit.

In order to map the LDPC-error-correction-coded bits to the symbols in the same length of error correction block unit at various code rates, the bit interleavers 1312a and 1312b may change the number of rows and columns of the memory according to the types of the symbol mappers 1315a and 1315b.

FIG. 21 illustrates another example of the bit interleavers which perform interleaving. If bit interleavers 1312a and 1312b store bits in units of column, they can store the bits to generate offset of the location where the bits are stored, in each column. If the bit interleavers 1312a and 1312b read the stored bits in units of row, they can store the bits as much as offset of the location where the bits are read, in each row.

In the example of FIG. 21, thick dots respectively represent the location of offset. For example, the bit interleavers store bits in units of column. In the first column, the bits are stored from the first row to the nth row (n is the number of rows of the memory) in due order. In the second column, the bits are stored from the row (referred to as r1th row) with a thick dot to the nth row, and then the bits are stored from the first row to the r1−1th. In the third column, the bits are stored from the r2th row with a thick dot to the nth row, and then the bits are stored from the first row to the r2−1th. In this way, the bits are stored in each column in accordance with circular addressing of the rows from the row away as much as the offset of the stored location.

If the bit interleavers 1312a and 1312b read the bits stored therein, they read the bits from each row in accordance with circular addressing of the columns from the location away as much as the offset. For example, in the first row, the bit interleavers read the stored bits from the first column to the mth column (m is the number of columns of the memory) in due order. In the second row, the bit interleavers read the stored bits from the column (referred to as C1th column) with a thick dot to the mth column and then from the first column to the (C1−1)th column. In the third row, the bit interleavers read the stored bits from the column (referred to as C2th column) with a thick dot to the mth column, and read the bits from the first column to the (C2−1)th column in accordance with circular addressing of the columns.

FIG. 22 illustrates offset used in bit interleaving in accordance with a symbol mapping method. nCo1 represents the number of columns of the memory of the bit interleaver. If the symbol mapping method is QPSK, the number of columns of the memory could be two (2). The bit interleaver can store and read the bits using offset corresponding to the second row in the second column Col2.

If the symbol mapping method is 16QAM, the number of columns of the memory could be four (4). The bit interleaver can store and read the bits in accordance with offset corresponding to the second row in the second column Col2, the fourth row in the third column Col3, and the seventh row in the fourth column Col4.

If the symbol mapping method is 64QAM, the number of columns of the memory could be six (6). The bit interleaver can store and read the bits in accordance with offset corresponding to the second row in the second column Col2, the fifth row in the third column Col3, the ninth row in the fourth column Col4, the tenth row in the fifth column Col5, and the thirteenth row in the sixth column Col6.

If the symbol mapping method is 256QAM, the number of columns of the memory could be eight (8). The bit interleaver can store and read the bits in accordance with offset corresponding to the second row in the third column Col3, the fourth row in the fourth column Col4, the fourth row in the fifth column Col5, the fifth row in the sixth column Col6, the seventh row in the seventh column Col7, and the seventh row in the eighth column Col8.

As described above, the number of columns in the memory of the bit interleaver is varied depending on the symbol mapping method, and the bit interleaver can store and read bits by varying offset depending on the number of columns. The number of bits included in one symbol according to the symbol mapping method could be identical with the number of columns. Accordingly, after reading bits, the bit interleaver can map the read bits with one symbol in accordance with the corresponding mapping method. In this case, the bits mapped with the symbol can be permuted. Also, even though error correction capability of bits in a specific location is lowered in accordance with an error correction symbol method, since the bits mapped with the symbol are permuted in the bit interleaver, the error correction capability of the error correction symbol method can be maximized.

FIG. 23 is a view showing an example of the number of rows and columns of memories of the bit interleavers 1312a and 1312b according to the types of symbol mappers 1315a and 1315b, if the LDPC mode is the normal mode.

For example, if the symbol mapper 1315a maps the bits to 256QAM symbols, the first order interleaver 1312a interleaves the bits by a memory having 8100 rows and 8 columns. If the symbols are mapped by 64QAM, the first order interleaver 1312a interleaves the bits by a memory having 10800 rows and 6 columns. If the symbols are mapped by 16QAM, the first order interleaver 1312a interleaves the bits by a memory having 16200 rows and 4 columns.

For example, if the symbol mappers 1315a and 1315b map the bits to Hyb128-QAM symbols, the first order interleaver 1312a interleaves the bits using a memory having 4860 rows and 8 columns, and the second order interleaver 1312b interleaves the bits using a memory having 4320 rows and 6 columns.

Similarly, if the symbol mappers 1315a and 1315b map the symbols by Hyb32-QAM, the first order interleaver 1312a interleaves the bits using a memory having 6480 rows and 6 columns, and the second order interleaver 1312b interleaves the bits using a memory having 6480 rows and 4 columns.

FIG. 24 is a view showing an example of the number of rows and columns of the memories of the bit interleavers 1312a and 1312b according to the types of the symbol mappers 1315a and 1315b, if the LDPC mode is the short mode.

For example, if the symbol mapper 1315a maps the bits to 256QAM symbols, the first order interleaver 1312a interleaves the bits by a memory having 2025 rows and 8 columns. If the symbol mappers 1315a and 1315b map the symbols by Hyb128-QAM, the first order interleaver 1312a interleaves the bits using a memory having 1215 rows and 8 columns, and the second order interleaver 1312b interleaves the bits using a memory having 1080 rows and 6 columns.

If the bit interleaving is performed with respect to the error-correction-coded block, the locations of the bits in the error-correction-coded block may be changed.

Figure 25:
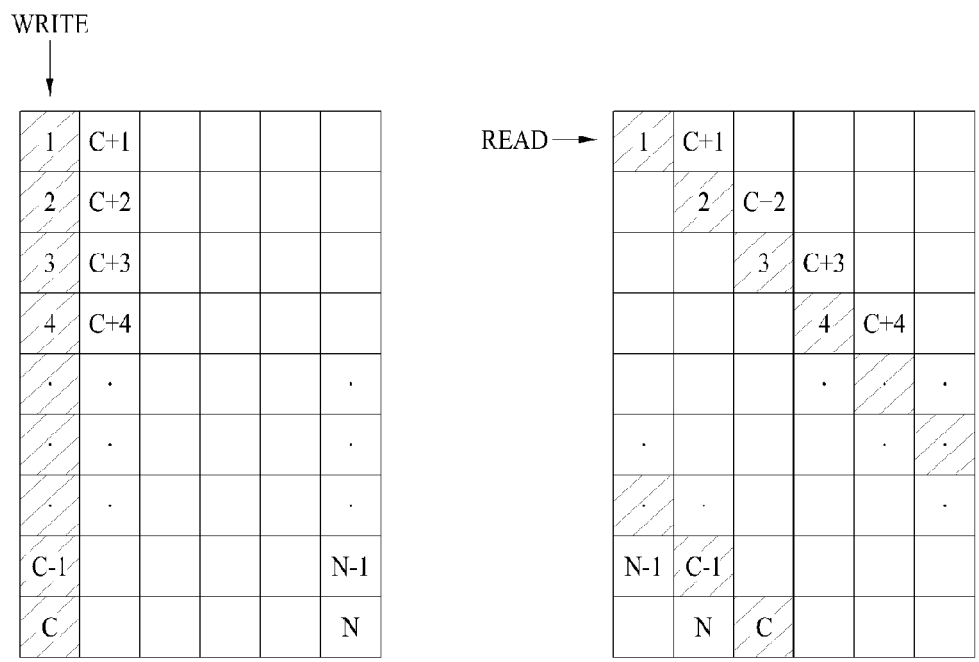
FIG. 25 is a diagram showing the concept of another embodiment of interleaving of a bit interleaver.

FIG. 25 is a diagram showing the concept of another embodiment of interleaving of a bit interleaver. In the embodiment shown in this drawing, when bits are written in a memory, the bits are written in a column direction. When the written bits are read, the bits of the circularly shifted locations are read in a row direction. In each row, the bits written in each row is circularly shifted. If the bits are written or read by a circular shift method with respect to the row or the column of the memory, this is called twisted bit interleaving. This embodiment relates to the twisted bit interleaving method using a method of reading the bits after the bits are shifted by one column in row direction. Instead of shifting the written bits in the memory, the point for reading bits in the memory or the point for writing bits in the memory can be shifted.

In this embodiment, N denotes the length of the error correction coded block and C denotes the length of the column. When the bits are written, the bits are written in a first column (represented by a shadow) in order of 1, 2, 3, 4, . . . , and C and the bits are written in a second column in order of C+1, C+2, C+3, . . . .

The written bits are twisted in the row direction one column by one column.

If the written bits are read, the twisted bits are read in the row direction. For example, in this embodiment, the bits are read in a first row in order of 1, C+1 . . . and the bits are read in a second row in order of X1, 2, C+2, . . . (X1 is a bit in the first column of the second row). The bits are read by row by row and the circularly shifted bits are read. Of course, instead of shifting the written bits in the memory, the point for reading bits written in the memory can be shifted.

Figure 26:
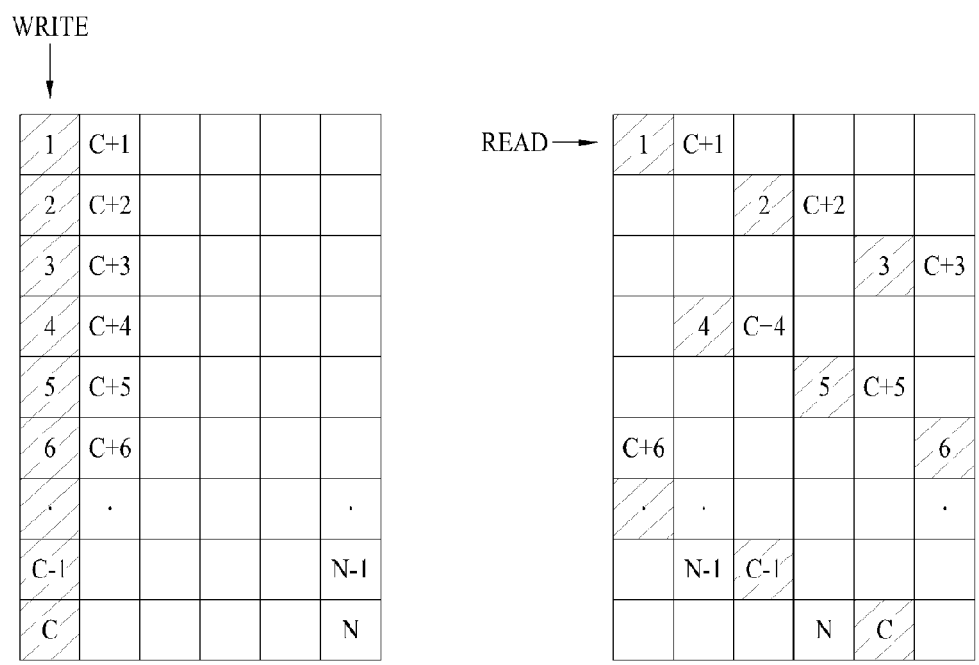
FIG. 26 is a view showing another embodiment of bit interleaving.

FIG. 26 is a view showing another embodiment of bit interleaving. In this embodiment, N denotes the length of the error correction coded block and C denotes the length of the column. When the bits are written, the bits are written in a first column in order of 1, 2, 3, 4, . . . , C−1, and C and the bits are written in a second column in order of C+1, C+2, C+3, . . . .

The written bits are double-twisted in the row direction two columns by two columns. If the written bits are read, the bits circularly shifted by two columns are read in the column direction in every row. This method may be called a double twisted bit interleaving method.

Figure 27:
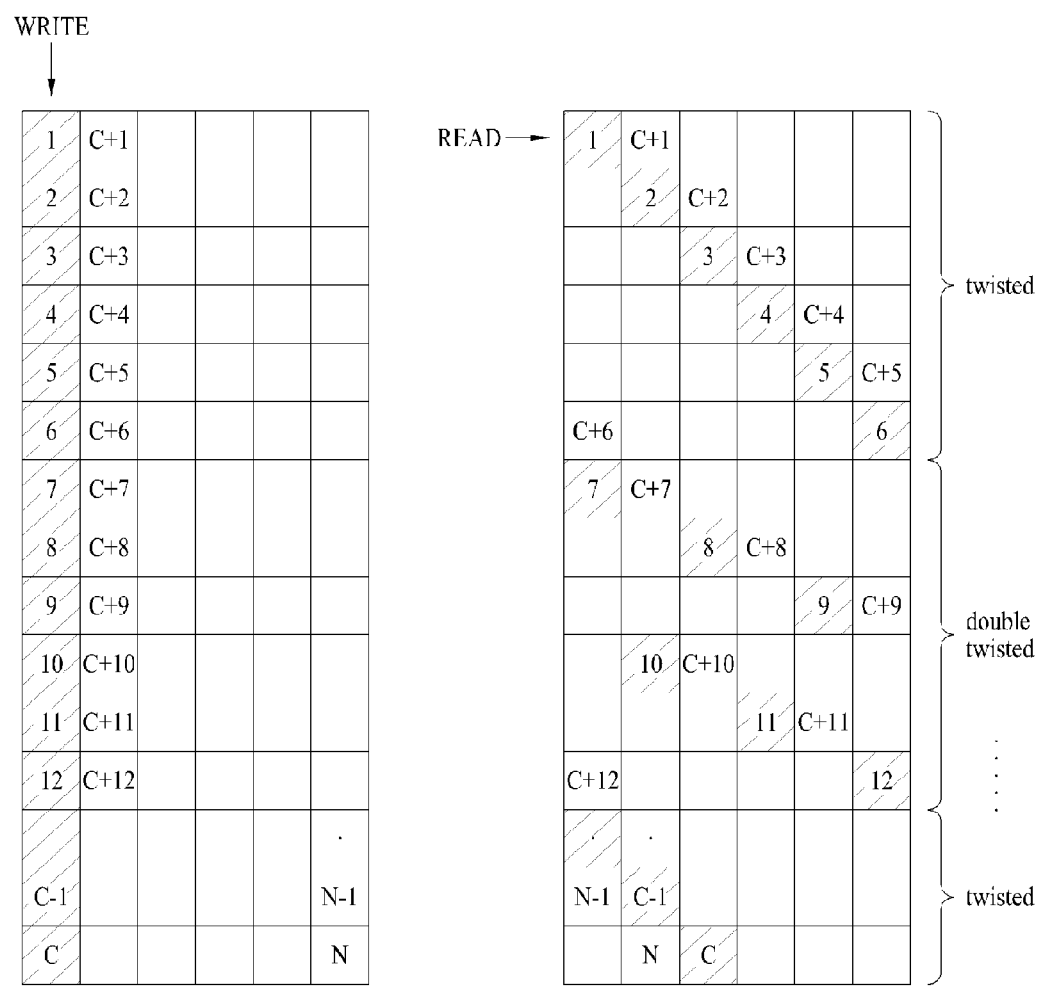
FIG. 27 is a view showing another embodiment of bit interleaving.

FIG. 27 is a view showing another embodiment of bit interleaving. In this embodiment, N denotes the length of the error correction coded block and C denotes the length of the column. The bits are written in a first column in order of 1, 2, 3, 4, . . . , C−1, and C and the bits are written in a second column in order of C+1, C+2, C+3, . . . .

When the written bits are read, in a first region of the rows, the bits may be read by the twisted bit interleaving method.

In a second region of the rows, the bits may be read by the double twisted interleaving method.

In a third region of the rows, the bits may be read by the twisted bit interleaving method.

If the bits are interleaved by at least one of the twisted bit interleaving method and the double twisted interleaving method, the bits in the error correction coded block can be more randomly mixed.

Figure 28:
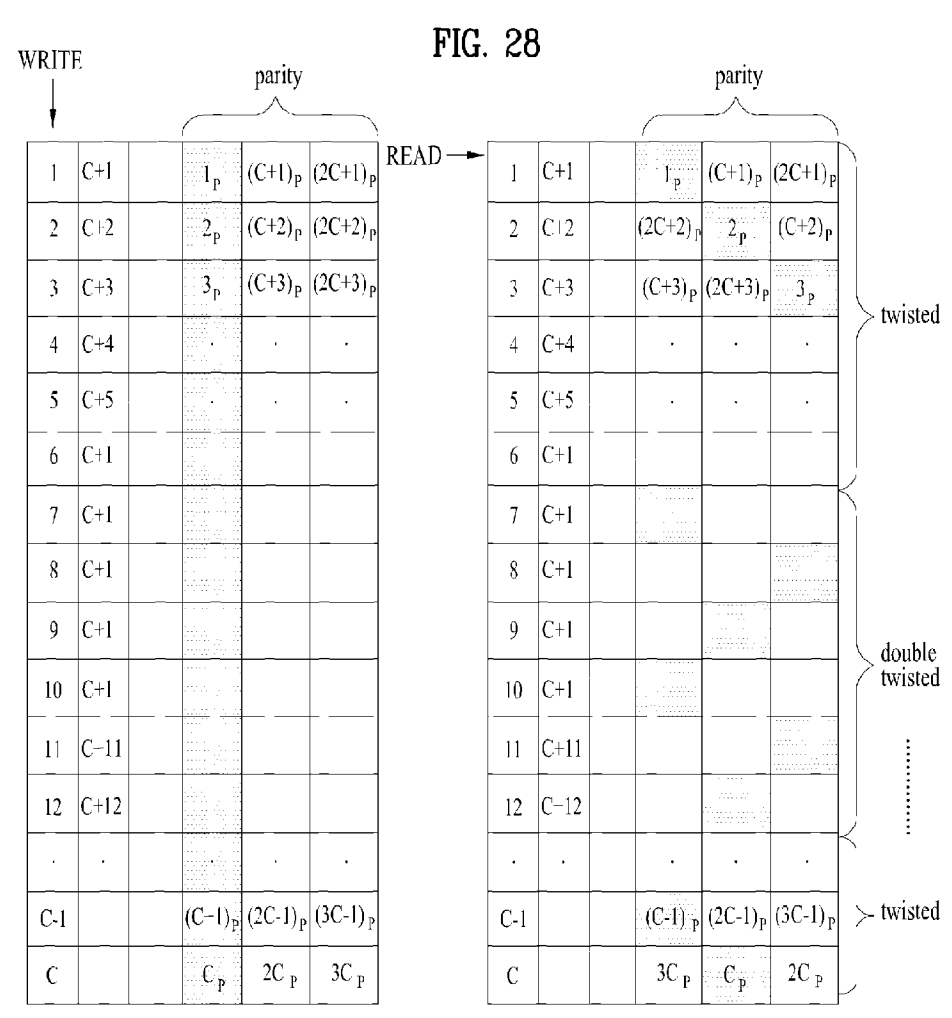

FIG. 28 is a view showing another embodiment of bit interleaving. As another embodiment of bit interleaving, different bit interleaving may be performed with respect to error-correction-encoded information bits and parity bits.

For example, in an error correction encoding process (for example, an LDPC error correction encoding process), information bits are bit-interleaved as shown in FIGS. 21 and 22. If the bits are written and read in each column with respect to the information bits, bit interleaving may be performed according to an offset of a start location for writing and reading bits in each column.

In the error correction encoding process, parity bits are bit-interleaved by a twist scheme according to at least one of the schemes shown in FIGS. 25 to 27. The parity bits are written in each column and then rows are twisted. That is, the bits written in the rows may be shifted by a predetermined location. The twisted bits are read along each row. The written parity bits may include at least one of a twisted row region and a double twisted row region.

If bit interleaving is performed with respect to the parity bits by the above-described method, decoding performance of the parity bits can be improved. For example, the parity bits of a parity check matrix used in the error correction encoding process such as a structured LDPC may have a dual matrix form. However, if parity bits with low reliability are consecutive in a parity check matrix, error correction decoding performance may deteriorate. Accordingly, if bit interleaving is performed with respect to the parity bits by the above-described method, error correction decoding performance may be improved.

Now, an embodiment of an encoding process capable of coping with error occurrence with respect to at least one of layer-1 information and layer-2 information which are transmitted/received will be described.

FIG. 29 is a view showing the concept of multiplexing of input bits of the demuxs 1313a and 1313b.

The bit interleavers 1312a and 1312b interleave the input bits x0, x1, . . . , and xn−1 and output the interleaved bits. The interleaving method is already described above.

The demuxs 1313a and 1313b demultiplex the interleaved bit streams. The demultiplexing method may vary according to the code rate of the error correction coding method and the symbol mapping method of the symbol mapper. If the symbol method of the symbol mapper is QPSK, the input bits, for example, are interleaved to two sub streams and the symbol mapper maps the two sub streams to the symbols so as to correspond to the real axis and the imaginary axis of the constellation. For example, a first bit y0 of the demultiplexed first sub stream corresponds to the real axis and a first bit y1 of the demultiplexed second sub stream corresponds to the imaginary axis.

If the symbol method of the symbol mapper is 16QAM, the input bits, for example, are demultiplexed to four sub frames. The symbol mapper selects the bits included in the four sub streams and maps the selected bits to the symbols so as to correspond to the real axis and the imaginary axis of the constellation.

For example, the bits y0 and y2 of the demultiplexed first and third sub streams correspond to the real axis and the bits y1 and y3 of the demultiplexed second and fourth sub streams correspond to the imaginary axis.

Similarly, if the symbol method of the symbol mapper is 64QAM, the input bits may be demultiplexed to six bit streams. The symbol mapper maps the six sub streams to the symbols so as to correspond to the real axis and the imaginary axis of the constellation. For example, the demultiplexed first, third and fifth sub stream bits y0, y2 and y4 correspond to the real axis and the demultiplexed second, fourth and sixth sub stream bits y1, y3 and y6 correspond to the imaginary axis.

Similarly, if the symbol method of the symbol mapper is 256QAM, the input bits may be demultiplexed to eight bit streams. The symbol mapper maps the eight sub streams to the symbols so as to correspond to the real axis and the imaginary axis of the constellation. For example, first, the demultiplexed first, third fifth and seventh sub stream bits y0, y2, y4 and y6 correspond to the real axis and the demultiplexed second, fourth, sixth and eighth sub stream bits y1, y3, y6 and y7 correspond to the imaginary axis.

If the symbol mapper maps the symbols, the sub streams demultiplexed by the demux may be mapped to the bit streams of the real axis and the imaginary axis of the constellation.

The above-described bit interleaving method, demultiplexing method and symbol mapping method are exemplary and various methods may be used as the method of selecting the bits in the sub streams such that the sub streams demultiplexed by the demux may correspond to the real axis and the imaginary axis of the constellation.

The cell word mapped to the symbols may vary according to any one of the error-corrected bit streams according to the code rate, the method of interleaving the bit streams, the demultiplexing method and the symbol mapping method. The MSB of the cell word is higher than the LSB of the cell word in the reliability of the error correction decoding. Although the reliability of the bit of a specific location of the error-correction-coded block is low, the reliability of the bit can be improved by the symbol demapping process if the bit of the cell word is arranged on the MSB or close to the MSB.

Accordingly, although the reliability of the bit coded according to the characteristics of the H-matrix used in the irregular LDPC error correction coding method is changed, the bit can be robustly transmitted/received by the symbol mapping and demapping process and the system performance can be adjusted.

FIG. 30 is a view showing an embodiment of demultiplexing an input stream by the demux.

If the symbol mapping method is QPSK, two bits are mapped to one symbol and the two bits of one symbol unit are demultiplexed in order of the bit indexes (indexes 0 and 1 of b).

If the symbol mapping method is 16QAM, 4 bits are mapped to one symbol and the four bits of one symbol unit are demultiplexed according to the calculating result of the modulo-4 of bit indexes (indexes 0, 1, 2 and 3 of b).

If the symbol mapping method is 64QAM, 6 bits are mapped to one symbol and the six bits of one symbol unit are demultiplexed according to the calculating result of the modulo-6 of bit indexes (indexes 0, 1, 2, 3, 4 and 5 of b).

If the symbol mapping method is 256QAM, 8 bits are mapped to one symbol and the eight bits of one symbol unit are demultiplexed according to the calculating result of the modulo-8 of bit indexes (indexes 0, 1, 2, 3, 4, 5, 6, and 7 of b).

The demultiplexing order of the sub streams is exemplary and may be modified.

FIG. 31 is a view showing an example of a demultiplexing type according to a symbol mapping method. The symbol mapping method includes QPSK, 16QAM, 64QAM and 256QAM, and the demultiplexing type includes a first type to a sixth type.

The first type is an example in which the input bits sequentially correspond to even-numbered indexes (0, 2, 4, 8, . . . ) (or the real axis of the constellation) and sequentially correspond to odd-numbered indexes (1, 3, 5, 7, . . . ) (or the imaginary axis of the constellation). Hereinafter, the bit demultiplexing of the first type may be represented by a demultiplexing identifier 10 (a binary number of 1010; the location of 1 is the location of the MSB corresponding to the real axis and the imaginary axis of the constellation).

The second type is an example in which the demultiplexing is performed in reverse order of the first type, that is, the LSB of the input bits sequentially correspond to even-numbered indexes (6, 4, 2, 0) (or the real axis of the constellation) and odd-numbered indexes (1, 3, 5, 7, . . . ) (or the imaginary axis of the constellation). Hereinafter, the bit demultiplexing of the second type may be represented by a demultiplexing identifier 5 (a binary number of 0101).

The third type is an example in which the input bits are arranged such that the bits of the both ends of the codeword become the MSB. The input bits are rearranged so as to fill the code word from the both ends of the code word. Hereinafter, the bit demultiplexing of the third type may be represented by a demultiplexing identifier 9 (a binary number of 1001).

The fourth type is an example in which the input bits are arranged such that a middle bit of the code word becomes the MSB. A bit of the input bits is first filled in the middle location of the code word and the remaining bits are then rearranged toward the both ends of the code word in order of the input bits. Hereinafter, the bit demultiplexing of the fourth type may be represented by a demultiplexing identifier 6 (a binary number of 0110).

The fifth type is an example in which the bits are demultiplexed such that a last bit of the code word becomes the MSB and a first bit thereof becomes the LSB, and the sixth type is an example in which the bits are rearranged such that the first bit of the code word becomes the MSB and the last bit thereof becomes the LSB. Hereinafter, the bit demultiplexing of the fifth type may be represented by a demultiplexing identifier 3 (a binary number of 0011), and the bit demultiplexing of the sixth type may be represented by a demultiplexing identifier 12 (a binary number of 1100).

As described above, the demultiplexing type may vary according to the symbol mapping method or the code rate of the error correction coding method. That is, a different demultiplexing type may be used if the symbol mapping method or the code rate is changed.

Figure 32:
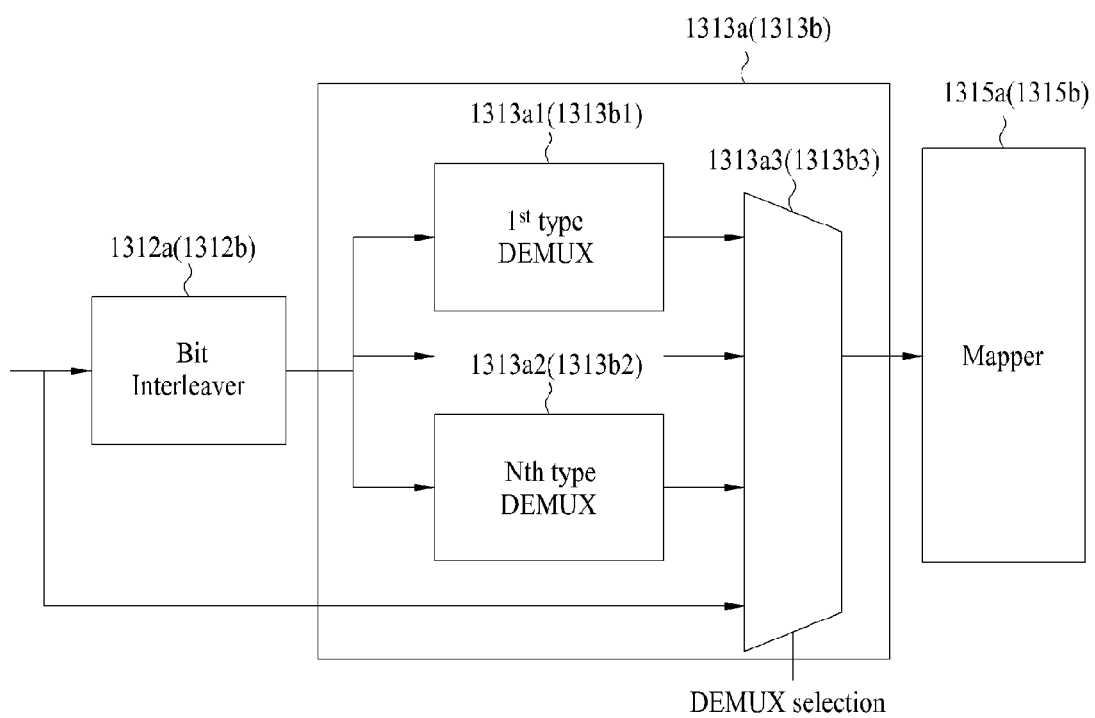
FIG. 32 is a view showing an embodiment of demultiplexing an input bit stream according to a demultiplexing type.

FIG. 32 is a view showing an embodiment of demultiplexing an input bit stream according to a demultiplexing type. This embodiment may include bit interleavers 1312a and 1312b, demuxs 1313a and 1313b and mappers 1315a and 1315b.

The bit interleavers 1312a and 1312b interleave the error-correction-coded PLP service streams. For example, the bit interleavers 1312a and 1312b may perform the bit interleaving in the error correction coding units according to the error correction coding mode. The bit interleaving method is already described above.

The demuxs 1313a and 1313b may include first type demuxs 1313a1 and 1313b1, . . . , and nthtype demuxs 1313a2 and 1313b2. Here, n is an integer. The methods of demultiplexing the bits by the n types of demuxs follow the types shown in FIG. 17. For example, the first type demuxs may correspond to the first type bit demultiplexing (1100) and the second type demux (not shown) may correspond to the second type bit demultiplexing (0011). The nth type demux 1313b demultiplexes the input bit stream according to the nth type bit multiplexing (e.g., the demultiplexing identifier 1100) and outputs the demultiplexed bit stream. Selectors 1313a3 and 1313b3 receive a demux selection signal of the demultiplexing type suitable for the input bits and output the demultiplexed bit stream according to any one of the first type to the nth type and the demux selection signal. The demux selection signal may vary according to the code rate of the error correction coding and the symbol mapping method of the constellation. Accordingly, the demultiplexing type may be determined according to the code rate of the error correction coding method or/and the symbol mapping method of the constellation. The detailed example according to the symbols mapped to the constellation or/and the code rate of the error correction coding according to the demux selection signal will be described later.

The mappers 1315a and 1315b may map the demultiplexed sub bit streams to the symbols according to the demux selection signal and output the mapped symbols.

FIG. 33 is a view showing a demultiplexing type which is determined according to a code rate of the error correction coding and the symbol mapping method.

In the 4QAM symbol mapping method, even when the code rate cr of the LDPC error correction coding method is any one of 1/4, 1/3, 2/5, 1/2, 3/5, 2/3, 3/4, 4/5, 5/6, 8/9 and 9/10, the bit stream can be demultiplexed according to all the demultiplexing types (denoted by all).

In the 16QAM symbol mapping method, if the code rate of the LDPC error correction coding method is 1/4, 1/3, 2/5 and 1/2, the symbols can be mapped without performing the bit interleaving and the bit demultiplexing (denoted by No-Int and No-Demux). If the code rate of the error correction coding is 3/5, the bit can be demultiplexed according to any one of the demultiplexing identifiers 9, 10 and 12. If the code rate of the error correction coding is 2/3, 3/4, 4/5, 5/6, 8/9 and 9/10, the input bit stream can be demultiplexed according to the demultiplexing identifier 6.

In the 64QAM symbol mapping method, if the code rate of the LDPC error correction coding is 1/4, 1/3, 2/5 and 1/2, the symbols can be mapped without performing the bit interleaving and the bit demultiplexing. If the code rate is 3/5, the bits can be demultiplexed according to any one of the demultiplexing identifiers 9 and 10. If the code rate is 2/3, 3/4, 4/5, 5/6, 8/9 and 9/10, the bits can be demultiplexed according to the demultiplexing identifier 6.

In the 256QAM symbol mapping method, if the code rate of the LDPC error correction coding is 1/4, 1/3, 2/5 and 1/2, the symbols can be mapped without performing the bit interleaving and the bit demultiplexing. If the code rate is 3/5, the bits can be demultiplexed according to the demultiplexing identifier 9. If the code rate is 2/3, 3/4, 4/5, 5/6, 8/9 and 9/10, the bits can be demultiplexed according to the demultiplexing identifier 6.

As described above, the bit demultiplexing type may vary according to the code rate used for the error correction coding and the symbol mapping method. Accordingly, the error correction capability of a bit located on a specific location of the error-correction-coded block may be adjusted by mapping the demultiplexed sub streams to the symbols. Accordingly it is possible to optimize the robustness in the bit level.

FIG. 34 is a view showing an example of expressing the demultiplexing method by an equation. For example, if the symbol mapping method is QPSK, the input bits $(x_i; x_{N/2+i})$ correspond to the demultiplexed bits y0 and y1. If the symbol mapping method is 16QAM, the input bits $$\left(X_{\frac{2N}{4}+i}, X_{\frac{3N}{4}+i}, X, X_{\frac{N}{4}+i}\right)$$

correspond to the demultiplexed bits y0, y1, y2 and y3.

If the symbol mapping method is 64QAM, the input bits $$\left(X_{\frac{4N}{6}+i}, X_{\frac{5N}{6}+i}, X_{\frac{2N}{6}+i}, X_{\frac{3N}{6}+i}, X, X_{\frac{N}{6}+i}\right)$$

correspond to the demultiplexed bits y0, y1, y2, y3, y4 and y5. If the symbol mapping method is 256QAM, the input bits $$\left(X_{\frac{6N}{8}+i}, X_{\frac{7N}{8}+i}, X_{\frac{4N}{8}+i}, X_{\frac{5N}{8}+i}, X_{\frac{2N}{8}+i}, X_{\frac{3N}{8}+i}, X, X_{\frac{N}{8}+i}\right)$$

correspond to the demultiplexed bits y0, y1, y2, y3, y4, y5, y6 and y7.

Here, N denotes the number of bits mapped to the symbols with respect to the input of the bit interleaver.

Figure 35:
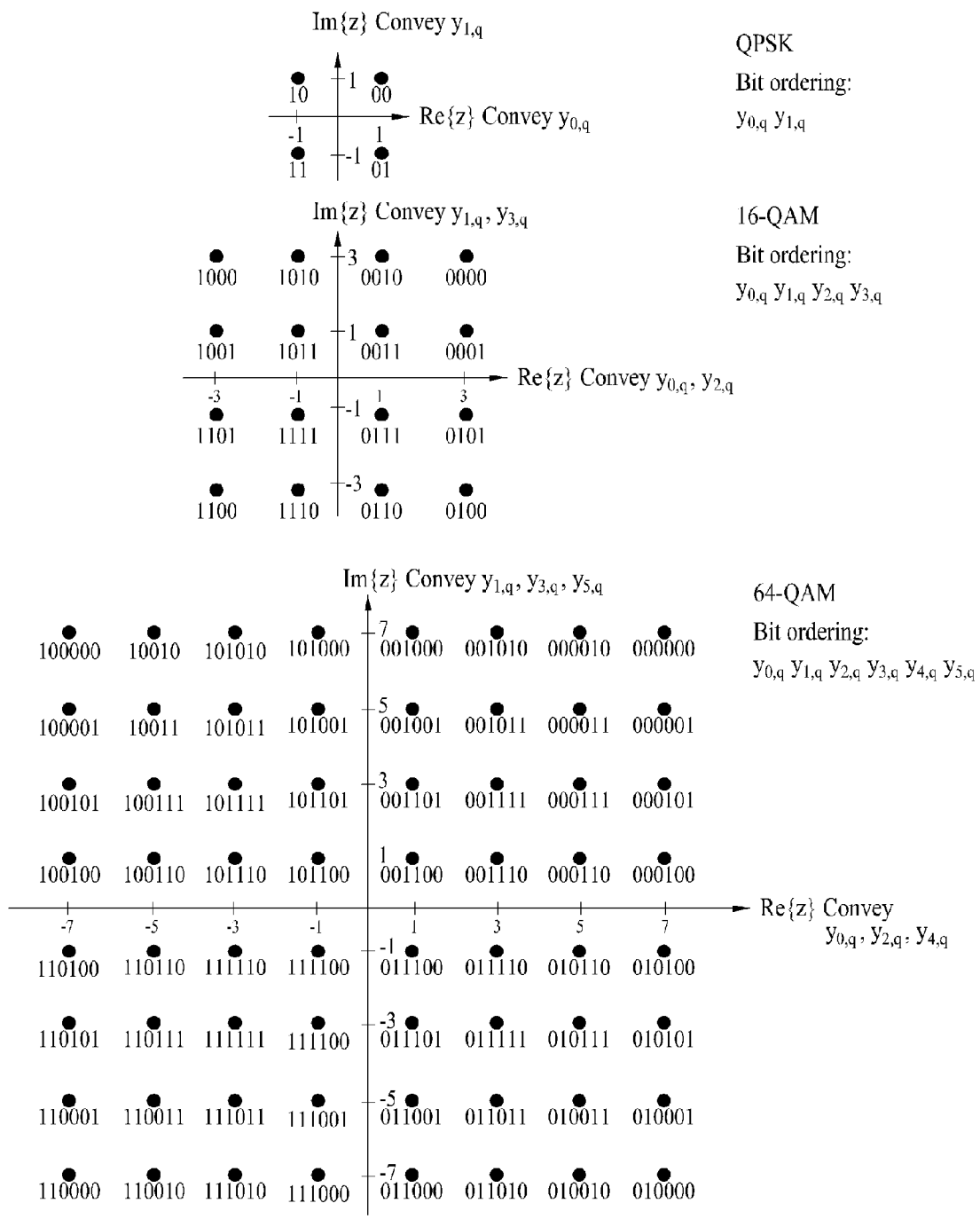
FIG. 35 is a view showing an example of mapping a symbol by a symbol mapper.

FIG. 35 is a view showing an example of mapping a symbol by a symbol mapper. For example, in the QPSK symbol mapping method, the symbols on the constellation correspond to the value of the bit y0 of the demultiplexed first sub stream and the value of the bit y1 of the demultiplexed second sub stream.

In the 16QAM, the real axis of the symbols on the constellation corresponds to the bits of the demultiplexed first and third sub streams (bits separated from the location of the MSB by 0 and 2) and the imaginary axis thereof corresponds to the bits of the de-MSB by 1 and 3).

In the 64QAM, the real axis of the symbols on the constellation corresponds to the bits of the demultiplexed first, third, and fifth sub streams (bits separated from the location of the MSB by 0, 2 and 4) and the imaginary axis thereof corresponds to the bits of the demultiplexed second, fourth and sixth sub streams (bits separated from the location of the MSB by 1, 3 and 5).

Accordingly, the bits configuring the symbol may be mapped to the cell word in the demultiplexing order. If the bits configuring the cell word are demultiplexed, the MSB and the LSB of the cell word are changed and the robustness of the bits can be adjusted although the reliabilities of the LDPC error-correction-coded bits vary according to the locations.

Figure 36:
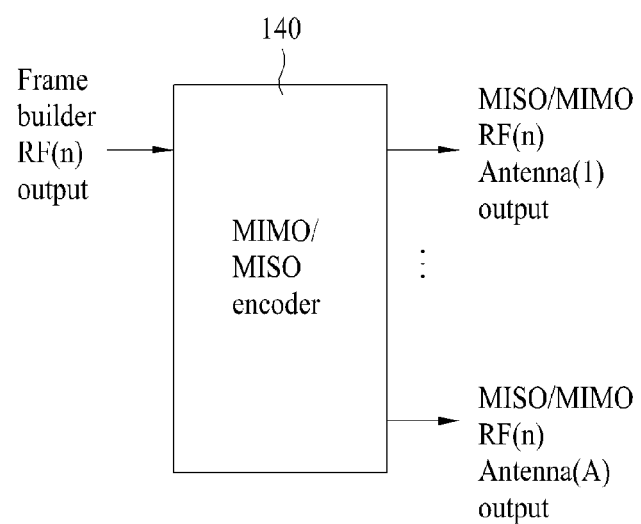
FIG. 36 is a view showing an example of a multi-path signal coder.

FIG. 36 is a block diagram illustrating a MIMO/MISO encoder according to an embodiment of the present invention. The MIMO/MISO encoder encodes the input data using the MIMO/MISO encoding scheme, and outputs the encoded data to several paths. If a signal reception end receives the signal transmitted to the several paths from one or more paths, it is able to acquire a gain (also called a diversity gain, a payload gain, or a multiplexing gain).

The MIMO/MISO encoder 140 encodes service data of each path generated from the frame builder 130, and outputs the encoded data to the A number of paths corresponding to the number of output antennas.

Figure 37:
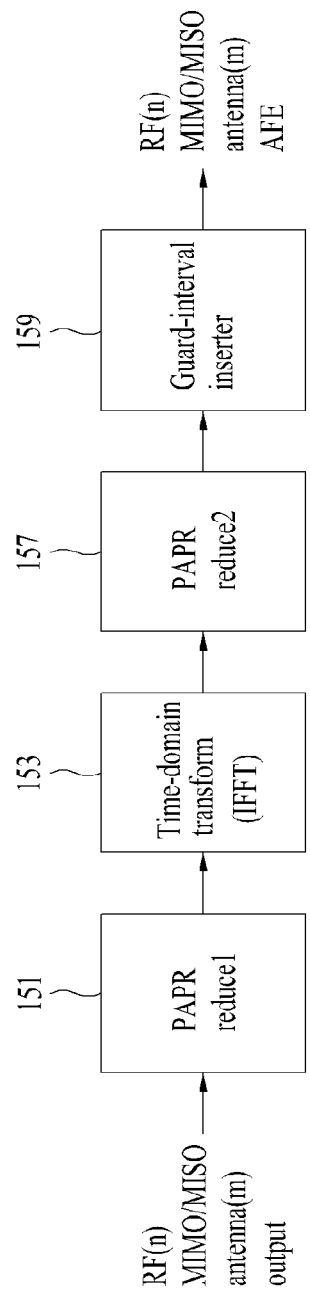
FIG. 37 is a view showing an embodiment of a modulator.

FIG. 37 is a block diagram illustrating a modulator according to an embodiment of the present invention. The modulator includes a first power controller (PAPR Reduce1) 151, a time-domain transform unit (IFFT) 153, a second power controller (PAPR Reduce2) 157, and a guard-interval inserter 159.

The first power controller 151 reduces a PAPR (Peak-to-Average Power Ratio) of data transmitted to the R number of signal paths in the frequency domain.

The time-domain transform (IFFT) unit 153 converts the received frequency-domain signals into time-domain signals. For example, the frequency-domain signals may be converted into the time-domain signals according to the IFFT algorithm. Therefore, the frequency-domain data may be modulated according to the OFDM scheme.

The second power controller (PAPR Reduce2) 157 reduces a PAPR (Peak-to-Average Power Ratio) of channel data transmitted to the R number of signal paths in the time domain. In this case, a tone reservation scheme, and an active constellation extension (ACE) scheme for extending symbol constellation can be used.

The guard-interval inserter 159 inserts the guard interval into the output OFDM symbol, and outputs the inserted result. As described above, the above-mentioned embodiment can be carried out in each signal of the R number of paths.

Figure 38:
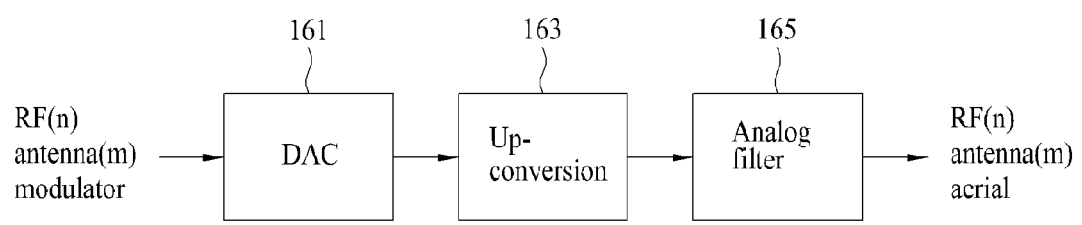
FIG. 38 is a view showing an embodiment of an analog processor 160.

FIG. 38 is a block diagram illustrating an analog processor 160 according to an embodiment of the present invention. The analog processor 160 includes a digital-to-analog converter (DAC) 161, an up-conversion unit 163, and an analog filter 165.

The DAC 161 converts the input data into an analog signal, and outputs the analog signal. The up-conversion unit 163 converts a frequency domain of the analog signal into an RF area. The analog filter 165 filters the RF-area signal, and outputs the filtered RF signal.

Figure 39:
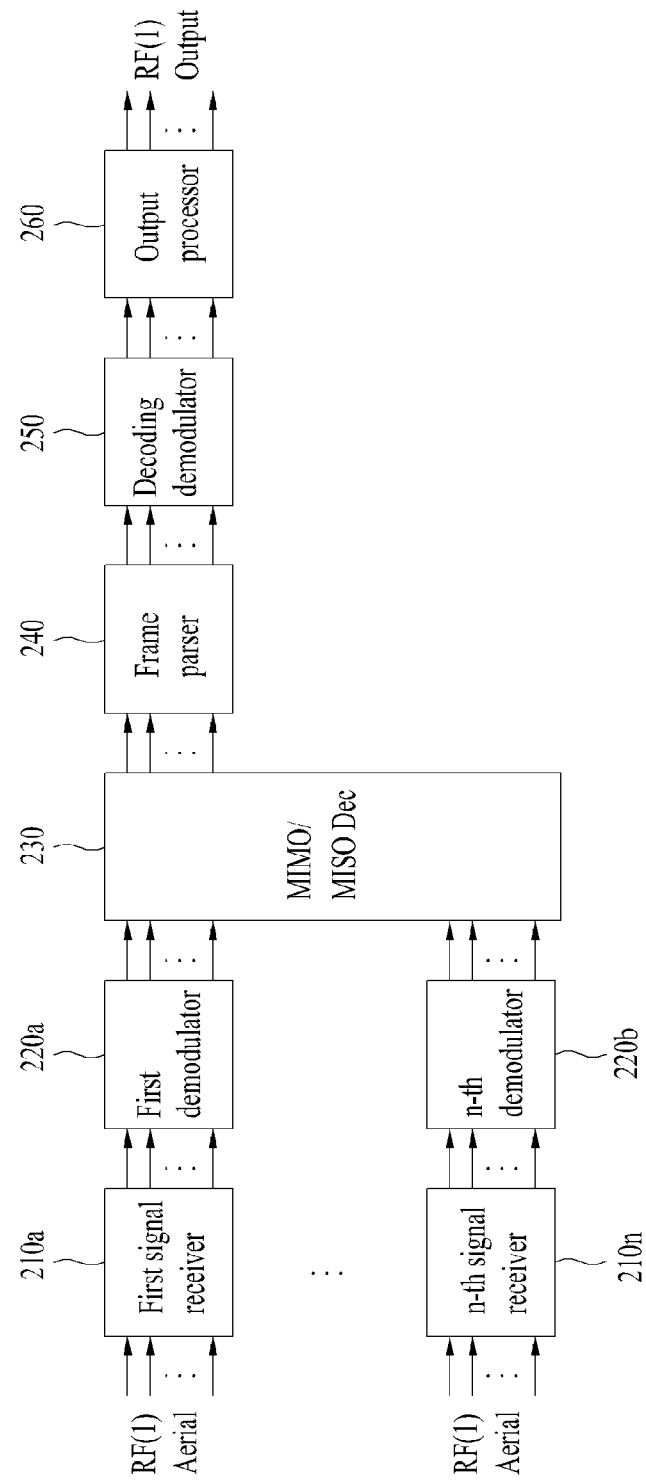
FIG. 39 is a view showing an embodiment of a signal receiving apparatus capable of receiving a signal frame.

FIG. 39 is a block diagram illustrating an apparatus for receiving a signal according to an embodiment of the present invention. The signal reception apparatus includes a first signal receiver 210a, an n-th signal receiver 210n, a first demodulator 220a, an n-th demodulator 220n, a MIMO/MISO decoder 230, a frame parser 240, and a decoding demodulator 250, and an output processor 260.

In the case of a reception signal according to the TFS signal frame structure, several services are multiplexed to R channels, and are then time-shifted, such that the time-shifted result is transmitted.

The receiver may include at least one signal receiver for receiving a service transmitted over at least one RF channel. The TFS signal frame transmitted to the R (where R is a natural number) number of RF channels can be transmitted to a multi-path via the A number of antennas. The A antennas have been used for the R RF channels, such that a total number of antennas is R×A.

The first signal receiver 210a is able to receive service data transmitted via at least one path from among overall service data transmitted via several RF channels. For example, the first signal receiver 210a can receive the transmission signal processed by the MIMO/MISO scheme via several paths.

The first signal receiver 210a and the n-th signal receiver 210n can receive several service data units transmitted over n number of RF channels from among several RF channels, as a single PLP. Namely, this embodiment shows the signal reception apparatus capable of simultaneously receiving data of the R number of RF channels. Therefore, if this embodiment receives a single RF channel, only the first receiver 210a is needed.

The first demodulator 220a and the n-th demodulator 220n demodulate signals received in the first and n-th signal receivers 210a and 210n according to the OFDM scheme, and output the demodulated signals.

The MIMO/MISO decoder 230 decodes service data received via several transmission paths according to the MIMO/MISO decoding scheme, and outputs the decoded service data to a single transmission path. If the number R of services transmitted over several transmission paths are received, the MIMO/MISO decoder 230 can output single PLP service data contained in each of R services corresponding to the number of R channels. If P number of services are transmitted via the R number of RF channels, and signals of individual RF channels are received via the A number of antennas, the receiver decodes the P number of services using a total of (R×A) reception antennas.

The frame parser 240 parses the TFS signal frame including several services, and outputs the parsed service data.

The decoding demodulator 250 performs the error correction decoding on the service data contained in the parsed frame, demaps the decoded symbol data into bit data, and outputs the demapping-processed result.

The output processor 260 decodes a stream including the demapped bit data, and outputs the decoded stream.

In the above-mentioned description, each of the frame parser 240, and the decoding demodulator 250, and the output processor 260 receives several service data units as many as the number of PLPs, and performs signal processing on the received service data.

Figure 40:
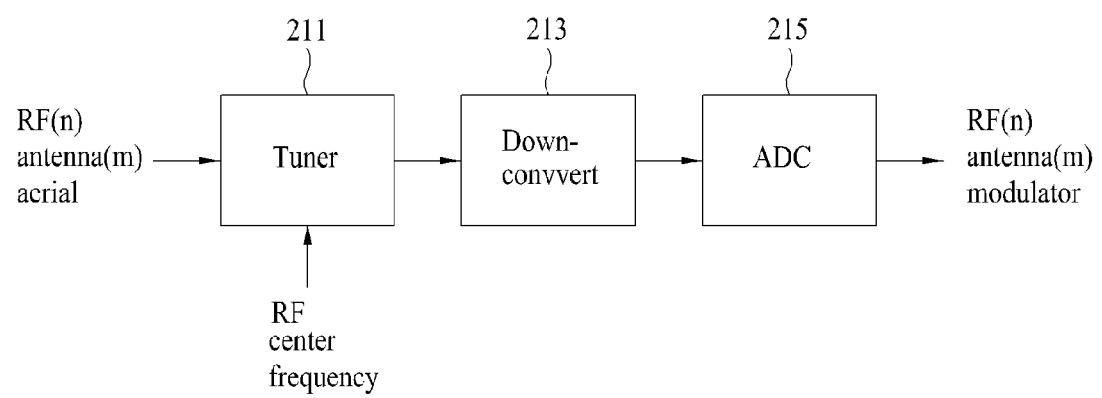
FIG. 40 is a view showing an embodiment of a signal receiver.

FIG. 40 is a block diagram illustrating a signal receiver according to an embodiment of the present invention. The signal receiver may include a tuner 211, a down-converter 213, and an analog-to-digital converter (ADC) 215.

The tuner 211 performs hopping of some RF channels capable of transmitting user-selected services in all RF channels when the PLP is included in several RF channels, and outputs the hopping result. The tuner 211 performs hopping of RF channels contained in the TFS signal frame according to input RF center frequencies, and at the same time tunes corresponding frequency signals, such that it outputs the tuned signals. If a signal is transmitted to A number of multi-paths, the tuner 211 performs the tuning to a corresponding RF channel, and receives reception signals via the A number of antennas.

The down converter 213 performs down conversion of the RF frequency of the signal tuned by the tuner 211, and outputs the down-conversion result. The ADC 215 converts an analog signal into a digital signal.

Figure 41:
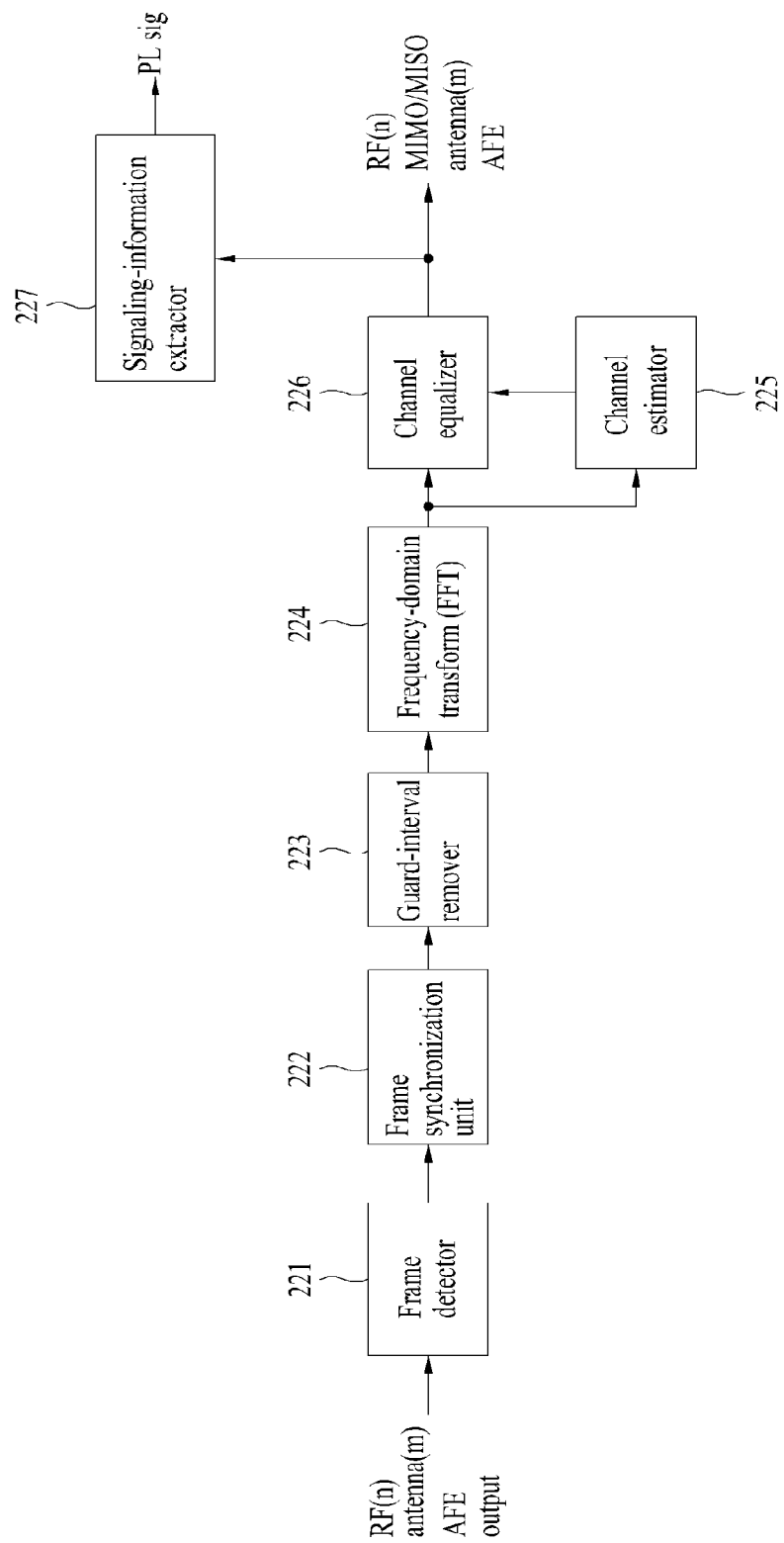
FIG. 41 is a view showing an embodiment of a demodulator.

FIG. 41 is a block diagram illustrating a demodulator according to the present invention. The demodulator includes a frame detector 221, a frame synchronization unit 222, a guard-interval remover 223, a frequency-domain transform unit (FFT) 224, a channel estimator 225, a channel equalizer 226, and a signaling-information extractor 227.

If the demodulator acquires service data transmitted to a single PLP stream, the following signal demodulation will be carried out. A detailed description thereof will hereinafter be described.

The frame detector 221 identifies a delivery system of a reception signal. For example, the frame detector 221 determines whether the reception signal is a DVB-TS signal or not. And, the frame detector 221 may also determine whether a reception signal is a TFS signal frame or not. The frame synchronization unit 222 acquires time- and frequency-domain synchronization of the TFS signal frame.

The guide interval controller 223 removes a guard interval located between OFDM symbols from the time domain. The frequency-domain converter (FFT) 224 converts a reception signal into a frequency-domain signal using the FFT algorithm, such that it acquires frequency-domain symbol data.

The channel estimator 225 performs channel estimation of a reception channel using a pilot symbol contained in symbol data of the frequency domain. The channel equalizer 226 performs channel equalization of reception data using channel information estimated by the channel estimator 225.

The signaling information extractor 227 can extract the signaling information of a physical layer established in the first and second pilot signals contained in channel-equalized reception data.

Figure 42:
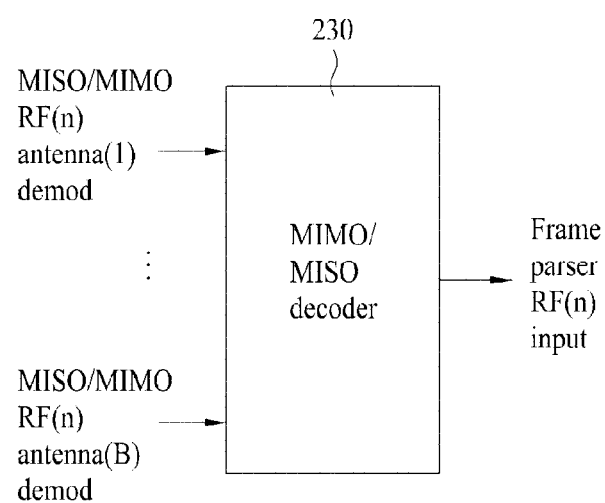
FIG. 42 is a view showing a multi-path signal decoder.

FIG. 42 is a block diagram illustrating a MIMO/MISO decoder according to the present invention. The signal receiver and the demodulator are designed to process a signal received in a single path. If the signal receiver and the demodulator receive PLP service data providing a single service via several paths of several antennas, and demodulate the PLP service data, the MIMO/MIMO decoder 230 outputs the signal received in several paths as service data transmitted to a single PLP. Therefore, the MIMO/MISO decoder 230 can acquire a diversity gain and a multiplexing gain from service data received in a corresponding PLP.

The MIMO/MISO decoder 230 receives a multi-path transmission signal from several antennas, and is able to decode a signal using a MIMO scheme capable of recovering each reception signal in the form of a single signal. Otherwise, the MIMO/MISO decoder 230 is able to recover a signal using a MIMO scheme which receives the multi-path transmission signal from a single antenna and recovers the received multi-path transmission signal.

Therefore, if the signal is transmitted via the R number of RF channels (where R is a natural number), the MIMO/MISO decoder 230 can decode signals received via the A number of antennas of individual RF channels. If the A value is equal to "1", the signals can be decoded by the MISO scheme. If the A value is higher than "1", the signals can be decoded by the MIMO scheme.

Figure 43:
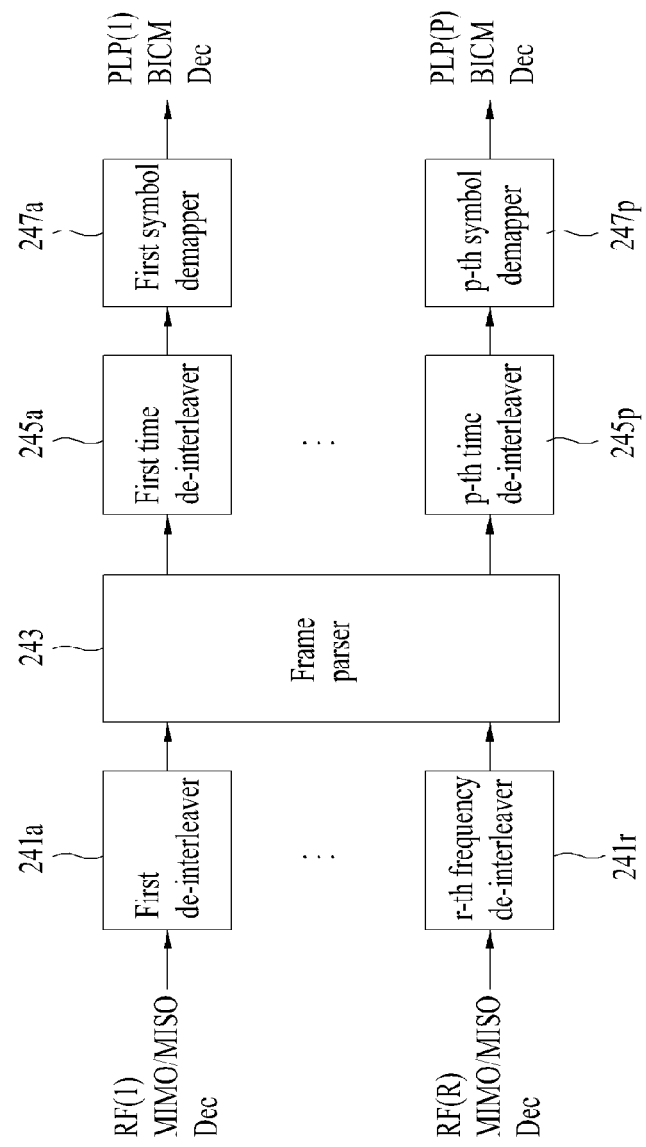
FIG. 43 is a view showing an embodiment of a frame parser.

FIG. 43 is a block diagram illustrating a frame parser according to an embodiment of the present invention. The frame parser includes a first frequency de-interleaver 241a, a r-th frequency de-interleaver 241r, a frame parser 243, a first time de-interleaver 245a, a p-th time de-interleaver 245p, a first symbol demapper 247a, and a p-th symbol demapper. The value of "r" can be decided by the number of RF channels, and the value of "p" can be decided by the number of streams transmitting PLP service data generated from the frame parser 243.

Therefore, if p number of services are transmitted to p number of PLP streams over R number of RF channels, the frame parser includes the r number of frequency de-interleavers, the p number of time de-interleavers, and the p number of symbol demappers.

In association with a first RF channel, the first frequency interleaver 241*a* performs de-interleaving of frequency-domain input data, and outputs the de-interleaving result.

The frame parser 243 parses the TFS signal frame transmitted to several RF channels using scheduling information of the TFS signal frame, and parses PLP service data contained in the slot of a specific RF channel including a desired service. The frame parser 243 parses the TFS signal frame to receive specific service data distributed to several RF channels according to the TFS signal frame structure, and outputs first-path PLP service data.

The first time de-interleaver 245*a* performs de-interleaving of the parsed first-path PLP service data in the time domain. The first symbol demapper 247*a* determines service data mapped to the symbol to be bit data, such that it can output a PLP stream associated with the first-path PLP service data.

Provided that symbol data is converted into bit data, and each symbol data includes symbols based on the hybrid symbol-mapping scheme, the p number of symbol demappers, each of which includes the first symbol demapper, can determine the symbol data to be bit data using different symbol-demapping schemes in individual intervals of the input symbol data.

Figure 44:
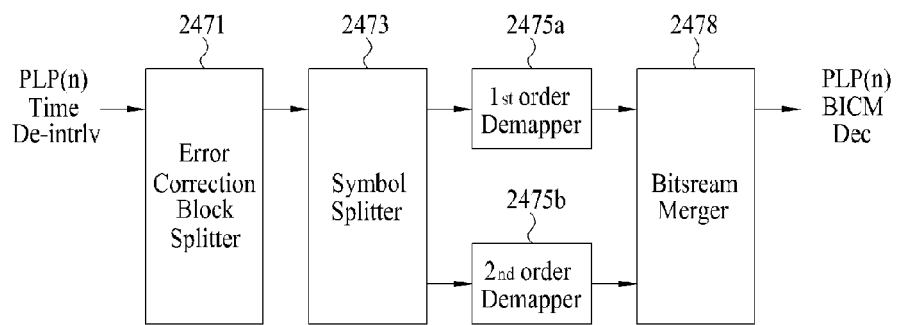
FIG. 44 is a view showing an embodiment of each of symbol demappers 247a and 247p.

FIG. 44 is a view showing an embodiment of each of symbol demappers 247*a* and 247*p*. The symbol demappers receive the streams corresponding to the PLPs from the time interleavers 245*a* and 245*p* respectively corresponding to the symbol demappers.

Each of the symbol demappers 247*a* and 247*p* may include an error correction block splitter 2471, a symbol splitter 2473, a first order demapper 2475*a*, a second order demapper 2475*b* and a bit stream merger 2478.

The error correction block splitter 2471 may split the PLP stream received from the corresponding one of the time interleavers 245*a* and 245*p* in the error correction block units. The error correction block splitter 2471 may split the service stream in the normal mode LDPC block unit. In this case, the service stream may be split in a state in which four blocks according to the short mode (the block having the length of 16200 bits) are treated as the error correction block of one block according to the normal mode (the block having the length of 64800 bits).

The symbol splitter 2473 may split the symbol stream in the split error correction block according to the symbol mapping method of the symbol stream.

For example, the first order demapper 2475*a* converts the symbols according to the higher order symbol mapping method into the bits. The second order demapper 2475*b* converts the symbols according to the lower order symbol mapping method into the bits.

The bit stream merger 2478 may receive the converted bits and output one bit stream.

Figure 45:
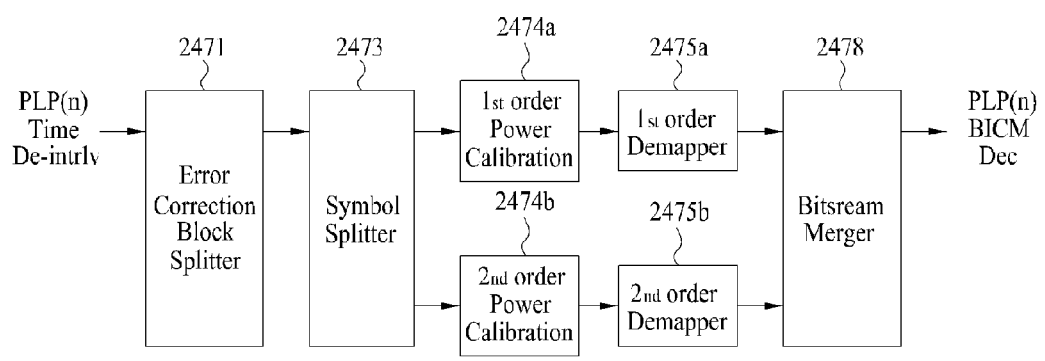
FIG. 45 is a view showing another embodiment of each of the symbol demappers 247a and 247p.

FIG. 45 is a view showing another embodiment of each of the symbol demappers 247*a* and 247*p*. The embodiment of this drawing is similar to the embodiment of FIG. 44 except that a first order power calibration unit 2474*a* and a second order power calibration unit 2474*b* are further included.

The first order power calibration unit 2474*a* receives the symbols split by the symbol splitter 2473, calibrates the power of the received symbols according to the symbol mapping schemes, and outputs the calibrated symbols. The power of the received symbols may have the power calibrated according to the size of the constellation based on the symbol mapping methods. The first order power calibration unit 2474*a* converts the power calibrated in accordance with the into the original symbol power of the constellation. The first order demapper 2475*a* may demap the symbols, of which the power is calibrated by the first order power calibration unit, to the bits.

Similarly, the second order power calibration unit 2474*b* receives the symbols split by the symbol splitter 2473, modified the calibrated power of the received symbols to the original power according to the size of the constellation, and outputs the modified symbols.

Figure 46:
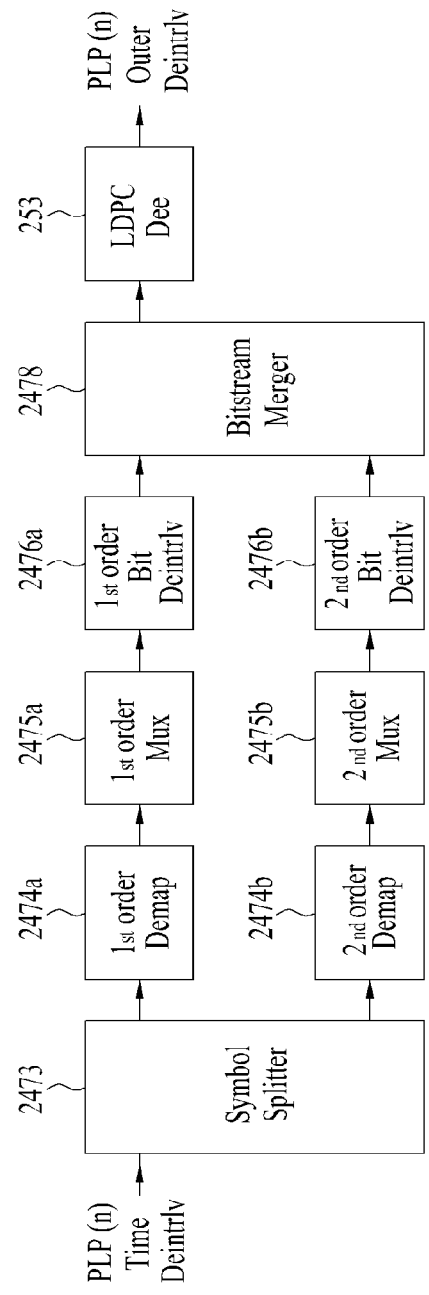
FIG. 46 is a view showing another embodiment of each of the symbol demappers 247a and 247p.

FIG. 46 is a view showing another embodiment of each of the symbol demappers 247*a* and 247*p*. Each of the symbol demappers 247*a* and 247*p* may include a symbol splitter 2473, a first order demapper 2474*a*, a second order demapper 2474*b*, a first order mux 2475*a*, a second order mux 2475*b*, a first order bit deinterleaver 2476*a*, a second order bit deinterleaver 2476*b* and a bit stream merger 2478. By this embodiment, the embodiment of the decoding and demodulation unit of FIG. 36 includes a first decoder 253, a first deinterleaver 255 and a second decoder 257.

The symbol splitter 2473 may split the symbol stream of the PLP according to the method corresponding to the symbol mapping method.

The first order demapper 2474*a* and the second order demapper 2474*b* convert the split symbol streams into bits. For example, the first order demapper 2474*a* performs the symbol demapping of the higher order QAM and the second order demapper 2474*b* performs the symbol demapping of the lower order QAM. For example, the first order demapper 2474*a* may perform the symbol demapping of 256QAM and the second order demapper 2474*b* may perform the symbol demapping of 64QAM.

The first order mux 2475*a* and the second order mux 2475*b* multiplex the symbol-mapped bits. The multiplexing methods may correspond to the demultiplexing methods described with reference to FIGS. 15 to 18. Accordingly, the demultiplexed sub streams may be converted into one bit stream.

The first order bit deinterleaver 2476*a* deinterleaves the bit streams multiplexed by the first order mux 2475*a*. The second order bit deinterleaver 2476*b* deinterleaves the bits multiplexed by the first order mux 2475*a*. The deinterleaving method corresponds to the bit interleaving method. The bit interleaving method is shown in FIG. 12.

The bit stream merger 2478 may merge the bit streams deinterleaved by the bit interleavers 2476*a* and 2476*b* to one bit stream.

The first decoder 253 of the decoding and demodulation unit may error correction decode the output bit stream according to the normal mode or the short mode and the code rate according to the modes.

Figure 47:
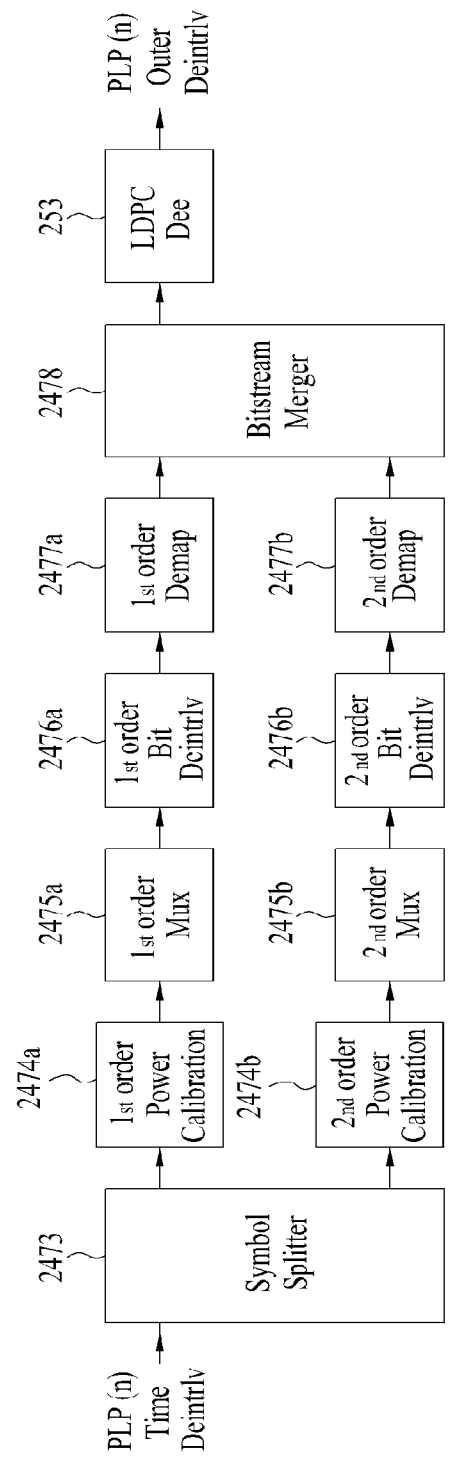
FIG. 47 is a view showing another embodiment of each of the symbol demappers 247a and 247p.

FIG. 47 is a view showing another embodiment of each of the symbol demappers 247*a* and 247*p*. The embodiment of this drawing is similar to the embodiment of FIG. 46 except that a first order power calibration unit 2474*a* and a second order power calibration unit 2474*b* are further included. The first order power calibration unit 2474*a* and the second order power calibration unit 2474*b* modify the calibrated powers of the symbols according to the symbol mapping methods and output the modified symbols to the symbol demappers 2475*a* and 2475*b*.

Figure 48:
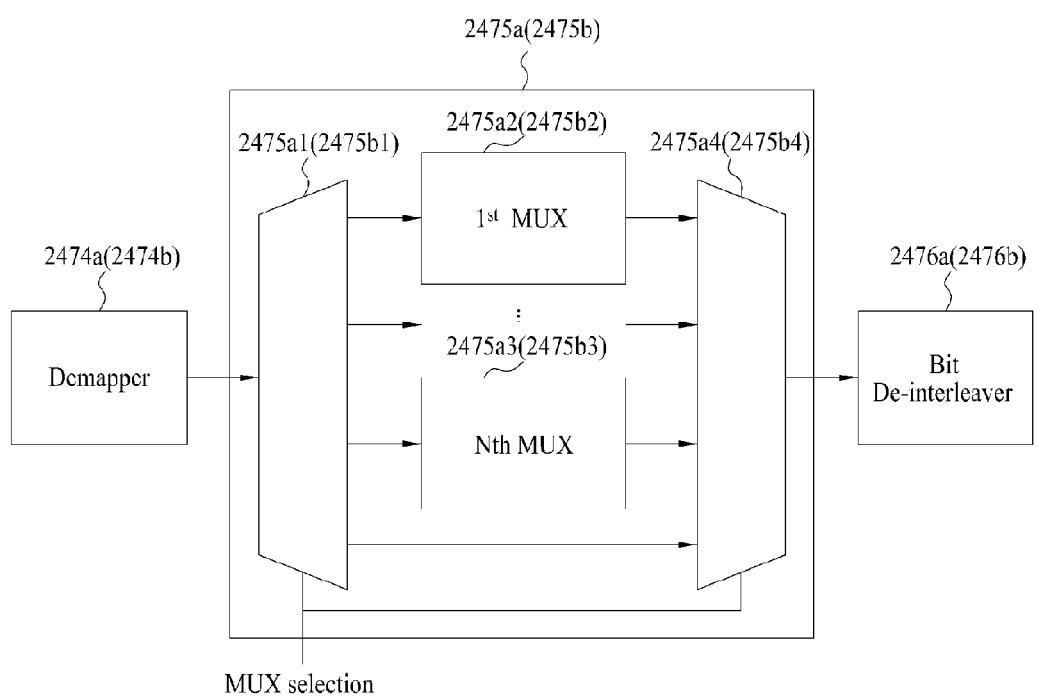
FIG. 48 is a view showing an embodiment of multiplexing a demultiplexed sub stream.

FIG. 48 is a view showing an embodiment of multiplexing the demultiplexed sub stream. In this embodiment, the demappers 2474*a* and 2474*b* decide the cell words including the bits. The muxs 2475*a* and 2475*b* multiplex the decided cell words according to the mux selection signal. The demultiplexed cell words are input to any one of first muxs 2475a2 and 2475b2 to nth muxs 2475a3 and 2475b3.

The first muxs 2475a2 and 2475b2 to the nth muxs 2475a3 and 2475b3 change the order of the bits in the cell words input according to the mux selection signal. The mux selection signal may be changed according to the code rate of the error correction coding or the symbol mapping method. In order to generate one stream and the bit streams delivered to the muxs, the order of selecting the sub stream may be changed according to the mux selection signal.

The first demuxs 2475a1 and 2475b1 output the symbol-demapped bit streams to any one of the first muxs 2475a2 and 2475b2 to the nth muxs 2475a3 and 2475b3 according to the mux selection signal. The first sub muxs 2475a1 and 2475b1 may receive the sub streams multiplexed by the first muxs 2475a2 and 2475b2 to the nth muxs 2475a3 and 2475b3 and output one stream, according to the mux selection signal.

The cell words including the changed bits are input to the bit interleavers 2476a and 2476b, and the bit deinterleavers 2476a and 2476b deinterleave the input bits and output the deinterleaved bits.

Figure 49:
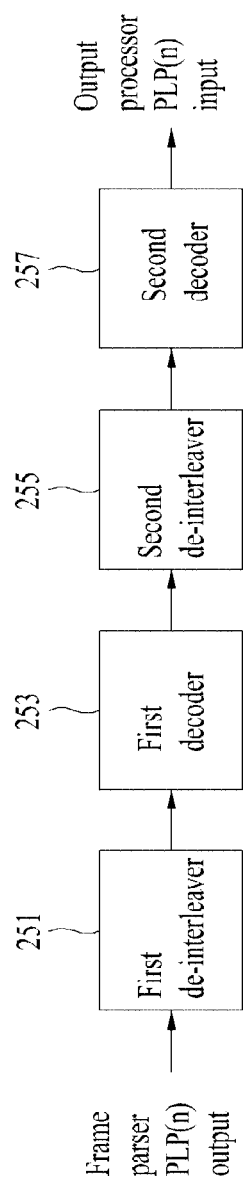
FIG. 49 is a view showing an example of a decoding and demodulation unit.

FIG. 49 is a block diagram illustrating a decoding demodulator according to an embodiment of the present invention. The decoding demodulator may include several function blocks corresponding to the coding and modulation unit. In this embodiment, the decoding demodulator of FIG. 16 may include a first de-interleaver 251, a first decoder 253, a second de-interleaver 255, and a second decoder 257. The second de-interleaver 255 can be selectively contained in the decoding demodulator.

The first de-interleaver 251 acts as an inner de-interleaver, and is able to perform de-interleaving of the p-th PLP stream generated from the frame parser.

The first decoder 253 acts as an inner decoder, can perform error correction of the de-interleaved data, and can use an error correction decoding algorithm based on the LDPC scheme.

The second de-interleaver 255 acts as an outer interleaver, and can perform de-interleaving of the error-correction-decoded data.

The second decoder 257 acts as an outer decoder. Data de-interleaved by the second de-interleaver 255 or error-corrected by the first decoder 253 is error-corrected again, such that the second decoder 257 outputs the re-error-corrected data. The second decoder 257 decodes data using the error correction decoding algorithm based on the BCH scheme, such that it outputs the decoded data.

The first de-interleaver 251 and the second de-interleaver 255 are able to convert the burst error generated in data contained in the PLP stream into a random error. The first decoder 253 and the second decoder 257 can correct errors contained in data.

The decoding demodulator shows operation processes associated with a single PLP stream. If the p number of streams exist, the p number of decoding demodulators are needed, or the decoding demodulator may repeatedly decode input data p times.

Figure 50:
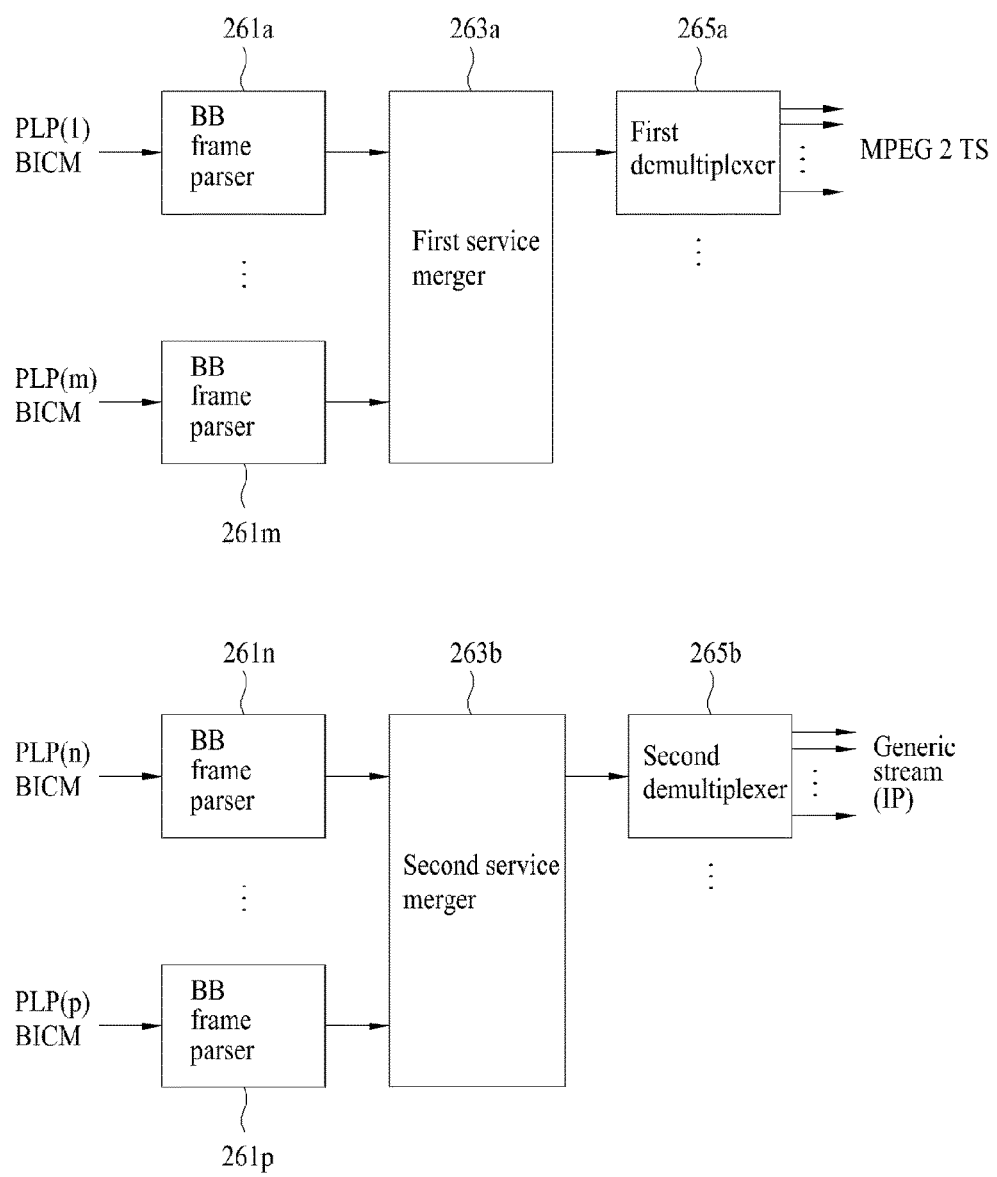
FIG. 50 is a view showing an embodiment of an output processor.

FIG. 50 is a block diagram illustrating an output processor according to an embodiment of the present invention. The output processor may include p number of baseband (BB) frame parsers (251a, . . . , 261p), a first service merger 263a, a second service merger 263b, a first demultiplexer 265a, and a second demultiplexer 265b.

The BB frame parsers (261a, . . . , 261p) remove BB frame headers from the first to p-th PLP streams according to the received PLP paths, and output the removed result.

This embodiment shows that service data is transmitted to at least two streams. A first stream is an MPEG-2 TS stream, and a second stream is a GS stream.

The first service merger 263a calculates the sum of service data contained in payload of at least one BB frame, such that it outputs the sum of service data as a single service stream. The first demultiplexer 255a may demultiplex the service stream, and output the demultiplexed result.

In this way, the second service merger 263b calculates the sum of service data contained in payload of at least one BB frame, such that it can output another service stream. The second demultiplexer 255b may demultiplex the GS-format service stream, and output the demultiplexed service stream.

Figure 51:
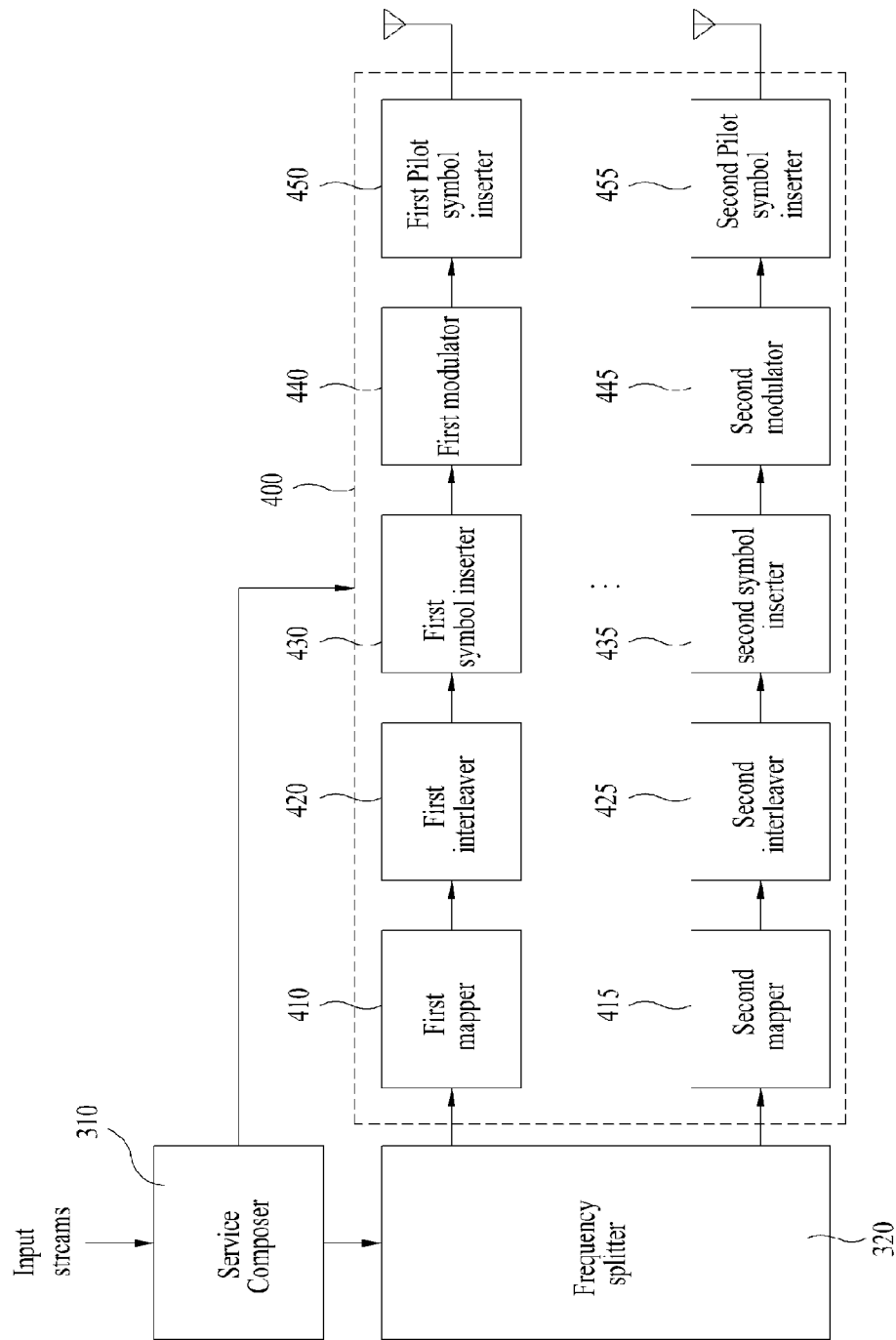
FIG. 51 is a view showing another embodiment of a signal transmitting apparatus for transmitting a signal frame.

FIG. 51 is a block diagram illustrating an apparatus for transmitting a signal according to another embodiment of the present invention. The signal transmission apparatus includes a service composer 310, a frequency splitter 320, and a transmitter 400. The transmitter 400 encodes or modulates a signal including a service stream to be transmitted to each RF band.

The service composer 310 receives several service streams, multiplexes several service streams to be transmitted to individual RF channels, and outputs the multiplexed service streams. The service composer 310 outputs scheduling information, such that it controls the transmitter 400 using the scheduling information, when the transmitter 400 transmits the PLP via several RF channels. By this scheduling information, the service composer 310 modulates several service frames to be transmitted to the several RF channels by the transmitter 400, and transmits the modulated service frames.

The frequency splitter 320 receives a service stream to be transmitted to each RF band, and splits each service stream into several sub-streams, such that the individual RF frequency bands can be allocated to the sub-streams.

The transmitter 400 processes the service streams to be transmitted to individual frequency hands, and outputs the processed resultant streams. For example, in association with a specific service stream to be transmitted to the first RF channel, the first mapper 410 maps the input service stream data into symbols. The first interleaver 420 interleaves the mapped symbols to prevent the burst error.

The first symbol inserter 430 can insert a signal frame equipped with a pilot signal (e.g., a scatter pilot signal or a continual pilot signal) into the modulated signal.

The first modulator 440 modulates the data interleaved by the signal modulation scheme. For example, the first modulator 440 can modulate signals using the OFDM scheme.

The first pilot symbol inserter 450 inserts the first pilot signal and the second pilot signal in the signal frame, and is able to transmit the TFS signal frame.

Service stream data transmitted to the second RF channel is transmitted to the TFS signal frame via several blocks 415, 425, 435, 445, and 455 of different paths shown in the transmitter of FIG. 18.

The number of signal processing paths transmitted from the transmitter 400 may be equal to the number of RF channels contained in the TFS signal frame.

The first mapper 410 and the second mapper may respectively include the demultiplexers 1313a and 1313b, and allow the locations of the MSB and the LSB to be changed in the symbol-mapped cell word.

Figure 52:
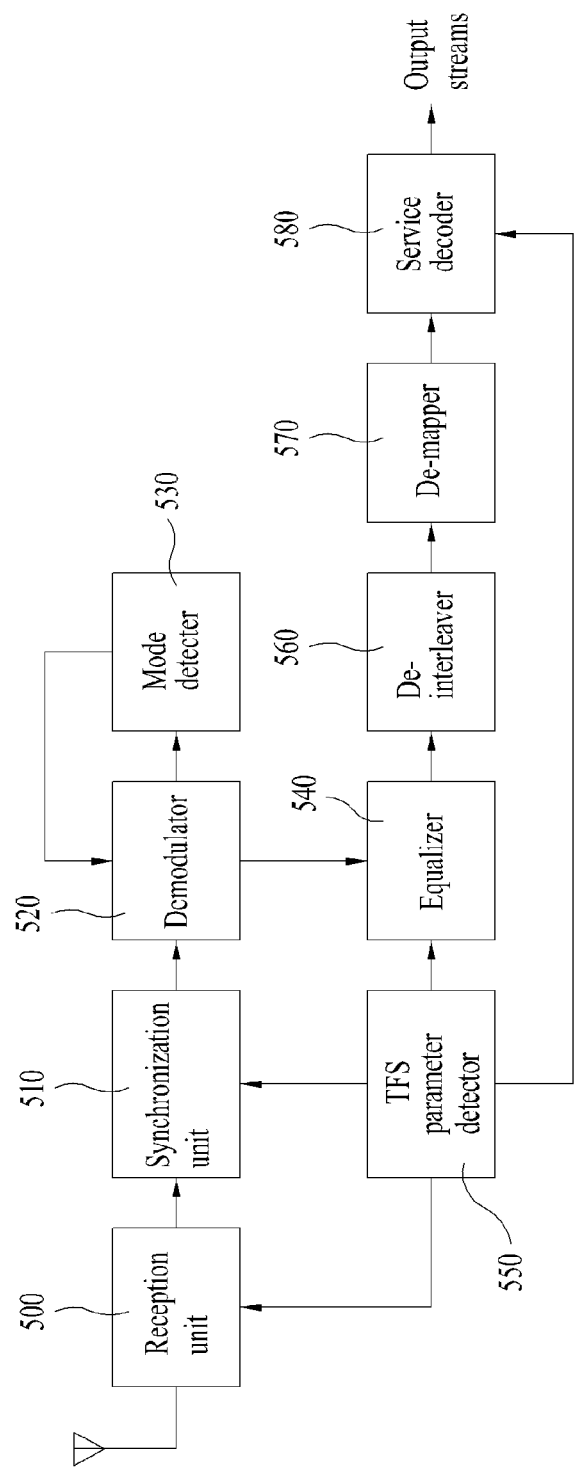
FIG. 52 is a view showing another embodiment of a signal receiving apparatus for receiving a signal frame.

FIG. 52 is a block diagram illustrating an apparatus for receiving a signal according to another embodiment of the present invention. The signal reception apparatus may include a reception unit 510, a synchronization unit 520, a mode detector 530, an equalizer 540, a parameter detector 550, a de-interleaver 560, a demapper 570, and a service decoder 580.

The reception unit 500 is able to receive signals of a first RF channel selected by a user from among the signal frame. If the signal frame includes several RF channels, the reception unit 500 performs hopping of the several RF channels, and at the same time can receive a signal including the selected service frame.

The synchronization unit 510 acquires synchronization of a reception signal, and outputs the synchronized reception signal. The demodulator 520 is able to demodulate the synchronization-acquired signal. The mode detector 530 can acquire a FFT mode (e.g., 2 k, 4 k, 8 k FFT operation length) of the second pilot signal using the first pilot signal of the signal frame.

The demodulator 520 demodulates the reception signal under the FFT mode of the second pilot signal. The equalizer 540 performs channel estimation of the reception signal, and outputs the channel-estimation resultant signal. The de-interleaver 560 deinterleaves the channel-equalized reception signal. The demapper 570 demaps the interleaved symbol using the symbol demapping scheme corresponding to the transmission-signal symbol mapping scheme (e.g., QAM).

The parameter detector 550 acquires physical parameter information (e.g., Layer-1 (L1) information) contained in the second pilot signal from the output signal of the equalizer 540, and transmits the acquired physical parameter information to the reception unit 500 and the synchronization unit 510. The reception unit 500 is able to change the RF channel to another channel using network information detected by the parameter detector 550.

The parameter detector 550 outputs service-associated information, service decider 580 decodes service data of the reception signal according to the service-associated information from the parameter detector 550, and outputs the decoded service data.

The demapper 570 may include the muxs 2475a and 2475b and output the bit stream obtained by restoring the order of the bits of which the locations of the MSB and the LSB are changed according to the code rate of the error correction coding and the symbol mapping method.

Hereinafter, a method for modulating a first pilot signal of a signal frame having at least one RF band and a method and apparatus for receiving the modulated first pilot signal will be described.
signal will be described.

The time-interleaved PLP symbols are transmitted via regions, which are temporally divided in the signal frame. The time-interleaved PLP symbols may be transmitted via regions, which are divided in the frequency domain, if a plurality of RF bands exists. Accordingly, if the PLP is transmitted or received, a diversity gain can be obtained. An error correction mode and a symbol mapping method may be changed according to services corresponding to transport streams or may be changed in the service.

A first pilot signal and a second pilot signal are arranged at the start location of the signal frame having such characteristics, as a preamble signal.

As described above, the first pilot signal included in the signal frame may include an identifier for identifying the signal frame having the above-described structure. The first pilot signal may include information about the transmission structure indicating whether or not the signal frame is transmitted via multiple paths and information about an FIT mode of a signal following the first pilot signal. The receiver can detect the signal frame from the first pilot signal and obtain the information about the integral carrier frequency offset estimation and information about the FFT mode of the data symbol.

Figure 53:
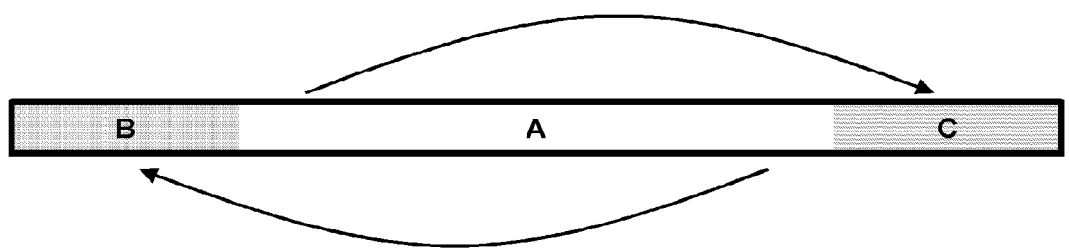
FIG. 53 is a view showing an embodiment of the structure of a first pilot signal.

FIG. 53 is a view showing an embodiment of the structure of a first pilot signal. A portion denoted by A is a valid portion of the first pilot signal. B denotes the same cyclic prefix as a first portion of the portion A in the time domain and C denotes the same cyclic suffix as a second portion of the portion A in the time region. The first portion may be duplicated from the second half of the portion A and the second portion may be duplicated from the first half of the portion A.

B and C can be respectively obtained by duplicating the first portion and the second portion and frequency shifting the duplicated portions. A relationship between B or C and A is as follows.

$$B = \text{one part}(A) \cdot e^{j2\pi f S H t}$$

$$C = \text{another part}(A) \cdot e^{j2\pi f S H t} \quad \text{[Equation 1]}$$

In the above equation, SR denotes a shift unit of the frequency shift. Accordingly, the frequency shift values of the portions B and C may be inversely proportional to the lengths of the portions B and C.

If the first pilot signal is configured by frequency shifting the cyclic prefix (B) and the cyclic suffix (C), the probability that the data symbol is erroneously detected to the reduced, although the data symbols configuring the PLP and the symbols configuring the preamble are modulated in the same FFT mode.

If continuous wave (CW) interference is included like an analog TV signal, the probability that the preamble is erroneously detected due to a noise DC component generated in a correlation process, is reduced. In addition, if the size of the FFT applied to the data symbols configuring the PLP is larger than that of the FFT applied to the preamble, preamble detection performance can be improved even in a delay spread channel having a length equal to or greater than that of the valid symbol portion A of the preamble. Since both the cyclic prefix (B) and the cyclic suffix (C) are used in the preamble, the fractional carrier frequency offset can be estimated by the correlation process.

Figure 54:
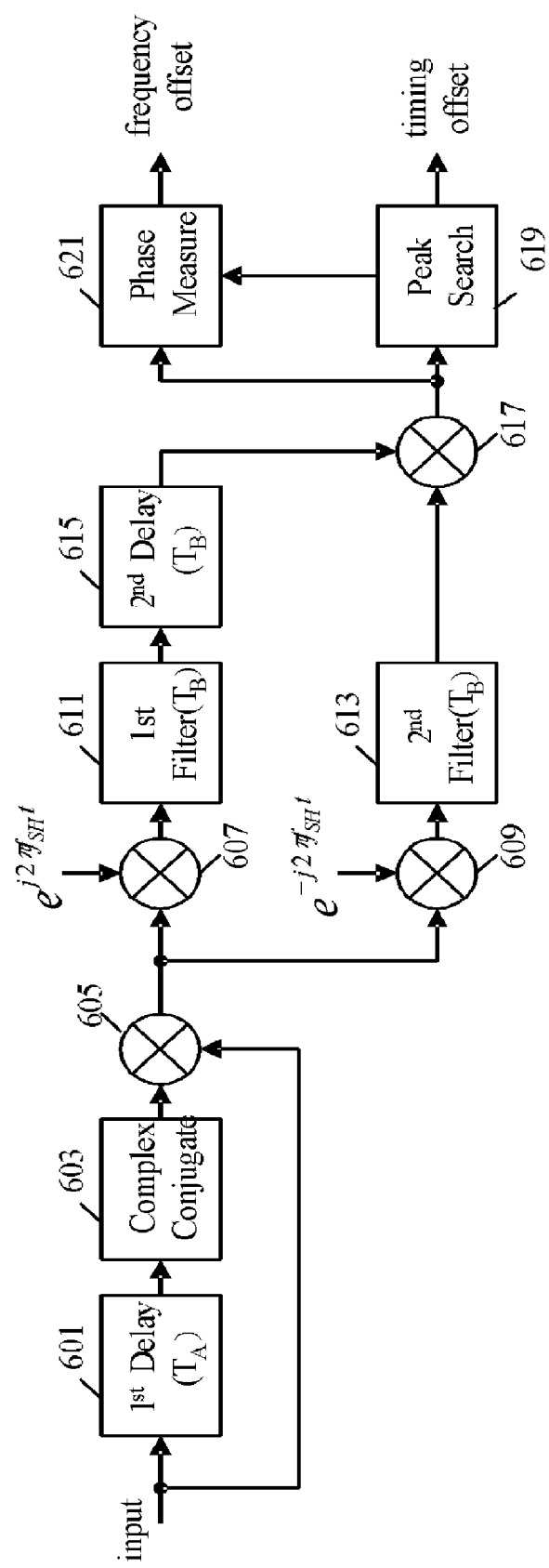
FIG. 54 is a view showing an embodiment of detecting a preamble signal shown in FIG. 53 and estimating a timing offset and a frequency offset.

FIG. 54 is a view showing an embodiment of detecting a preamble signal shown in FIG. 53 and estimating a timing offset and a frequency offset. This embodiment may be included in the frame detector 221 or the frame synchronization unit 222.

This embodiment may include a first delay unit 601, a complex conjugate calculation unit 603, a first multiplier 605, a second multiplier 607, a first filter 611, a second delay unit 615, a third multiplier 609, a second filter 613, a fourth multiplier 617, a peak search unit 619, and a phase measurement unit 621.

The first delay unit 601 may delay a received signal. For example, the first delay unit 601 may delay the received signal by the length of the valid symbol portion (A) of the first pilot signal.

The complex conjugate calculation unit 603 may calculate the complex conjugate of the delayed first pilot signal and output the calculated signal.

The first multiplier 605 may multiply the signal output from the complex conjugate calculation unit 603 by the received signal and output the multiplied signal.

Since the first pilot signal includes the portions B and C obtained by frequency-shifting the valid portion A, the respective correlation values are obtained by shifting the received signals by the respective frequency shift amounts. In the first pilot signal, the portion B is a portion which is frequency-shifted up or frequency-shifted down from the portion A, and C is a portion which is frequency-shifted up or frequency-shifted down from the portion A.

For example, if the output of the complex conjugate calculation unit 603 is used, the output of the first multiplier 605 may include the correlation result of B (or the complex conjugate of B) and A (or the complex conjugate of A).

The second multiplier 607 may multiply the signal output from the first multiplier 605 by the frequency shift amount (denoted by ejfSHt) applied to the portion B and output the multiplied signal.

The first filter 611 performs a moving average during a predetermined period with respect to the signal output from the second multiplier 607. The moving average portion may be the length of the cyclic prefix (B) or the length of the cyclic suffix (C). In this embodiment, the first filter 611 may calculate an average of the signal included in the length of the portion B. Then, in the result output from the first filter 611, the correlation value of the portions A and C included in the portion, of which the average is calculated, substantially becomes zero and the correlation result of the portions B and A remains. Since the signal of the portion B is multiplied by the frequency shift value by the second multiplier 607, it is equal to the signal obtained by duplicating the second half of the portion A.

The third multiplier 609 may multiply the signal output from the first multiplier 605 by the frequency shift amount (denoted by −ejfSHt) applied to the portion C and output the multiplied signal.

The second filter 613 performs a moving average during a predetermined period with respect to the signal output from the third multiplier 609. The moving average portion may become the length of the cyclic prefix (B) or the length of the cyclic suffix (C). In this embodiment, the second filter 613 may calculate the average of the signal included in the length of the portion C. Then, in the result output from the second filter 613, the correlation value of the portions A and B included in the portion, of which the average is calculated, substantially becomes zero and the correlation result of the portions C and A remains. Since the signal of the portion C is multiplied by the frequency shift value by the third multiplier 609, it is equal to the signal obtained by duplicating the first half of the portion A.

The length TB of the portion of which the moving average is performed by the first filter 611 and the second filter 613 is expressed as follows.

$$T_B = k/f_{SH},\qquad\text{[Equation 2]}$$

where, k denotes an integer. In other words, the unit fSH of the frequency shift used in the portions B and C may be decided by k/TB.

The second delay unit 615 may delay the signal output from the first filter 611. For example, the second delay unit 615 delays the signal filtered by the first filter 611 by the length of the portion B and outputs the delayed signal.

The fourth multiplier 617 multiplies the signal delayed by the second delay unit 615 by the signal filtered by the second filter 613 and outputs the multiplied signal.

The peak search unit 619 searches for the location where a peak value is generated The peak search unit 619 searches for the location where a peak value is generated from the multiplied signal output from the fourth multiplier 617 and outputs the searched location to the phase measurement unit 621. The peak value and the location may be used for the timing offset estimation.

The phase measurement unit 621 may, measure the changed phase using the peak value and the location output from the peak search unit 619 and output the measured phase. The phase value may be used for the fractional carrier frequency offset estimation.

Meanwhile, an oscillator for generating the frequency used for performing the frequency shift by the second multiplier 607 and the third multiplier 609 may generate any phase error.

Even in this case, the fourth multiplier 617 can eliminate the phase error of the oscillator. The results output from the first filter 611 and the second filter 613 and the result output from the fourth multiplier 617 may be expressed by the following equation.

$$y_{MAF1} = \|a_1(n)\|^2 \cdot e^{j2\pi\Delta f + \theta}$$

$$y_{MAF2} = \|a_2(n)\|^2 \cdot e^{j2\pi\Delta f - \theta}$$

$$y_{prod} = \|a_1(n)\|^2 \|a_2(n)\|^2 \cdot e^{j2\pi\Delta f} \qquad\text{[Equation 3]}$$

where, yMAF1 and yMAF2 respectively denote the outputs of the first filter 611 and the second filter 613, and yProd denotes the output of the fourth multiplier 617. In addition, a1 and a2 respectively denote the levels of the correlation results and f and respectively denote the frequency offset and the phase error of the oscillator.

Accordingly, yMAF1 and yMAF2 may include the phase errors of the oscillator having different signs, but the phase error of the oscillator is eliminated in the result of the fourth multiplier 617. Accordingly, the frequency offset f can be estimated regardless of the phase error of the oscillator of the signal receiving apparatus.

The estimated frequency offset may be expressed by the following equation.

$$f_B = \angle y_{prod}/4\pi \qquad\text{[Equation 4]}$$

where, the estimated frequency offset f is 0<=f<0.5.

Figure 55:
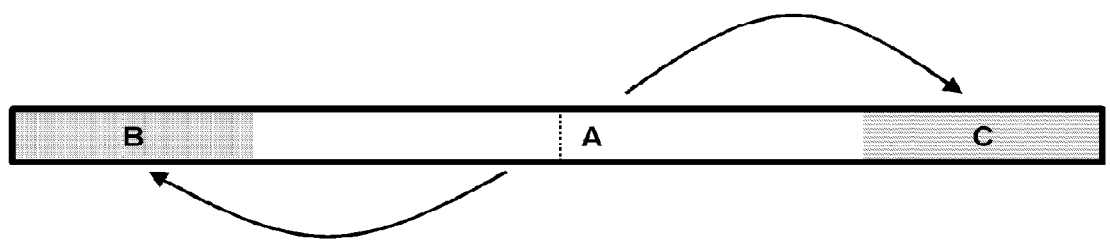
FIG. 55 is a view showing another embodiment of the structure of the first pilot signal.

FIG. 55 is a view showing another embodiment of the structure of the first pilot signal. In the first pilot signal, the frequency shift of the first half of the valid portion A is the cyclic suffix (C). The lengths of the valid portion A for generating the portions B and C may be, for example, ½ of the length of the portion A, and the lengths of B and C may be different.

Figure 56:
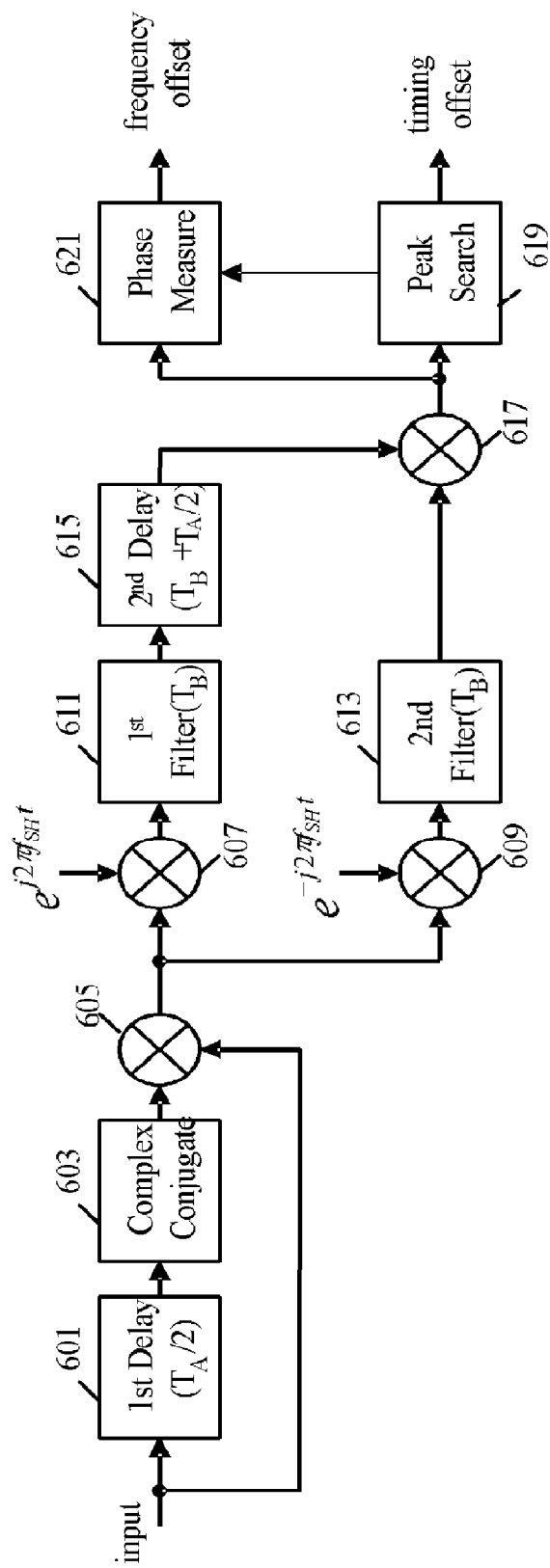
FIG. 56 is a view showing an embodiment of detecting the first pilot signal shown in FIG. 55 and measuring a timing offset and a frequency offset.

FIG. 56 is a view showing an embodiment of detecting the first pilot signal shown in FIG. 55 and measuring a timing offset and a frequency offset using the detected result. In this embodiment, for convenience of description, B and C respectively denote the cyclic prefix and the cyclic suffix obtained by frequency-shifting ½ of the length of the portion A.

This embodiment includes a first delay unit 601, a complex conjugate calculation unit 603, a first multiplier 605, a second multiplier 607, a first filter 611, a second delay unit 615, a third multiplier 609, a second filter 613, a fourth multiplier 617, a peak search unit 619, and a phase measurement unit 621. That is, this embodiment is equal to the embodiment of FIG. 54, but the features of the components may be changed according to the length of the portion A by which the portions B and C are generated. B denotes a portion frequency-shifted down from the portion A, and C denotes a portion frequency-shifted up from the portion A.

The first delay unit 601 may delay a received signal. For example, the first delay unit 601 may delay the received signal by ½ of the length of the valid symbol portion A of the first pilot signal.

The complex conjugate calculation unit 603 may calculate the complex conjugate of the delayed first pilot signal and output the calculated signal.

The first multiplier 605 may multiply the signal output from the complex conjugate calculation unit 603 by the received signal and output the multiplied signal.

The second multiplier 607 may multiply the signal output from the first multiplier 605 by the frequency shift amount (denoted by ejfSHt) applied to the portion B and output the multiplied signal.

The first filter 611 performs a moving average during a predetermined period with respect to the signal output from the second multiplier 607. The moving average portion may be the length of the cyclic prefix (B). In this embodiment, the first filter 611 may calculate the average of the signal included in the length of the portion B. Then, in the result output from the first filter 611, the correlation value of the portions A and C included in the portion, of which the average is calculated, substantially becomes zero and the correlation result of the portions B and A remains. Since the signal of the portion B is multiplied by the frequency shift value by the second multiplier 607, it is equal to the signal obtained by duplicating the second half of the portion A.

The third multiplier 609 may multiply the signal output from the first multiplier 605

The third multiplier 609 may multiply the signal output from the first multiplier 605 by the frequency shift amount (denoted by −ejfSHt) applied to the portion C and output the multiplied signal.

The second filter 613 performs a moving average during a predetermined period with respect to the signal output from the third multiplier 609. The moving average portion may be the length of the cyclic suffix (C). In this embodiment, the second filter 613 may calculate the average of the signal included in the length of the portion C. Then, in the result output from the second filter 613, the correlation value of A and B included in the portion, of which the average is calculated, substantially becomes zero and the correlation result of the portions C and A remains. Since the signal of the portion C is multiplied by the frequency shift value by the third multiplier 609, it is equal to the signal obtained by duplicating the first half of the portion A.

The second delay unit 615 may delay the signal output from the first filter 611. For example, the second delay unit 615 delays the signal filtered by the first filter 611 by the length of the portion B+½A and outputs the delayed signal.

The fourth multiplier 617 multiplies the signal delayed by the second delay unit 615 by the signal filtered by the second filter 613 and outputs the multiplied signal.

The peak search unit 619 searches for the location where a peak value is generated from the multiplied signal output from the fourth multiplier 617 and outputs the searched location to the phase measurement unit 621. The peak value and the location may be used for the timing offset estimation.

The phase measurement unit 621 may measure the changed phase using the peak value and the location output from the peak search unit 619 and output the measured phase. The phase value may be used for the fractional carrier frequency offset estimation.

As described above, an oscillator for generating the frequency used for performing the frequency shift by the second multiplier 607 and the third multiplier 609 may generate any phase error. However, even in this embodiment, the fourth multiplier 617 can eliminate the phase error of the oscillator.

The results output from the first filter 611 and the second filter 613 and the result output from the fourth multiplier 617 may be expressed by the following equation.

$$y_{MAF1} = \|a_1(n)\|^2 \cdot e^{j2\pi\Delta f + \theta}$$

$$y_{MAF2} = \|a_2(n)\|^2 \cdot e^{j2\pi\Delta f - \theta}$$

$$y_{prod} = \|a_1(n)\|^2 \|a_2(n)\|^2 \cdot e^{j2\pi 2\Delta f} \quad \text{[Equation 5]}$$

where, yMAF1 and yMAF2 respectively denote the outputs of the first filter 611 and the second filter 613, and yProd denotes the output of the fourth multiplier 617. In addition, a1 and a2 respectively denote the levels of the correlation results and f and respectively denote the frequency offset and the phase error of the oscillator.

Accordingly, yMAF1 and yMAF2 may include the phase errors of the oscillator having different signs, but the phase error of the oscillator is eliminated in the result of the fourth multiplier 617. Accordingly, the frequency offset f can be estimated regardless of the phase error of the oscillator of the signal receiving apparatus.

The estimated frequency offset may be expressed by the following equation.

$$f_B = \angle y_{prod}/2\pi \quad \text{[Equation 6]}$$

where, the estimated frequency offset f is $0 \leq f < 1$.

That is, phase aliasing may be generated in a range of $0.5 \leq f < 1$ in the frequency offset estimated in [Equation 4], but phase aliasing is not generated in the frequency offset estimated in [Equation 6]. Accordingly, the frequency offset can be more accurately measured. The structure of the first pilot signal may be used in the data symbol and the second frequency signal. If such a structure is used, offset estimation performance such as CW interference can be improved and the reception performance of the receiver can be improved.

Figure 57:
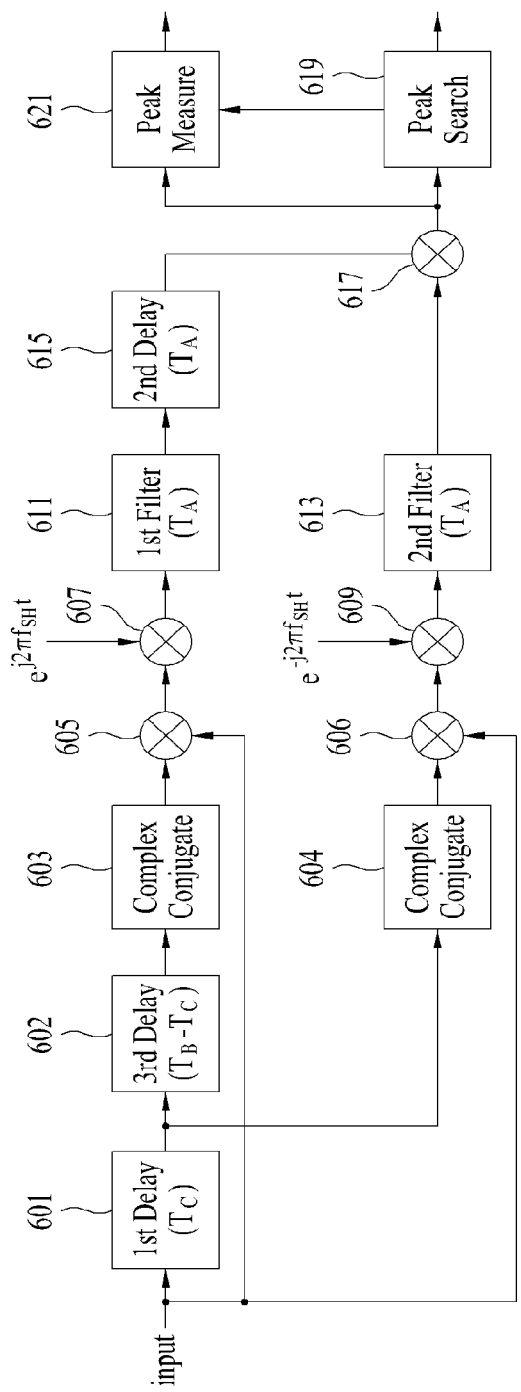
FIG. 57 is a view showing an embodiment of detecting the first pilot signal and measuring a timing offset and a frequency offset using the detected result.

FIG. 57 is a view showing an embodiment of detecting the first pilot signal and measuring a timing offset and a frequency offset using the detected result.

This embodiment includes a first delay unit 601, a third delay unit 602, a first complex conjugate calculation unit 603, a second complex conjugate calculation unit 604, a first multiplier 605, a fifth multiplier 606, a second multiplier 607, a first filter 611, a second delay unit 615, a third multiplier 609, a second filter 613, a fourth multiplier 617, a peak search unit 619, and a phase measurement unit 621.

In this embodiment, the first delay unit 601 may delay a received signal. For example, the first delay unit 601 may delay the received signal by the length of the cyclic suffix.

The third delay unit 602 may delay the signal delayed by the first delay unit 601. For example, the third delay unit 602 further delays the signal by a difference between the length of the cyclic prefix and the length of the cyclic suffix.

The first complex conjugate calculation unit 603 may calculate the complex conjugate of the signal delayed by the third delay unit 602 and output the calculated signal. The second complex conjugate calculation unit 604 may calculate the complex conjugate of the signal delayed by the first delay unit 601 and output the calculated signal.

The first multiplier 605 may multiply the signal output from the first complex conjugate calculation unit 603 by the received signal and output the multiplied signal. The fifth multiplier 606 may multiply the complex conjugate calculated by the second complex conjugate calculation unit 604 by the received signal and output the multiplied signal.

The second multiplier 607 may multiply the signal output from the first multiplier 605 by the frequency shift amount (denoted by ejfSHt) applied to the portion B and output the multiplied signal.

The first filter 611 performs a moving average during a predetermined period with respect to the signal output from the second multiplier 607. The moving average portion may become the length of the valid portion (A) of the first pilot signal.

The third multiplier 609 may multiply the signal output from the second multiplier 604 by the frequency shift amount (denoted by −ejfSHt) applied to the portion C and output the multiplied signal.

The second filter 613 performs a moving average during a predetermined period with respect to the signal output from the third multiplier 609. The moving average portion may become the length of the valid portion A of the first pilot signal.

The second delay unit 615 may delay the signal output from the first filter 611. For example, the second delay unit 615 delays the signal filtered by the first filter 611 by the length of the valid portion (A) of the first pilot signal and outputs the delayed signal.

The fourth multiplier 617 multiplies the signal delayed by the second delay unit 615 by the signal filtered by the second filter 613 and outputs the multiplied signal. The fourth multiplier 617 may eliminate the phase error of the oscillator.

The operations of the peak search unit 619 and the phase measurement unit 621 are equal to those of the above-described embodiment. The peak search unit 619 searches for the location where a peak value is generated from the multiplied signal output from the fourth multiplier 617 and outputs the searched location to the phase measurement unit 621. The peak value and the location may be used for the timing offset estimation.

Figure 58:
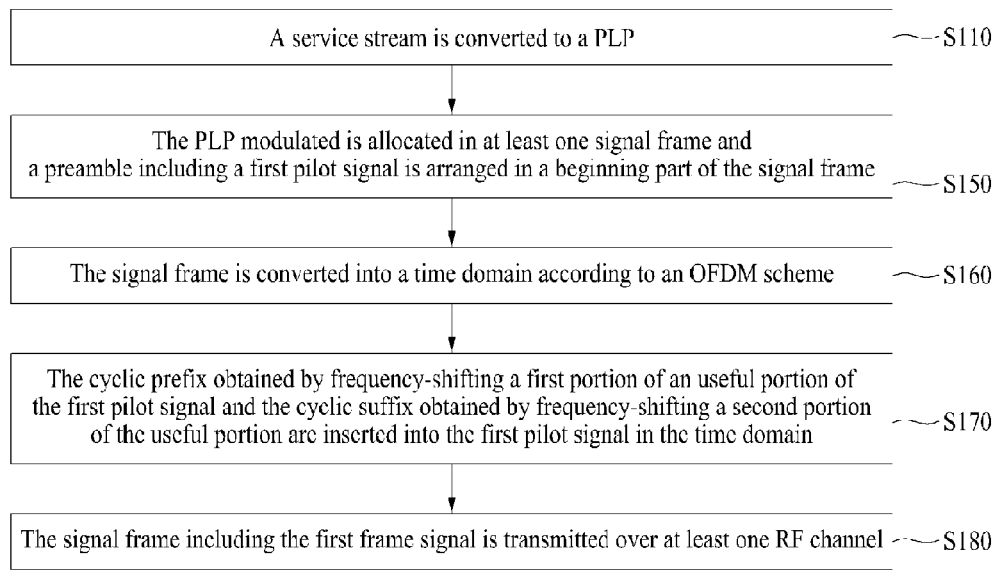
FIG. 58 is a view showing an embodiment of a method of transmitting a signal.

FIG. 58 is a view showing an embodiment of a method of transmitting a signal.

A transport stream transferring a service is error-correction-coded (S110). An error correction coding scheme may be changed according to the transport streams.

An LDPC error correction coding scheme may be used as the error correction coding scheme and the error correction coding may be performed at various code rates. The bits which are error-correction-coded according to a specific error correction code rate may be included in an error correction coded block according to the error correction coding mode. If the error correction coding scheme is the LDPC, a normal mode (64800 bits) and a short mode (16200 bits) may be used.

The error-correction-coded transport stream is interleaved (S120). The interleaving may be performed by differentiating the directions for writing and reading the bits included in the error correction coded block in and from a memory. The number of rows and the number of columns of the memory may be changed according to the error correction coding mode. The interleaving may be performed in the unit of the error correction coded blocks.

The interleaved bits are mapped to symbols (S130). A symbol mapping method may be changed according to transport streams or in the transport stream. For example, as the symbol mapping method, a higher order symbol mapping method and a lower order symbol mapping method may be used. When the symbols are mapped, the interleaved bit stream may be demultiplexed according to the symbol mapping method or the code rate of the error correction code, and the symbols may be mapped using the bits included in the demultiplexed sub streams. Then, the sequence of the bits in the cell word mapped to the symbols may be changed.

The mapped symbols are interleaved (S140). The mapped symbols may be interleaved in the unit of error correction coded blocks. Time interleavers 132*a* and 132*b* may interleave the symbols in the unit of error correction coded blocks. That is, the transport stream is interleaved again in the symbol level.

The interleaved symbols of the transport stream are split, the split symbols are allocated to a signal frame having at least one frequency band and including slots which are temporally split in the frequency bands, and a preamble including a first pilot signal and a second pilot signal is arranged in a start portion of the signal frame (S150). The interleaved symbols of the transport stream may configure the PLP with respect to the transport stream for providing the service. The streams configuring the PLP may be split and allocated to the signal frame. The PLP may be allocated to the signal frame having at least one frequency band. If a plurality of frequency bands is arranged, the symbols configuring the PLP may be arranged in the slots shifted between the frequency bands. The bits included in the service stream may be arranged in the signal frame in the unit of interleaved error correction coded blocks.

The signal frame is converted into a time domain according to an OFDM scheme (S160).

The cyclic prefix obtained by frequency-shifting a first portion of a valid portion of the first pilot signal and the cyclic suffix obtained by frequency-shifting a second portion of the valid portion are inserted into the OFDM symbols including the first pilot signal in the time domain (S170). If the preamble is not inserted in the frequency domain, the preamble including the first pilot signal and the second pilot signal may be inserted in the time domain. The first pilot signal of the time domain may include the valid portion, the cyclic prefix of the first portion of the valid portion and the cyclic suffix of the second portion of the valid portion. The first portion may be a backmost portion or the foremost portion of the valid portion. The second portion may be the foremost portion or the backmost portion of the valid portion.

The signal frame including the first frame signal is transmitted by an RF signal (S180).

Since the valid portion of the first pilot signal includes the frequency-shifted cyclic prefix and cyclic suffix, the signal frame can be clearly identified as the structure of the first pilot signal. The timing offset or the frequency offset may be estimated and compensated for using the structure of the first pilot signal.

Figure 59:
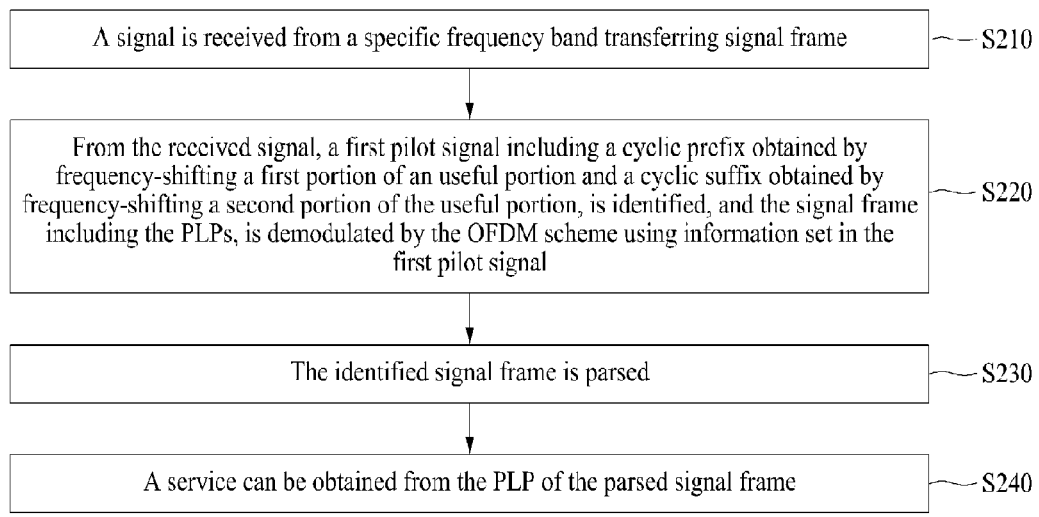
FIG. 59 is a view showing an embodiment of a method of receiving a signal.

FIG. 59 is a view showing an embodiment of a method of receiving a signal.

A signal is received from a specific frequency band included in a signal frame (S210). The signal frame may have at least one frequency band. The signal may be received from a specific frequency band From the received signal, a first pilot signal including a cyclic prefix obtained by frequency-shifting a first portion of a valid portion and a cyclic suffix obtained by frequency-shifting a second portion of the valid portion is identified, and the signal frame in which blocks including the symbols of the transport stream are allocated to a plurality of time-domain slots is demodulated by the OFDM scheme using the first pilot signal (S220). The demodulating process using the first pilot signal will be described in detail later.

The identified signal frame is parsed (S230). The signal frame may include at least one frequency band. In the signal frame, the error correction coded blocks including the symbols, to which the transport stream is mapped, may be allocated to OFDM symbols together with the error correction coded blocks of another transport stream. If the signal frame includes a plurality of frequency bands, the error correction coded blocks may be allocated to the OFDM symbols which are temporally shifted in the plurality of frequency bands.

The symbols, to which the transport stream is mapped, are deinterleaved from the parsed signal frame (S240). The deinterleaving may be performed in the symbol level which the transport stream is mapped to. For example, the time deinterleavers 245a and 245b may deinterleave the error correction coded blocks including the symbols, to which the transport stream is mapped.

Then, the deinterleaved symbols are demapped so as to obtain the transport stream (S250). When the symbols are demapped, a plurality of sub streams obtained by demapping the symbols may be output, the output sub streams may be multiplexed, and the error-correction-coded transport stream may be output. The multiplexing scheme may be changed according to the symbol mapping method and the error correction code rate. The symbol demapping method may be changed in one transport stream or according to transport streams.

The transport stream is deinterleaved and the deinterleaved transport stream is error-correction-coded (S260).

According to an apparatus for transmitting and receiving a signal and a method for transmitting and receiving a signal of an embodiment of the present invention, it is possible to readily detect and restore a transmitted signal. In addition, it is possible to improve the signal transmission/reception performance of the transmitting/receiving system.

Figure 60:
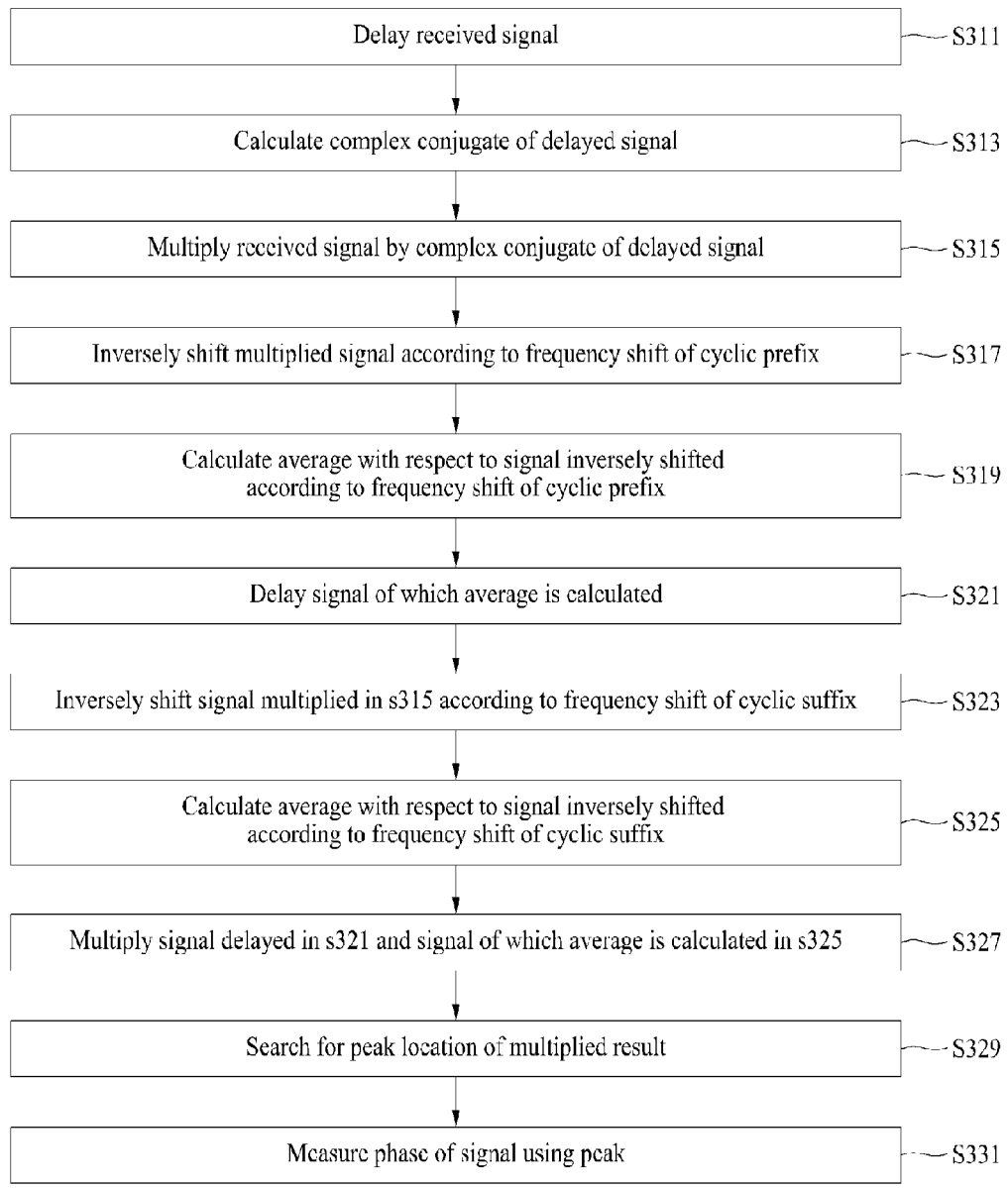
FIG. 60 is a flowchart illustrating an embodiment of identifying a first pilot signal and estimating an offset in a demodulating process.

FIG. 60 is a flowchart illustrating an embodiment of identifying a first pilot signal and estimating an offset in a demodulating process.

The first pilot signal includes the cyclic prefix obtained by frequency-shifting the first portion of the valid portion thereof and the cyclic suffix obtained by frequency-shifting the second portion of the valid portion thereof. The timing offset and the frequency offset may be calculated using the first pilot signal as follows.

The received signal is delayed (S311). For example, the delay portion may be the valid portion of the first pilot signal or ½ of the valid portion. Alternatively, the delay portion may be the length of the cyclic prefix or the length of the cyclic suffix.

The complex conjugate of the delayed signal is calculated (S313).

The complex conjugate of the received signal and the delayed signal are multiplied (S315). The delayed signal multiplied by the complex conjugate may be the signal having the above-described length. If the delay signal is the length of the cyclic prefix or the cyclic suffix, the complex conjugate of the delayed signal may be calculated.

The signal multiplied by the complex conjugate is inversely shifted according to the frequency shift of the cyclic prefix (S317). That is, the signal multiplied by the complex conjugate is shifted by the inverse shift amount of the frequency shift amount of the cyclic prefix signal. That is, a signal which is frequency shifted up is frequency shifted down (or the signal which is frequency shifted down is frequency shifted up).

Then, an average of the signal which is inversely shifted according to the frequency shift of the cyclic prefix is calculated (S319). The portion of which the average is calculated may be the length of the cyclic prefix or the length of the valid portion A of the first pilot signal depending on the embodiments. Since the average is calculated with respect to the signal having the same length along with the received signal, the moving average value may be output along with the received signal.

The signal of which the average is calculated is delayed (S321). The delay portion may be the sum of the length of the cyclic prefix and the length of ½ of the valid period, the length of the cyclic prefix, or the length of the valid portion A of the first pilot signal, according to the embodiment.

The signal multiplied in the step S315 is inversely shifted according to the frequency shift of the cyclic suffix (S323). The signal multiplied by the complex conjugate is shifted by the inverse shift amount of the frequency shift amount of the cyclic suffix signal. That is, a signal which is frequency shifted up is frequency shifted down (or the signal which is frequency shifted down is frequency shifted up).

An average is calculated with respect to the signal which is inversely shifted according to the frequency shift of the cyclic suffix (S325). The moving average is performed with respect to the signal corresponding to the length of the calculated cyclic suffix or the length of the valid portion of the first pilot signal according to the embodiments.

The signal delayed in the step S321 and the signal of which the average is calculated in the step S325 are multiplied (S327).

A peak location of the multiplied result is searched for (S329) and the phase of the signal is measured using the peak (S331). The searched peak may be used for estimating the timing offset and the measured phase may be used for estimating the frequency offset.

In this flowchart, the length of the cyclic suffix, the length of the cyclic prefix and the frequency inverse shift amount may be changed.

According to the apparatus for transmitting and receiving the signal and the method for transmitting and receiving the signal of the invention, if the data symbol configuring the PLP and the symbols configuring the preamble are modulated in the same FFT mode, the probability that the data symbol is detected by the preamble is low and the probability that the preamble is erroneously detected is reduced. If continuous wave (CW) interference is included like the analog TV signal, the probability that the preamble is erroneously detected by a noise DC component generated at the time of correlation is reduced.

According to the apparatus for transmitting and receiving the signal and the method for transmitting and receiving the signal of the invention, if the size of the FFT applied to the data symbol configuring the PLP is larger than that of the FFT applied to the preamble, the preamble detecting performance may be improved even in a delay spread channel having a length equal to or greater than that of the valid symbol portion A of the preamble. Since both the cyclic prefix (B) and the cyclic suffix (C) are used in the preamble, the fractional carrier frequency offset can be estimated.

Hereinafter, an example of a method of transmitting and receiving signals in accordance with the aforementioned bit interleaving method will be described.

Figure 61:
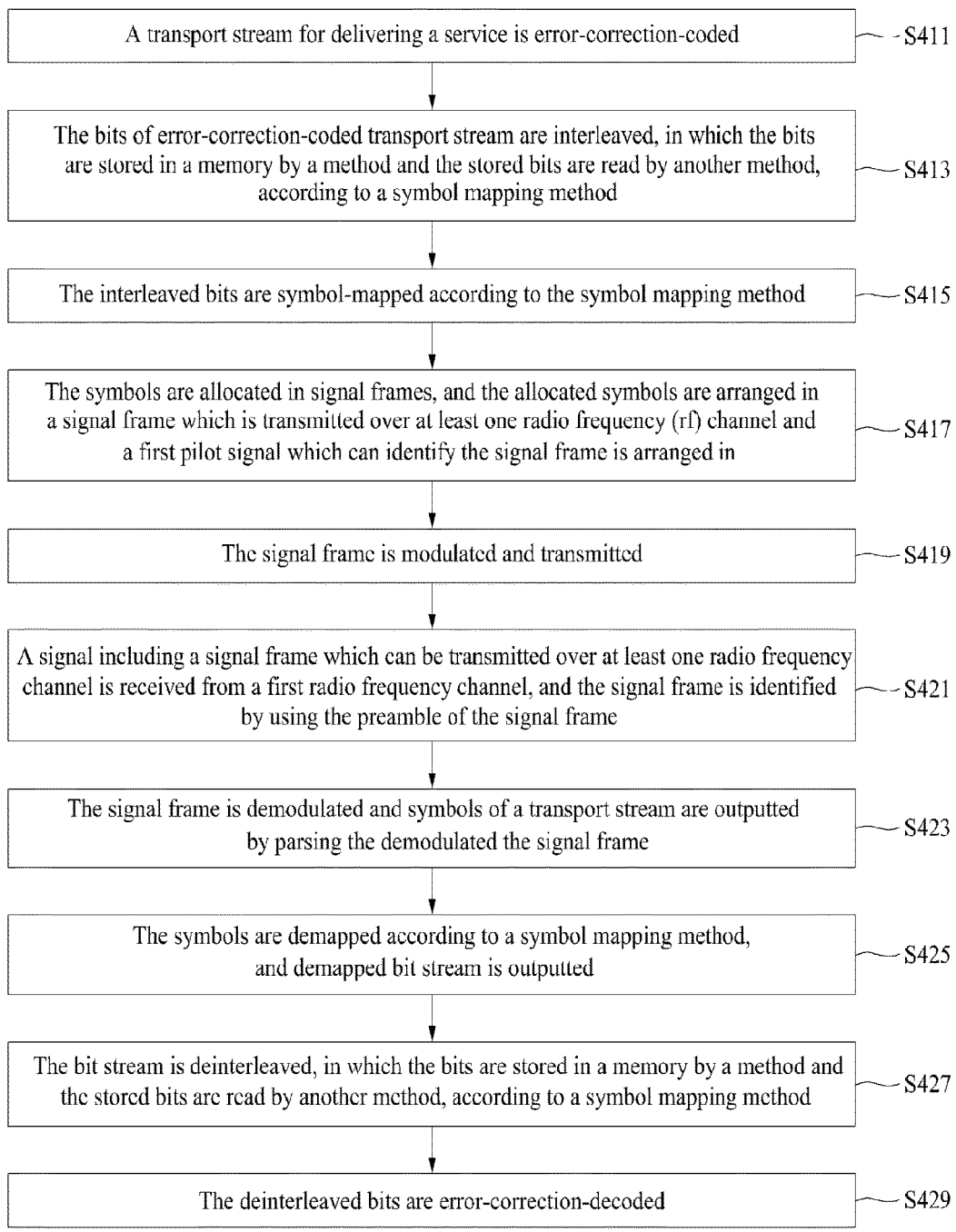
FIG. 61 illustrates another example of a method of transmitting and receiving signals in accordance with the present invention.

FIG. 61 illustrates another example of a method of transmitting and receiving signals in accordance with the present invention.

Transport streams including service are error-correction-coded (S411).

Bits of the error-correction-coded transport streams are interleaved by varying a method of storing the bits in the memory and a method of reading the bits from the memory in accordance with the symbol mapping method (S413). In this case, bit interleaving is performed in such a manner that the bits are stored in the memory in units of column, wherein the memory has a plurality of rows and columns in accordance with the symbol mapping method, offset is generated between locations of the first bits stored in each column in accordance with the symbol mapping method, and in each column, the bits are stored from the location where the first bits are stored to the location where the bits are stored in accordance with circular addressing.

If the stored bits are read, the bits stored in the memory in accordance with the symbol mapping method are read in units of row. In this case, offset should be generated in locations of the first bits read from each row in accordance with the symbol mapping method, and in each column, the bits are read from the location where the first bits are read in accordance with circular addressing.

The interleaved bits are symbol-mapped in accordance with the above symbol mapping method (S415).

The mapped symbols are allocated to signal frames transmitted to at least one RF channel, and a preamble, which includes a first pilot signal that can identify the signal frames from one another, is arranged in the signal frames (S417).

The signal frames are modulated and then transmitted (S419).

A method of receiving and processing the above signal will be described below.

A receiving signal which includes signal frames transmitted to at least one RF channel is received from the first RF channel, and the signal frames are identified from the first pilot signal of the preamble of the signal frames (S421).

The signal frames are demodulated, and the demodulated signal frames are parsed, so that symbols of the first transport stream among a plurality of time slots are output (S423).

The symbols are demapped in accordance with the symbol mapping method to output bit streams (S425).

The output bit streams are deinterleaved by varying the method of storing the bits in the memory and the method of reading the bits from the memory (S427). Bit interleaving corresponding to the step S413 is used. The bits are stored in the memory in units of column, wherein the memory has a plurality of rows and columns in accordance with the symbol mapping method. In this case, the bits should be stored in the memory so that offset is generated between locations of the first bits stored in each column in accordance with the symbol mapping method, and in each column, the bits are stored from the location where the first bits are stored to the location where the bits are stored in accordance with circular addressing.

If the stored bits are read, the bits stored in the memory in accordance with the symbol mapping method are read in units of row. In this case, offset should be generated in locations of the first bits read from each row in accordance with the symbol mapping method, and in each column, the bits are read from the location where the first bits are read, in accordance with circular addressing.

The deinterleaved bits are error-correction-decoded. (S429).

Figure 62:
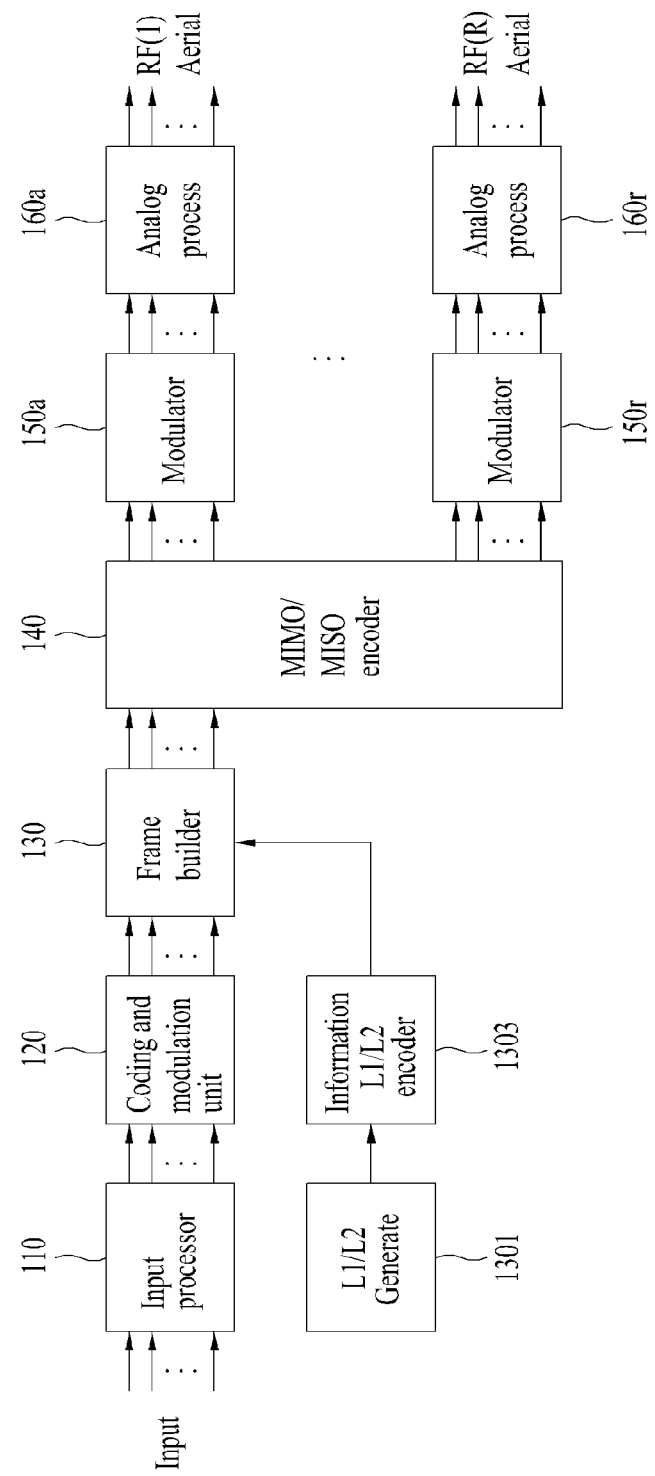
FIG. 62 is a view showing another embodiment of an apparatus for transmitting a signal.

FIG. 62 is a view showing another embodiment of an apparatus for transmitting a signal. The signal transmitting apparatus shown in FIG. 62 includes an input processor 110, encoding and modulation unit 120, a frame builder 130, a MIMO/MISO encoder 140, modulators 150a, . . . , and 150r corresponding to the multiple paths of the MIMO/MISO encoder 140, and a plurality of analog processors 160a, . . . , and 160r. This embodiment is similar to the embodiment shown in FIG. 4 except that an information (L1/L2) generator 1301 and information (L1/L2) coder 1303 for coding and interleaving layer-1 information and layer-2 information are further included. The examples of the information generator 1301 and the information coder 1303 will now be described in detail.

As described above, the layer-1 information may include information about a PLP configuration of a signal frame and may be included in a second pilot signal. The layer-2 information may describe a service transmitted by a PLP included in the signal frame and may be transmitted to the second pilot signal or a common PLP. For example, although the second pilot signal and the common PLP included in the signal frame are transmitted to a plurality of RF channels of the signal frame, the same value is transmitted to the plurality of RF channels. Accordingly, since a frequency diversity gain cannot be obtained, the signals may be processed such that information recovery capability is improved according to error correction encoding or interleaving.

If the frame builder 130 configures the signal frame, the information generator 1301 may generate the layer-1 information and the layer-2 information which will be included in the signal frame. The information generator 1301 may generate a location of the signal frame, to which a transport stream for transmitting a service will be transmitted, and modulation and coding information of the transport stream.

The information coder 1303 may code the layer-1 information and the layer-2 information generated by the information generator 1301 according to the modulation and coding information. The frame builder 130 inserts the layer-1 information coded by the information coder 1303 into the second pilot signal and inserts the layer-2 information into the second pilot signal or the common PLP. Accordingly, the layer-1 information and the layer-2 information may be protected from an error of a transmission channel by the information coder 1303.

Figure 63:
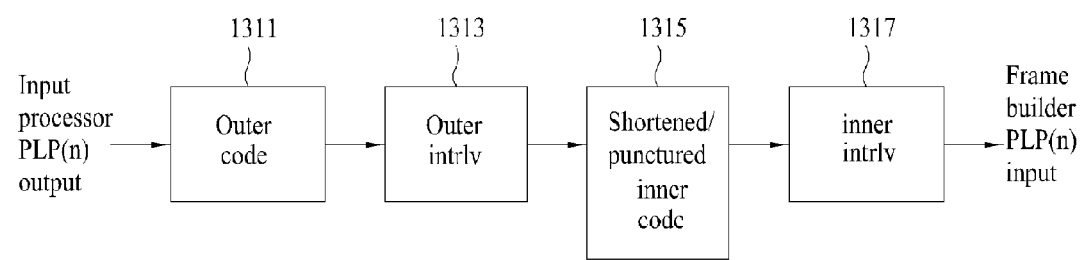
FIG. 63 is a view showing an embodiment of an information coder 1303.

FIG. 63 is a view showing an embodiment of the information coder 1303. The information coder may include a first coder 1311, a first interleaver 1313, a second coder 1315 and a second interleaver 1317.

The first coder 1311 is an outer coder, which performs first error correction encoding with respect to input data (the layer-1 information and the layer-2 information). For example, the input data may be error-correction-encoded by a BCH error correction encoding scheme. The error correction encoding of the first coder 1311 is performed in order to suppress error floor according to an error correction encoding scheme of the second coder.

The first interleaver 1313 is an outer interleaver, which may interleave the data output from the first coder 1311. The first interleaver 1313 may reduce a burst error.

The second coder 1315 is an inner coder, which performs second error correction encoding with respect to the data output from the first interleaver 1313. For example, the second coder 1315 may code the data interleaved by the first interleaver 1313 by an LDPC error correction encoding scheme.

The second coder 1315 may perform shortening and puncturing with respect to the data to be error-correction-encoded, when the input data is coded. For example, since the amount of layer-1 information and layer-2 information is less than that of transport stream data for transmitting a service, a code with a short length may be used. Accordingly, the second coder 1315 may perform shortening and puncturing from a mother code with a low code rate and output an error correction code with a short length. As the mother code, an LDPC or a convolution code may be used.

The second coder 1315 pads zero (0) to a small size of information bits (zero padding), so the second coder 1315 conforms the input bit number for LDPC encoding (shortening). After the LDPC encoding, the second coder 1315 removes the padded zero and performs puncturing on a part of the generated parity of encoding data to conform its code rate.

The second interleaver 1317 is an inner interleaver, which performs bit interleaving with respect to the data coded by the second coder 1315. The bit interleaving may be performed by one of the schemes shown in FIGS. 20 to 28.

Figure 64:
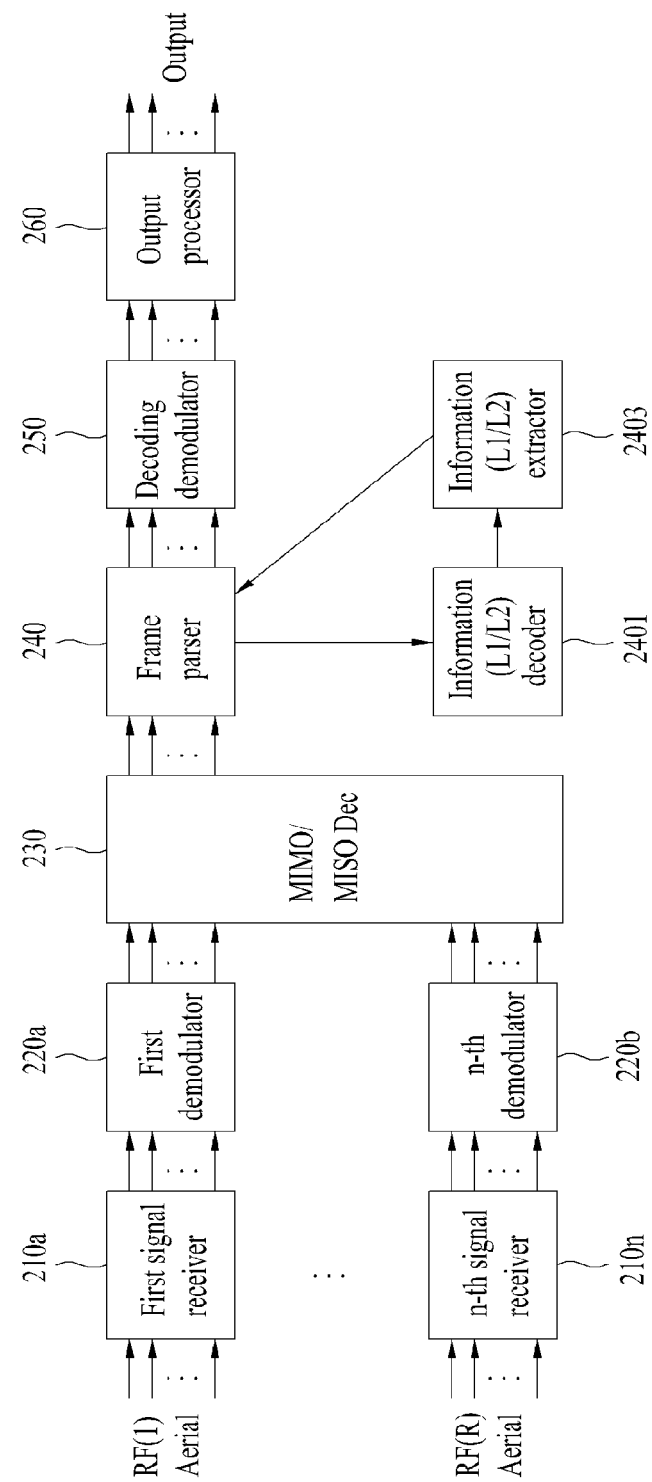
FIG. 64 is a view showing another embodiment of an apparatus for receiving a signal.

FIG. 64 is a view showing another embodiment of an apparatus for receiving a signal. This embodiment is similar to the signal receiving apparatus shown in FIG. 39. Accordingly, the embodiment of the signal receiving apparatus includes a first signal receiver 210a, an nth signal receiver 210n, a first demodulator 220a, an nth demodulator 220n, a MIMO/MISO decoder 230, a frame parser 240, a decoding demodulator 250 and an output processor 260. The embodiment of this drawing further includes an information (L1/L2) decoder 2401 and an information (L1/L2) extractor 2403.

The frame parser 240 may parse the signal frame. The frame parser 240 may parse the preamble of the signal frame including the first pilot signal and the second pilot signal. The frame parser 240 may parse the common parser.

The frame parser 240 outputs the layer-1 information and the layer-2 information included in the second pilot signal and the common PLP to the information decoder 2401. The information decoder 2401 decodes the layer-1 information and the layer-2 information. The example of the information decoder 2401 will be described in detail later. The information extractor 2403 extracts the decoded layer-1 information and the layer-2 information and outputs the layer-1 information to the frame parser 240 and a system controller (not shown). The frame parser 240 may check the configuration of the PLPs included in the signal frame using the extracted layer-1 information and output a PLP selected by a user according to the layer-1 information.

Figure 65:
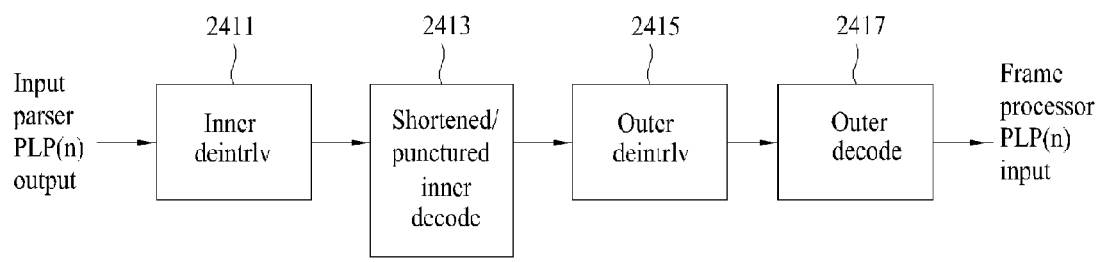
FIG. 65 is a view showing a detailed embodiment of decoding layer-1 information and layer-2 information.

FIG. 65 is a view showing a detailed embodiment of decoding layer-1 information and layer-2 information. This embodiment may include a first deinterleaver 2411, a first decoder 2413, a second deinterleaver 2415 and a second decoder 2417.

The first deinterleaver 2411 performs inner interleaving with respect to the input data including the layer-1 information and the layer-2 information. The de-interleaving scheme of the first deinterleaver 2411 may be performed by one of the bit interleaving schemes described with respect to FIGS. 20 to 28.

The first decoder 2413 performs error correction decoding with respect to the deinterleaved data according to a first error correction encoding scheme. In this case, the data including the shortened and punctured layer-1 information and layer-2 information may be decoded.

For example, the first decoder 2413 performs depuncturing with respect to the parity bits of the data output from the first deinterleaver 2411. In addition, the first decoder 2413 adds 0 to the depunctured data and performs error correction decoding. The first decoder 2413 removes the added 0 and outputs the shortened data.

The second deinterleaver 2415 performs deinterleaving with respect to the data error-correction-decoded by the first decoder 2413, and the second decoder 2417 performs error correction decoding with respect to the data output from the second de-interleaver 2415 according to a second error correction encoding scheme. The second decoder 2417 may output raw data of the layer-1 information and the layer-2 information.

Although, in the above-described embodiment, the layer-1 information and the layer-2 information are error-correction encoded/decoded using the shortening scheme and the puncturing scheme, at least one of the layer-1 information and the layer-2 information may be error-correction-encoded/decoded. For example, the shortening scheme and the puncturing scheme may be used with respect to only the layer-1 information. In this case, the embodiments of FIGS. 63 and 65 may be employed with respect to only the layer-1 information. The embodiments of FIGS. 6 and 49 may be employed with respect to only the layer-1 information, and vice versa.

Figure 66:
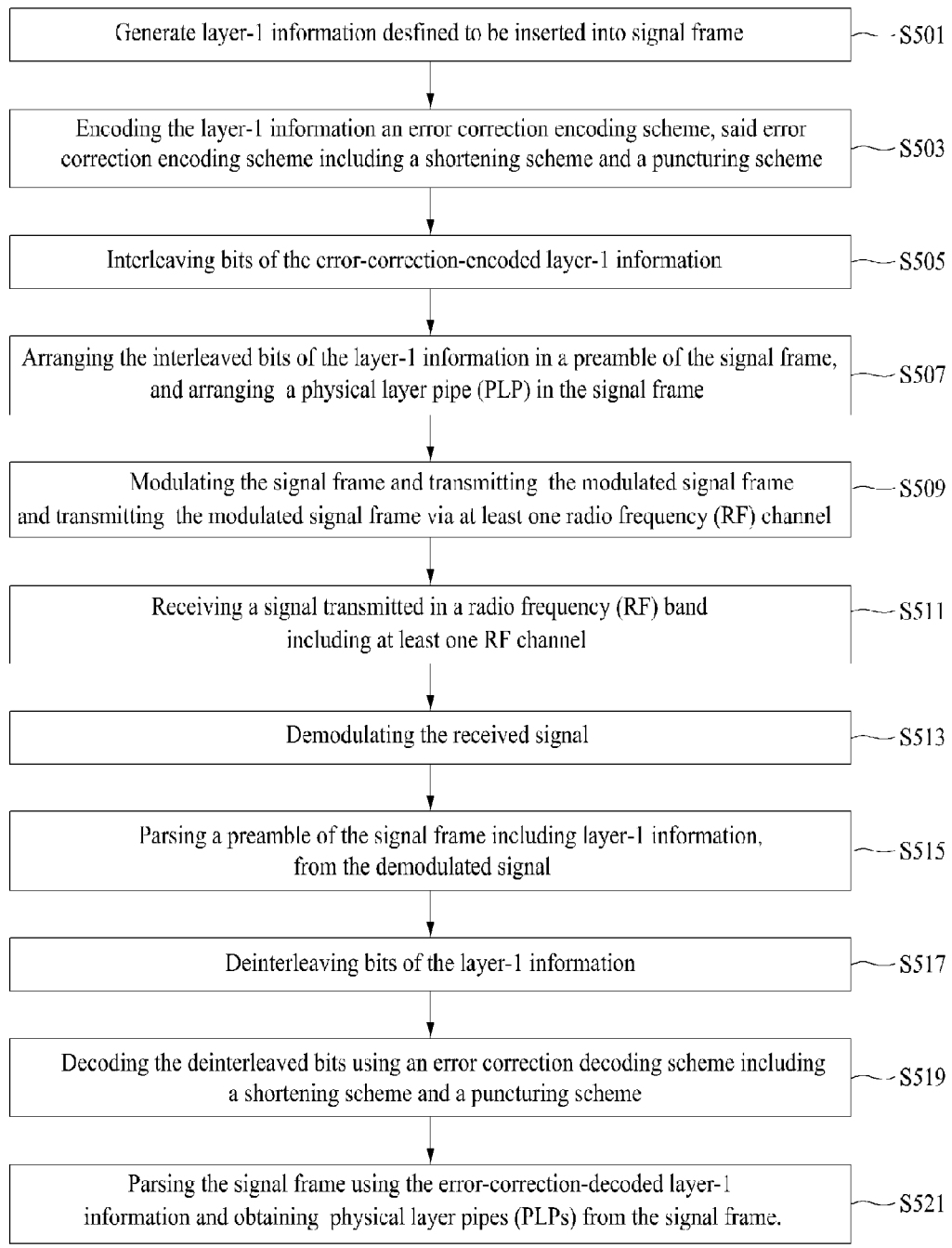
FIG. 66 is a flowchart illustrating a method for transmitting and receiving a signal.

FIG. 66 is a flowchart illustrating a method for transmitting and receiving a signal. Hereinafter, the embodiment of processing the layer-1 information will be described. However, the layer-2 information may be transmitted in a state of being arranged in the common PLP similar to this embodiment. Hereinafter, an embodiment of decoding and encoding the layer-1 information will be described in detail.

The layer-1 information which will be inserted into a signal frame is generated (S501). The layer-1 information may include information about the PLP configuration of the signal frame and information for identifying the signal frame. The information about the PLP configuration may include information about PLPs included in a super frame included in a plurality of signal frames and information about the signal frames of the super frame. The PLP may be a unit in which the transport streams are individually encoded and modulated in order to transmit the transport streams. The PLP may be allocated to at least one RF channel of the signal frame or a plurality of signal frames.

The layer-1 information is encoded using an error-correction-encoding scheme including the shortening scheme and the puncturing scheme (S503). Since the size of the layer-1 information which will be inserted into the signal frame is small, the layer-1 information may be encoded using an error-correction-encoding scheme according to a short mode of an error-correction-encoding scheme such as LDPC coding scheme.

The bits of the error-correction-encoded layer-1 information are interleaved (S505).

As the error correction encoding, the first error correction encoding process or the second error correction encoding process may be performed. Then, first interleaving is performed after the first error correction encoding and second interleaving is performed after the second error correction encoding. As the second error correction encoding, an LDPC error correction encoding scheme may be used.

For example, the second error correction encoding step is performed by adding 0 to the input data in order to check a number of the input data (shortening). After the second error-correction-encoding, a part of the generated parity bits is punctured and code rate of the second error-correction-encoding scheme is adjusted (puncturing).

The interleaved bits of the layer-1 information are arranged in a preamble of the signal frame and PLPs are arranged in the signal frame (S507). The signal frame may include the PLPs which will be transmitted via at least one RF channel.

The signal frame is modulated and transmitted via at least one RF channel (S509).

If the signal is received, the signal frame transmitted in an RF band including at least one RF channel is received from a first RF channel (S511).

The signal frame of the received signal is demodulated (S513).

The preamble of the signal frame including the layer-1 information is parsed, and the layer-1 information is output (S515).

The bits of the layer-1 information are deinterleaved (S517).

The deinterleaved bits are decoded using an error-correction-decoding scheme including the shortening scheme and the puncturing scheme (S519). In this step, for example, the deinterleaved bits are depunctured and 0 is added according to the error correction encoding scheme. The data to which 0 is added is error-correction-decoded and the added 0 is removed.

The signal frame is parsed using the error-correction-decoded layer-1 information and the PLPs are obtained from the signal frame (S521).

By this process, since the error correction encoding is performed with respect to the preamble of the signal frame by which a diversity gain cannot be obtained, it is possible to correct an error of the information included in the preamble. Accordingly, it is possible to improve reception performance of the information included in the accurate preamble.

It will be apparent to those skilled in the art that various modifications and variations can be made in the present invention without departing from scope of the invention. Thus, it is intended that the present invention covers the modifications and variations of this invention provided they come within the scope of the appended claims and their equivalents.

Mode for the Invention

The embodiments of the invention are described in the best mode of the invention.

INDUSTRIAL APPLICABILITY

A method of transmitting/receiving a signal and an apparatus for transmitting/receiving a signal of the present invention can be used in broadcast and communication fields.

What is claimed:

1. A method of transmitting broadcast signals by an apparatus for transmitting a signal, the method comprising:
   encoding signaling data for Physical Layer Pipe (PLP) data by using a shortened and punctured Low Density Parity Check (LDPC) scheme;
   interleaving the encoded signaling data;
   encoding the PLP data;
   mapping the encoded PLP data onto constellations;
   time interleaving the mapped PLP data;
   building a signal frame comprising PLP symbols that include the time interleaved PLP data; and
   transmitting the broadcast signals including the signal frame,
   wherein the signal frame is further comprising a preamble that is located at a beginning of the signal frame and includes the interleaved signaling data, and
   wherein the signaling data include modulation and coding information for the PLP data.

2. The method of claim 1, wherein the signaling data further include information indicating Multi-Input Multi-Output (MIMO) scheme.

3. The method of claim 1, wherein the preamble further includes a first pilot signal that includes a main part, a prefix of the main part and a suffix of the main part.

4. The method of claim 1, wherein the mapped PLP data are interleaved with a twisted interleaving scheme.

5. An apparatus for transmitting broadcast signals, the apparatus comprising:
   a signal encoder to encode signaling data for Physical Layer Pipe (PLP) data by using a shortened and punctured Low Density Parity Check (LDPC) scheme;
   an interleaver to interleave the encoded signaling data;
   an encoder to encode the PLP data;
   a mapper to map the encoded PLP data onto constellations;
   a time interleaver to time interleave the mapped PLP data;
   a frame builder to build a signal frame comprising PLP symbols that include the time interleaved PLP data; and
   a transmitter to transmit the broadcast signals including the signal frame,
   wherein the signal frame is further comprising a preamble that is located at a beginning of the signal frame and includes the interleaved signaling data, and
   wherein the signaling data include modulation and coding information for the PLP data.

6. The apparatus of claim 5, wherein the signaling data further include information indicating Multi-Input Multi-Output (MIMO) scheme.

7. The apparatus of claim 5, wherein the preamble further includes a first pilot signal that includes a main part, a prefix of the main part and a suffix of the main part.

8. The apparatus of claim 5, wherein the mapped PLP data are interleaved with a twisted interleaving scheme.

9. A method of processing broadcast signals by a signal receiving apparatus, the method comprising:
   receiving the broadcast signals including at least one signal frame;
   parsing the signal frame from the received broadcast signals, the signal frame comprising Physical Layer Pipe (PLP) symbols that include PLP data and a preamble that is located at a beginning of the signal frame and includes signaling data for the PLP data, wherein the signaling data include modulation and coding information for PLP data;
   de-interleaving the signaling data;
   decoding the de-interleaved signaling data by using a shortened and punctured Low Density Parity Check (LDPC) scheme;
   time de-interleaving the PLP data;
   de-mapping the time de-interleaved PLP data; and
   decoding the de-mapped PLP data.

10. The method of claim 9, wherein the signaling data further include information indicating Multi-Input Multi-Output (MIMO) scheme.

11. The method of claim 9, wherein the preamble further includes a first pilot signal that includes a main part, a prefix of the main part and a suffix of the main part.

12. The method of claim 9, wherein the PLP data are de-interleaved with a twisted de-interleaving scheme.

13. An apparatus for processing broadcast signals, the apparatus comprising:
   a tuner to receive the broadcast signals including at least one signal frame;
   a frame parser to parse the signal frame from the received broadcast signals, the signal frame comprising Physical Layer Pipe (PLP) symbols that include PLP data and a preamble that is located at a beginning of the signal frame and includes signaling data for PLP data, wherein the signaling data include modulation and coding information for PLP data;
   a de-interleaver to de-interleave the signaling data;

a signaling decoder to decode the de-interleaved signaling data by using a shortened and punctured Low Density Parity Check (LDPC) scheme;

a time de-interleaver to time de-interleave the PLP data;

a de-mapper to de-map the time de-interleaved PLP data; and a decoder to decode the de-mapped PLP data.

14. The apparatus of claim 13, wherein the signaling data further include information indicating Multi-Input Multi-Output (MIMO) scheme.

15. The apparatus of claim 13, wherein the preamble further includes a first pilot signal that includes a main part, a prefix of the main part and a suffix of the main part.

16. The apparatus of claim 13, wherein the PLP data are de-interleaved with a twisted de-interleaving scheme.

* * * * *